(12) United States Patent  Ide et al.

(10) Patent No.: US 6,292,058 B1
(45) Date of Patent: Sep. 18, 2001

(54) SIGNAL AMPLIFYING CIRCUIT CONNECTED TO A TRANSFER CIRCUIT HAVING A KNOWN NON-LINEAR TRANSFER CHARACTERISTIC

(75) Inventors: Satoshi Ide; Kohei Shibata, both of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/360,461

(22) Filed: Jul. 23, 1999

(30) Foreign Application Priority Data

Dec. 2, 1998 (JP) .................................. 10-342762
Feb. 17, 1999 (JP) .................................. 11-039271

(51) Int. Cl.$^7$ .................................................. H03G 3/20
(52) U.S. Cl. ........................................... 330/279; 330/136
(58) Field of Search .............................. 330/69, 129, 133, 330/134, 136, 254, 278, 279

(56) References Cited

U.S. PATENT DOCUMENTS 5,091,920 * 2/1992 Ikeda et al. ..................... 328/149 X
5,955,921 * 9/1999 Ide et al. ........................ 330/279 X

FOREIGN PATENT DOCUMENTS 56-115023   9/1981  (JP) .
57-192155  11/1982  (JP) .
58-114637   7/1983  (JP) .
6-310967   11/1994  (JP) .
7-264142   10/1995  (JP) .
8-18429    1/1996  (JP) .
2-651031    5/1997  (JP) .
10-32362    2/1998  (JP) .
10-261940   9/1998  (JP) .

* cited by examiner

Primary Examiner—Steven J. Mottola
(74) Attorney, Agent, or Firm—Helfgott & Karas, P.C.

(57) ABSTRACT

In a signal amplifying circuit connected to a transfer circuit having a known non-linear transfer characteristic and a transient characteristic, a threshold generation circuit generates a threshold signal based on an input signal, a threshold control circuit controls the threshold signal so as to correct the non-linear transfer characteristic of the transfer circuit provided at a former stage based on the input signal. Also, basic amplifying circuit blocks can be connected in a multistage form, each of which is composed of a threshold generation circuit and a differential amplifying circuit, and control the threshold signal of a latter stage block so as to correct the non-linear transfer characteristic of a basic amplifying circuit block at a former stage based on the input signal. In addition, basic amplifying circuit blocks can be connected in a multistage form, each of which includes a peak master-slave threshold generation circuit or a bottom master-slave threshold generation circuit, and control the threshold signal of the differential amplifying circuit of each circuit block.

20 Claims, 50 Drawing Sheets

SIGNAL AMPLIFYING CIRCUIT CONNECTED TO A TRANSFER CIRCUIT HAVING A KNOWN NON-LINEAR TRANSFER CHARACTERISTIC

BACKGROUND OF THE INVENTION

1. Field of the Invention

The present invention relates to a signal amplifying circuit, and in particular to a signal amplifying circuit connected to a transfer circuit having a non-linear transfer characteristic and a transient characteristic.

Generally, signal transfer circuits or transmission lines may have a non-linear transfer characteristic. This non-linear transfer characteristic is positively used in an optical receiving circuit of an optical subscriber system, and is indispensable for extending the dynamic range of an amplifying circuit. In addition, a preamplifier for converting an optical signal into an electric signal has a "0" level rise peculiar to an optical signal transmission and a tailed response characteristic as a transient phenomenon. The signal amplifying circuit connected to the preamplifier is required to deal with such a response characteristic.

2. Description of the Related Art

FIG. 42 shows an example of a prior art signal amplifying circuit (1) having a preamplifier 20 with a non-linear transfer characteristic at the former stage. In the preamplifier 20, after having been converted into an input current signal I by a photo diode 10, a burst optical input signal 100 of an optical subscriber system is inputted to an amplifier 21 having a feedback resistor 22 and a diode 23 with a non-linear characteristic.

If the direction of an arrow indicating the current signal I in FIG. 42 is assumed to be positive, a signal 101 which is the output signal of the amplifier 21 has a negative logic. Also, the optical input signal 100 from subscribers comprises burst signals whose amplitudes are largely different from each other. The preamplifier 20 and a signal amplifying circuit 30 are required to instantaneously respond at the leads of the burst signals (in a wide range).

The signal amplifying circuit 30 is composed of a threshold generation circuit 33 for receiving the input signal 101 from the preamplifier 20 and outputting a threshold signal 106, and a limiter amplifier 31 which is a differential input/output amplifying circuit for inputting the input signal 101 and the threshold signal 106 and outputting output signals 102 and 103.

The threshold generation circuit 33 is composed of a peak detection circuit 34 and a bottom detection circuit 35 for commonly inputting the input signal 101, and a voltage divider 36 for inputting a peak detection signal 104 and a bottom detection signal 105 which are the outputs of the detection circuits 34 and 35 and outputting the threshold signal 106 having a partial voltage between a peak level and a bottom level.

FIGS. 43A and 43B show the amplifying characteristics of the preamplifier 20 and the signal amplifying circuit 30. The circuit operation of FIG. 42 will now be described referring to FIGS. 43A and 43B.

FIG. 43A shows the transfer characteristic A of the preamplifier 20, that is the relationship between the input current signal I and the output amplitude (=the amplitude of the input signal 101), and shows a threshold level L1 set by the threshold generation circuit 33 of the signal amplifying circuit 30, that is the relationship between the input current I and the threshold signal 106.

The transfer characteristic A reveals a linear characteristic determined by a feedback resistor 22 in the range from the input current 0 to I1, and reveals a compressed curved line with a non-linear characteristic of the diode 23 further added in the range over the input current I1.

This is because the preamplifier 20 prevents the output signal resistance including the resistance of the diode 23 to enhance the negative-feedback effect in order to extend the dynamic range of the optical input signal 100 when the preamplifier 20 receives the optical input signal 100 having an excessive amplitude.

The threshold level L1 indicates the level of the threshold signal 106 which corresponds to a partial voltage between the peak detection signal 104 and the bottom detection signal 105 which are respectively detected by the peak detection circuit 34 and the bottom detection circuit 35 with respect to the input signal 101 from the preamplifier 20, the partial voltage being provided by resistors 41 and 42 having the same resistance as an example. Accordingly, the threshold level L1 is a half level of the amplitude of the input signal 101 shown by the transfer characteristic A.

FIG. 43B shows a pulse width B of the input signal 101 outputted by the preamplifier 20 and a pulse width C of the output signals 102 and 103 outputted by the signal amplifying circuit 30 with respectively being made correspond to the amplitude of the input signal 101, assuming that the pulse width of the optical input signal 100 has 100% (a single time slot).

It is to be noted that the amplitude of the input signal 101 indicates the difference between the peak level and the bottom level of the signal 101, and the pulse width of the input signal 101 indicates a signal width at an intermediate level between the peak level and the bottom level of each signal according to the above-mentioned example.

The pulse width B is the same as that of the optical signal 100 when the amplitude of the input signal 101 is small, while the pulse width B greatly varies from a vicinity of a control initiation level V1 of the amplitude due to the non-linear transfer characteristic of the preamplifier 20. Since the signal amplifying circuit 30 which inputs a signal having the pulse width B performs a linear operation, it generates the output signals 102 and 103 which have the pulse width C substantially the same as the pulse width B.

FIGS. 44A and 44B show an example of an operation waveform in the operation of the signal amplifying circuit 30. FIG. 44A shows an example in which the amplitude of the optical input signal 100 is small, so that the preamplifier 20 linearly amplifies the optical input signal 100. Accordingly, the pulse width of the input signal 101 is the same as that of the optical input signal 100.

The signal amplifying circuit 30 outputs the output signals 102 and 103 based on the threshold signal 106 which has an intermediate level between the peak detection signal 104 and the bottom detection signal 105 of the input signal 101. Accordingly, the pulse width of the output signals 102 and 103 is substantially the same as that of the optical input signal 100.

FIG. 44B shows an example in which the amplitude of the optical input signal 100 is large, so that the preamplifier 20 compresses and amplifies the side of logic "1" of the optical input signal 100 to output the signal 101 deteriorated in the direction of widening the pulse width as shown by a dotted line. Accordingly, the pulse width of the output signals 102 and 103 the signal amplifying circuit 30 outputs based on the threshold signal 106 which has an intermediate level between the peak detection signal 104 and the bottom detection signal 105 is larger than the pulse width of the optical input signal 100.

Also, there is a problem on the level of the threshold signal 106 generated by the threshold generation circuit 33 that the pulse width is further deteriorated. Therefore, a necessary eye pattern (aperture) can not be obtained especially when the input signal is small because the level of the threshold signal 106 deviates from the central position of the signal due to the offset or the like.

In order to solve this problem, measures such as correcting the pulse width by using an average value of the input signal have been taken when the input signal is a continuous transmission signal. However, since an average value circuit such as an LPF is slow to respond, it is impossible to apply the LPF for the transmission of the burst signal which requires an instantaneous response at the lead of the input signal.

In such a prior art signal amplifying circuit, there has been a problem that the pulse width varies and deteriorates due to the non-linear transfer characteristic of a transfer circuit at the former stage.

Also, in an optical burst transmission, for instance, there are two major problems due to a transient response generated at the lead of the cell.

One of them is a tailed waveform due to a low frequency response of a photo diode (a photo device), and the other is a "0" level rise due to an optical extinction ratio deterioration in the signal.

The tailed waveform will now be described. FIG. 45 shows a frequency response characteristic efficiency of a photo diode. The ordinate and the abscissa respectively indicate efficiencies and frequencies. The frequency response characteristic has a shoulder portion in the range of several kHz to several hundred kHz, so that the tailed waveform is generated in the presence of the shoulder portion.

FIGS. 46A and 46B show an example of operation waveform when burst cell signals whose optical powers are mutually different sequentially arrive at the photo diode 10 shown in FIG. 42. The photo diode 10 has the frequency response characteristic of FIG. 45.

FIG. 46A shows the optical input signal 100 (see FIG. 42), in which a packet P2 of small optical power arrives after a packet P1 of large optical power. The current signal I (see FIG. 42) of the photo diode 10 at that time is shown in FIG. 46B. The "0" level of the packet P1 rises due to the low frequency response, which remains up to the lead of the following packet P2, resulting in a tailed waveform (see the dotted circle).

FIG. 47 shows an example of a prior art signal amplifying circuit (2). This signal amplifying circuit 30 is different from that shown in FIG. 42 in that basic amplifying circuit blocks 30_1 and 30_2 which have the same arrangement as the signal amplifying circuit 30 shown in FIG. 42 are connected in a multistage form. This is because the multistaged signal amplifying circuit enables a level variation at the first stage to be corrected at the second and the following stages.

The packet P2 of FIG. 46B amplified at the amplifier 21 and a buffer 24 corresponds to an input signal 101_1. An example of an operation waveform (1) when the input signal 101_1 is inputted to the signal amplifying circuit 30 is shown in FIGS. 48A, 48B, and 48C. FIG. 48A shows an operation waveform as to a threshold generation circuit 33_1 which inputs the input signal 101_1 with a tailed waveform.

After having detected the peak level of the input signal 101_1, a peak detection circuit 34_1 provides a peak detection signal 104_1 holding the level since the input signal 101_1 does not exceed the peak level. On the other hand, since the input signal 101_1 has a tailed waveform, a bottom detection circuit 35_1 provides a bottom detection signal 105_1 which sequentially detects the bottom level of the input signal 101_1. A threshold signal 106_1 is at an intermediate level between the peak detection signal 104_1 and the bottom detection signal 105_1.

A limiter amplifier 31_1 performs a differential amplification between the input signal 101_1 and the threshold signal 106_1 to output an input signal 101_2 of the basic amplifying circuit block 30_2 at the next stage. Since the input signal 101_1 is small, the differential amplification is performed in a linear form, so that the input signal 101_2 which is the output signal of the circuit 30 has a tailed waveform without saturations.

FIG. 48B shows an operation waveform in a threshold generation circuit 33_2 which inputs the input signal 101_2. A peak detection signal 104_2, a bottom detection signal 105_2, and a threshold signal 106_2 respectively show the peak and the bottom levels of the input signal 101_2 and the intermediate level between the peak and the bottom level in the same way as the threshold generation circuit 33_1.

A limiter amplifier 31_2 performs a differential amplification between the input signal 101_2 and the threshold signal 106_2 to provide the output (positive) signal 102 and the output (negative) signal 103, while the limiter amplifier 31_2 operates as a limiter since the amplitude of the input signal 101_2 is large.

FIG. 48C shows a waveform of the output signal 102 and the output signal 103. As shown in FIGS. 48A and 48B, since the threshold signals 106_1 and 106_2 are respectively set to a higher level than the intermediate level of the amplitude of the input signals 101_1 and 101_2, the pulse width of the output signal 102 and the output signal 103 becomes small. This phenomenon becomes more remarkable as the tailed waveform of the input signal 101_1 becomes large. When the threshold signal level 106_1 (106_2) exceeds the input signal 101_1 (106_2), the output signals 102 and 103 will not vary.

A laser diode (LD) can improve an output waveform (the optical input signal 100 of FIG. 47) by flowing therethrough a bias current, which leads to another problem, i.e. the optical extinction ratio deterioration.

This problem will be described as follows:

In FIG. 47, the photo diode 10 converts the optical input signal 100 whose optical extinction ratio is e.g. 10 dB into the current signal I, which is inputted to the amplifier 21 of the preamplifier 20. An input current I vs output voltage (=input signal 101_1) characteristic of the preamplifier 20 is shown in FIG. 49.

Having a non-linear function by the diode 23, the amplifier 21 in the preamplifier 20 outputs a "0" level bias due to the optical extinction ratio deterioration in the input current as a "0" level having a larger bias voltage.

FIGS. 50A, 50B, and 50C show an example of an operation waveform (2) in the case where the signal amplifying circuit 30 in FIG. 47 receives a signal having such a bias voltage as the input signal 101_1. FIG. 50A shows an example of an operation waveform of the threshold generation circuit 33_1. The peak detection signal 104_1 sequentially becomes large following the input signal 101_1, and maintains the level after the peak level of the input signal 101_1 is stabled.

On the other hand, the bottom detection signal 105_1 keeps the bottom level initially detected since the input signal 101_1 does not become smaller than the bottom level in a transition period. The threshold signal 106_1 is set to the intermediate level between the peak detection signal 104_1 and the bottom detection signal 105_1.

In this example, the threshold signal 106_1 is set below the input signal 101_1. Accordingly, the limiter amplifier 31_1 outputs the signal i.e. the input signal 101_2 fixed to the "1" level without reproducing the waveform of the input signal 101_1.

The operation waveform of the threshold generation circuit 33_2 which receives the input signal 101_2 is shown in FIG. 50B. The peak detection signal 104_2 assumes a state of keeping the "1" level voltage in the stationary state following the input signal 101_2, while the bottom detection signal 105_2 keeps the "0" level voltage of the initial input signal 101_2. The threshold signal 106_2 is set to the intermediate level between the peak detection signal 104_2 and the bottom detection signal 105_2, that is a level below the input signal 101_2.

Accordingly, the output signals 102 and 103 of the limiter amplifier 31_2 are respectively fixed to the "1" level, and can not reproduce the input signal 101_1. This is also recognized from the fact that the input signal 101_1 is not already reproduced in the limiter amplifier 31_1 at the former stage.

As means for solving the above-mentioned tailed waveform, a signal amplifying circuit using a master-slave type threshold generation circuit has been proposed by the inventors of the present invention in the Japanese Patent Laid-open No.10-261940. Namely, the bottom detection circuit detects the bottom level of the input signal, and the peak detection circuit detects a relative peak level to the bottom level of the input signal. As a result, the peak detection circuit can set an adequate threshold signal without keeping the peak level in the transition period.

However, for the input signal having both the tailed waveform and the "0" level rise, the peak detection circuit is required to detect a lower level than a transient highest value. At the same time, the bottom detection circuit is required to detect a higher level than a transient lowest value. However, as the polarities of transient responses are different, it has been difficult to solve both of the problems simultaneously.

SUMMARY OF THE INVENTION

It is accordingly an object of the present invention to provide a signal amplifying circuit which reproduces an input signal without deteriorations.

In order to achieve the above-mentioned object, a signal amplifying circuit connected to a transfer circuit having a known non-linear transfer characteristic, according to claim 1, of the present invention comprises a threshold generation circuit for detecting an amplitude of an input signal and generating a partial voltage of the amplitude as a threshold signal, a threshold control circuit for controlling the threshold signal so as to correct the non-linear transfer characteristic based on the amplitude, and a differential amplifying circuit for inputting the input signal and the threshold signal (see FIG. 2).

FIGS. 1A and 1B illustrate a principle of a signal amplifying circuit according to the present invention. FIG. 1A shows amplification characteristics of a preamplifier and the signal amplifying circuit, in which a non-linear transfer characteristic A of the preamplifier and a threshold level L1 of the signal amplifying circuit are the same as those shown in FIG. 43A.

FIG. 1B shows a pulse width B of an input signal and a pulse width C of an output signal, assuming that a pulse width of an optical input signal has 100% (a single time slot) in the same way as FIG. 43B. The pulse width B of the input signal is the same as that in FIG. 43B.

The threshold generation circuit of the signal amplifying circuit detects the amplitude of the input signal and generates a partial voltage of the amplitude as the threshold value L1. When the amplitude is larger than a control initiation level V1 i.e. when an input current I is larger than I1, the threshold control circuit shifts the threshold level L1 to a threshold level L2 as shown by an arrow in FIG. 1A so as to correct a distortion of the pulse width due to the non-linear transfer characteristic of the preamplifier.

The differential amplifying circuit provides the output signal which is the input signal amplified with a reference level of the threshold level L2. As a result, the pulse width of the output signal in the signal amplifying circuit assumes the pulse width C of the output of the signal amplifying circuit as shown in FIG. 1B, so that the distortion of the pulse width B due to the preamplifier having the non-linear transfer characteristic is now corrected.

It is to be noted that while in FIGS. 1A and 1B the non-linear transfer characteristic is shown where the output signal amplitude in a transmission circuit at the former stage is saturated as the input signal increases, the signal amplifying circuit of the present invention can deal with any characteristic only if the non-linear transfer characteristic is already known.

Also, a signal amplifying circuit of the present invention according to claim 2 may comprise a threshold generation circuit for detecting an amplitude of an input signal and generating a partial voltage of the amplitude as a threshold signal, an amplitude detection circuit for detecting the amplitude and outputting an amplitude detection signal, a threshold control circuit for controlling the threshold signal so as to correct the non-linear transfer characteristic based on the amplitude detection signal, and a differential amplifying circuit for inputting the input signal and the threshold signal (see FIG. 15).

Namely, an amplitude detection circuit is further added to the signal amplifying circuit of claim 1. This amplitude detection circuit detects the amplitude of the input signal to output an amplitude detection signal. The threshold control circuit controls the threshold signal based on the amplitude detection signal.

Also, in the present invention according to claim 3, the threshold generation circuit may include a peak detection circuit for detecting a peak level of the amplitude, a bottom detection circuit for detecting a bottom level of the amplitude, and a voltage divider for outputting the threshold signal having a partial voltage between the peak level and the bottom level (see FIG. 2).

Namely, the peak detection circuit and the bottom detection circuit respectively detect the peak level and bottom level of the input signal, so that the voltage divider outputs the threshold signal having a partial voltage between the peak level and bottom level. The threshold control circuit shifts the threshold signal level so as to correct the distortion of the pulse width due to the non-linear transfer characteristic.

Also, in the present invention according to claim 4, the threshold generation circuit may include a peak detection circuit for detecting a peak level of the amplitude, a bottom detection circuit for detecting a relative bottom level of the input signal to the peak level, and a voltage divider for outputting the threshold signal having a partial voltage between the peak level and the bottom level (see FIGS. 5 and 6).

Namely, the peak detection circuit detects the peak level of the input signal and the bottom detection circuit detects the bottom level of the input signal with the peak level being made a relative reference level. The voltage divider outputs a threshold signal having a partial voltage between the peak level and bottom level. The threshold control circuit shifts the threshold signal level so as to correct distortions of the pulse width due to the non-linear transfer characteristic.

Also, in the present invention according to claim 5, the threshold generation circuit may include a bottom detection circuit for detecting a bottom level of the amplitude, a peak detection circuit for detecting a relative peak level of the input signal to the bottom level, and a voltage divider for outputting the threshold signal having a partial voltage between the bottom level and the peak level (see FIG. 8).

Namely, in contrast with the invention of claim 4, the bottom detection circuit detects the bottom level of the input signal and the peak detection circuit detects the relative peak level of the input signal with the bottom level being made a reference level. The voltage divider outputs a threshold signal having a partial voltage between the peak level and bottom level.

Also, in the present invention according to claim 6, the threshold generation circuit may include a reference level generation circuit for outputting a predetermined peak level of the amplitude as a reference level, a bottom detection circuit for detecting a bottom level of the amplitude, and a voltage divider for outputting the threshold signal having a partial voltage between the reference level and the bottom level (see FIG. 10).

Namely, a reference level generation circuit outputs a level substantially the same as the predetermined peak level of the input signal as the reference level. The bottom detection circuit detects the bottom level of the input signal, so that the voltage divider outputs the threshold signal having a partial voltage between the reference level and the bottom level. The threshold control circuit shifts the threshold signal level so as to correct the distortion of the pulse width due to the non-linear transfer characteristic.

Also, in the present invention according to claim 7, the threshold generation circuit may include a reference level generation circuit for outputting a predetermined bottom level of the amplitude as a reference level, a peak detection circuit for detecting a peak level of the amplitude, and a voltage divider for outputting the threshold signal having a partial voltage between the reference level and the peak level (see FIG. 11).

Namely, in contrast with the invention of claim 6, the reference level generation circuit outputs a level substantially the same as a predetermined bottom level of the input signal as the reference level. The peak detection circuit detects the peak level of the input signal, so that the voltage divider outputs the threshold signal having a partial voltage between the reference level and the peak level.

Also, in the present invention according to claim 8, basic amplifying circuit blocks may be connected in a multistage form, each of which is composed of a threshold generation circuit for detecting an amplitude of an input signal and generating a partial voltage of the amplitude as a threshold signal and a differential amplifying circuit for inputting the input signal and the threshold signal, and a threshold control circuit may be provided between two different basic amplifying circuit blocks which controls the threshold signal of the basic amplifying circuit block at the latter stage so as to correct the non-linear transfer characteristic based on the amplitude of the input signal of a basic amplifying circuit block at the former stage (see FIG. 19).

Namely, the basic amplifying circuit blocks composed of the threshold generation circuit and the differential amplifying circuit are connected in a multistage form. In each of the basic amplifying circuit block, the threshold generation circuit detects the amplitude of the input signal, and outputs the partial voltage as the threshold signal, so that the differential amplifying circuit performs a differential amplifying to the input signal and the threshold signal.

Furthermore, the threshold control circuit detects the amplitude of the input signal in the basic amplifying circuit block at the former stage, and controls, based on the amplitude, the threshold signal of the basic amplifying circuit block at the latter stage so as to correct the non-linear transfer characteristic.

Also, in the present invention according to claim 9, basic amplifying circuit blocks may be connected in a multistage form, each of which is composed of a threshold generation circuit for detecting an amplitude of an input signal and generating a partial voltage of the amplitude as a threshold signal and a differential amplifying circuit for inputting the input signal and the threshold signal, and an amplitude detection circuit for detecting an amplitude of the input signal of the basic amplifying circuit block at a former stage and a threshold control circuit, may be provided between two different basic amplifying circuit blocks, which controls the threshold signal of the basic amplifying circuit block at a latter stage so as to correct the non-linear transfer characteristic based on the amplitude.

Namely, in addition to the components of the signal amplifying circuit of claim 8, the amplitude detection circuit is provided to detect the amplitude of the basic amplifying circuit block at a former stage inputted to the threshold control circuit.

Also, in the present invention according to claim 10, basic amplifying circuit blocks may be connected in a multistage form, each of which is composed of a threshold generation circuit for detecting an amplitude of an input signal and generating a partial voltage of the amplitude as a threshold signal and a differential amplifying circuit for inputting the input signal and the threshold signal, and a plurality of threshold control circuits may be provided between at least two basic amplifying circuit blocks which control the threshold signal of a basic amplifying circuit block at the latter stage so as to correct the nonlinear transfer characteristic based on the amplitude of the input signal of a basic amplifying circuit block at the former stage (see FIG. 20).

Namely, a plurality of threshold control circuits are provided in the signal amplifying circuit of claim 8. Each threshold control circuit detects the amplitude of the input signal in the basic amplifying circuit block at the former stage, and controls the threshold signal of the basic amplifying circuit block at the latter stage so as to correct the non-linear gain characteristic. As a result, it becomes possible to more precisely correct the distortion of the pulse width.

Also, in the present invention according to claim 11, basic amplifying circuit blocks may be connected in a multistage form, each of which is composed of a threshold generation circuit for detecting an amplitude of an input signal and generating a partial voltage of the amplitude as a threshold signal and a differential amplifying circuit for inputting the input signal and the threshold signal, and an amplitude detection circuit for detecting an amplitude of the input signal of the basic amplifying circuit block at a former stage and threshold control circuits, may be provided between at least two basic amplifying circuit block, which control the threshold signal of the basic amplifying circuit block at a latter stage so as to correct the non-linear transfer characteristic based on the amplitude.

Namely, in the signal amplifying circuit of claim 9, the amplitude detection circuit is further provided corresponding to each of the threshold control circuits. Each of the amplitude detection circuits detects the amplitude of the input signal of the basic amplifying circuit block at a former stage and the threshold control circuit controls the threshold signal of the basic amplifying circuit block at a latter stage so as to correct the non-linear transfer characteristic.

Also, in order to achieve the above-mentioned object, in the present invention according to claim 12, the threshold generation circuit may include a level shift circuit for shifting at least one of the peak level and the bottom level of the amplitude, an amplifier for comparing the peak level and the bottom level at least one of which is shifted, a current switch driven by the output signal of the amplifier, and a current source circuit driven by the current switch (see FIG. 4).

Namely, the level shift circuit is firstly set to shift a level corresponding to the control initiation level V1 shown in FIG. 1A. The level shift circuit shifts at least one of the peak level and the bottom level. The amplifier (comparator) compares both levels shifted or one level shifted and the other level not shifted, and drives the current switch based on the comparison result. The current switch controls the current of the current source circuit. With this current, the threshold control circuit shifts the threshold signal.

Accordingly, the threshold control circuit controls the threshold signal in the form of feedforward based on the peak level and the bottom level of the input signal as well as at least one of the levels shifted. As a result, it becomes possible to correct variations of the pulse width at a high speed.

Also, in the present invention according to claim 13, the current switch may be composed of a differential transistor pair connected to a differential output of the amplifier (see FIG. 26).

Namely, the current switch is composed of differential transistors respectively connected to the differential output of the differential amplifier so that one of the transistors can be used to control the current output. As a result, it becomes possible to reduce influences of the noise due to a logical operation of the comparison output of the amplifier.

Furthermore, for solving both problems of a tailed waveform and a "0" level rise, in a signal amplifying circuit of the present invention according to claim 14, basic amplifying circuit blocks are connected in a multistage form, each of which is composed of a threshold generation circuit for generating a threshold signal based on an input signal and a differential amplifying circuit for inputting the input signal and the threshold signal. This signal amplifying circuit may comprise the threshold generation circuit of at least one basic amplifying circuit block being a peak master-slave type threshold generation circuit with an intermediate level for the threshold signal between a peak level of the input signal and a relative bottom level of the input signal to the peak level, and the threshold generation circuit of at least one different basic amplifying circuit block being a bottom master-slave type threshold generation circuit with an intermediate level for the threshold signal between the bottom level of the input signal and a relative peak level of the input signal to the bottom level.

Also, in order to solve the above-mentioned problems, a signal amplifying circuit of the present invention according to claim 15, in which basic amplifying circuit blocks are connected in a multistage form, may comprise the threshold generation circuits of at least two basic amplifying circuit blocks being peak master-slave type threshold generation circuits with an intermediate level for the threshold signal between a peak level of the input signal and a relative bottom level of the input signal to the peak level.

Moreover, in order to solve the above-mentioned problems, a signal amplifying circuit of the present invention according to claim 16, in which basic amplifying circuit blocks are connected in a multistage form, may comprise the threshold generation circuits of at least two basic amplifying circuit blocks being bottom master-slave type threshold generation circuits with an intermediate level for the threshold signal between a bottom level of the input signal and a relative peak level of the input signal to the bottom level.

Namely, in the present invention according to claim 14, the threshold generation circuit of at least one basic amplifying circuit block is made the peak master-slave type threshold generation circuit which generates an intermediate level for the threshold signal between, for instance, the peak level of the input signal and the relative bottom level of the input signal to the peak level.

In addition, the threshold generation circuit of at least one different basic amplifying circuit block is made the bottom master-slave type threshold generation circuit which generates an intermediate level for the threshold signal between the bottom level of the input signal and the relative peak level of the input signal to the bottom level.

For instance, when the input signal is a small signal including the tailed waveform on the side of the bottom level, the threshold generation circuit of the former-stage basic amplifying circuit block in the signal amplifying circuit is made the peak master-slave type, and the threshold generation circuit of the basic amplifying circuit block at the latter stage in the signal amplifying circuit is made the bottom master-slave type.

In this arrangement, the small signal including the tailed waveform on the bottom side is linearly amplified in the basic amplifying circuit block at the former stage, and the relative peak level of the small signal to the bottom level is detected in the basic amplifying circuit block at the latter stage, so that the small signal is adequately reproduced based on the threshold signal set to an intermediate level between the bottom level and peak level.

On the other hand, with respect to a large signal whose bottom level is raised by an optical extinction ratio deterioration, the relative bottom level to the peak level is detected in the basic amplifying circuit block at the former stage, and the large signal is adequately reproduced based on the threshold signal set to an intermediate level between the peak level and the bottom level.

It is needless to say that when the former-stage basic amplifying circuit provides an inversion output, the same function can be obtained if the latter-stage basic amplifying circuit is made a peak master (claim 13).

Also, when the input signal is a small signal including the tailed waveform on the peak side, or a large signal where the peak level falls, conversely the threshold generation circuit of the basic amplifying circuit block at the former stage in the signal amplifying circuit may be made the bottom master-slave type, and that of the basic amplifying circuit block at the latter stage may be made the peak master-slave type.

Furthermore, it is needless to say that when the basic amplifying circuit at the former stage is made the inversion output, the same function can be obtained if the basic amplifying circuit at latter stage is made a bottom master (claim 14).

Also, in the present invention according to claim 17, a signal amplifying circuit, in which basic amplifying circuit blocks are connected in a multistage form, each of which is composed of a threshold generation circuit for generating a threshold signal based on an input signal and a differential amplifying circuit for inputting the input signal and the threshold signal, may comprise the threshold generation circuit of at least one basic amplifying circuit block provided at and after a second stage being a peak master-slave type threshold generation circuit with an intermediate level for the threshold signal between a peak level of the input signal and a relative bottom level of the input signal to the peak level.

In the presence of an operation delay in the threshold generation circuit, the output signal of the differential amplifying circuit in the signal amplifying circuit and in the basic amplifying circuit block has a problem, for instance, of an overshoot at the lead of a cell since the threshold signal delays from the input signal at a starting time.

Therefore, in the present invention, by using the peak master-slave type threshold generation circuit as the threshold generation circuit of at least one basic amplifying circuit block provided at and after the second stage, the intermediate level for the threshold signal is adopted between the peak level of the input signal and the relative bottom level of the input signal to the peak level.

In this arrangement, when a transient phenomenon such as the overshoot due to the operation delay of the threshold generation circuit at the former stage is about to occur, the threshold generation circuit at the next stage detects the bottom level following the peak level of a transient waveform, so that it becomes possible to generate the accurate threshold signal.

Also, in the present invention according to claim 18, a signal amplifying circuit, in which basic amplifying circuit blocks are connected in a multistage form, each of which is composed of a threshold generation circuit for generating a threshold signal based on an input signal and a differential amplifying circuit for inputting the input signal and the threshold signal, may comprise the threshold generation circuit of at least one basic amplifying circuit block provided at and after a second stage being a bottom master-slave type threshold generation circuit with an intermediate level for the threshold signal between a bottom level of the input signal and a relative peak level of the input signal to the bottom level.

Namely, in this invention, by using the bottom master-slave type threshold generation circuit instead of the peak master-slave type threshold generation circuit in the invention of claim 17, the intermediate level for the threshold signal is adopted between the bottom level of the input signal and the relative peak level of the input signal to the bottom level.

In the same way as the present invention of claims 14 to 16, this arrangement enables the threshold generation circuit at the next stage to generate an accurate threshold signal without being influenced by a transient phenomenon such as the overshoot due to the operation delay of the threshold generation circuit.

Also, in the present invention according to claim 19, the differential amplifying circuit may comprise an AGC amplifier for controlling a gain corresponding to the amplitude of the input signal of the basic amplifying circuit block to which a former stage or itself belongs (see FIG. 23).

Namely, automatically controlling the gain in the form of feedforward according to the amplitude of the input signal and always performing a linear operation so that the amplitude is not made excessively large, the AGC amplifier suppresses variations of the pulse width in a large input amplitude. As a result, the effect of removing the offset of the threshold generation circuit which is connected in a multistage form is further improved.

Also, in the present invention according to claim 20, a threshold control circuit for controlling the threshold signal at a latter stage based on the amplitude of the input signal at a former stage may be provided between two different basic amplifying circuit blocks.

BRIEF DESCRIPTION OF THE DRAWINGS

FIGS. 37A, 33B and 37C are graphs showing operation waveform examples of an embodiment (21) of a signal amplifying circuit according to the present invention;

Throughout the figures, like reference numerals indicate like or corresponding components.

DESCRIPTION OF THE EMBODIMENTS

Figure 2:
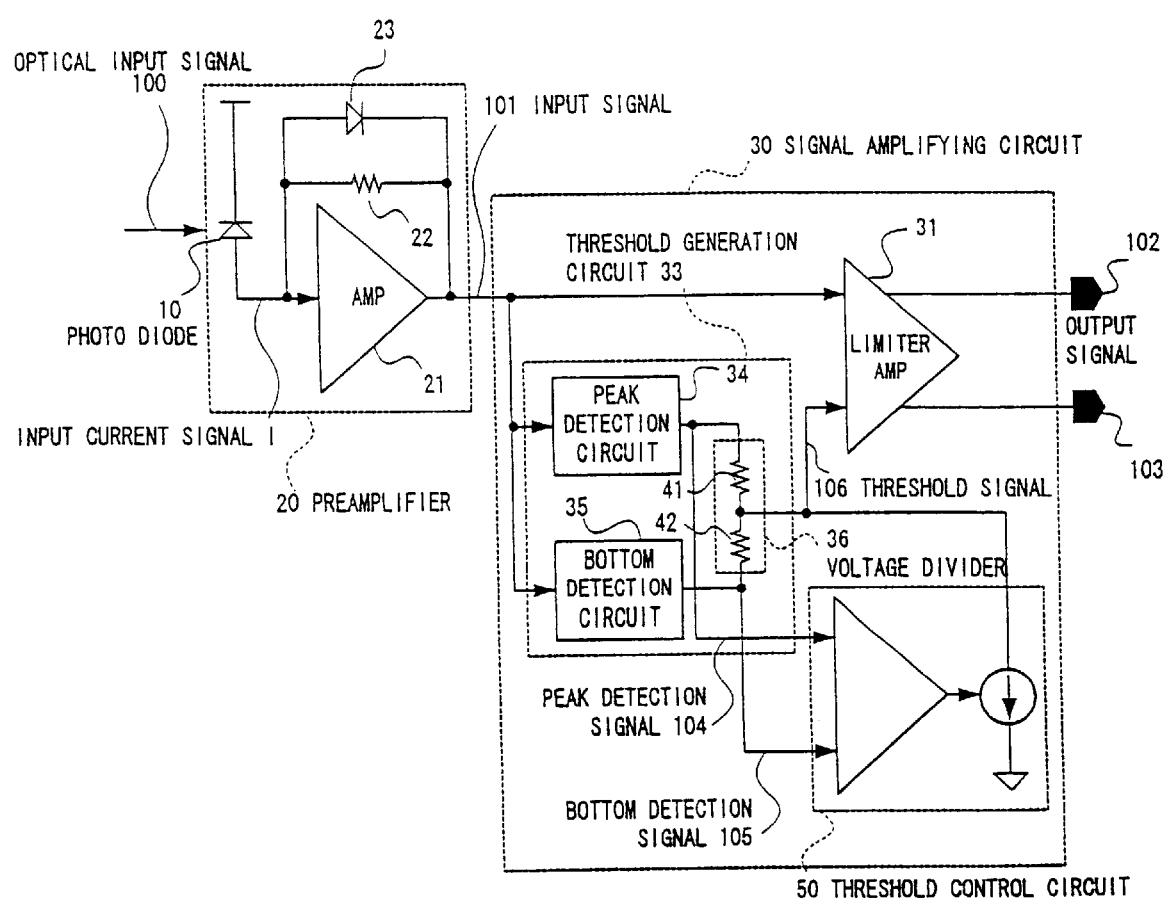
FIG. 2 is a block diagram showing an embodiment (1) of a signal amplifying circuit according to the present invention.

FIG. 2 shows an embodiment (1) of a signal amplifying circuit 30 according to the present invention, which is connected to the preamplifier 20 having a non-linear transfer characteristic for amplifying the high speed burst optical input signal 100 to be outputted as the input signal 101. This preamplifier 20 is the same as shown in FIG. 42, and the input signal 101 assumes to be a negative logic signal.

Figure 42:
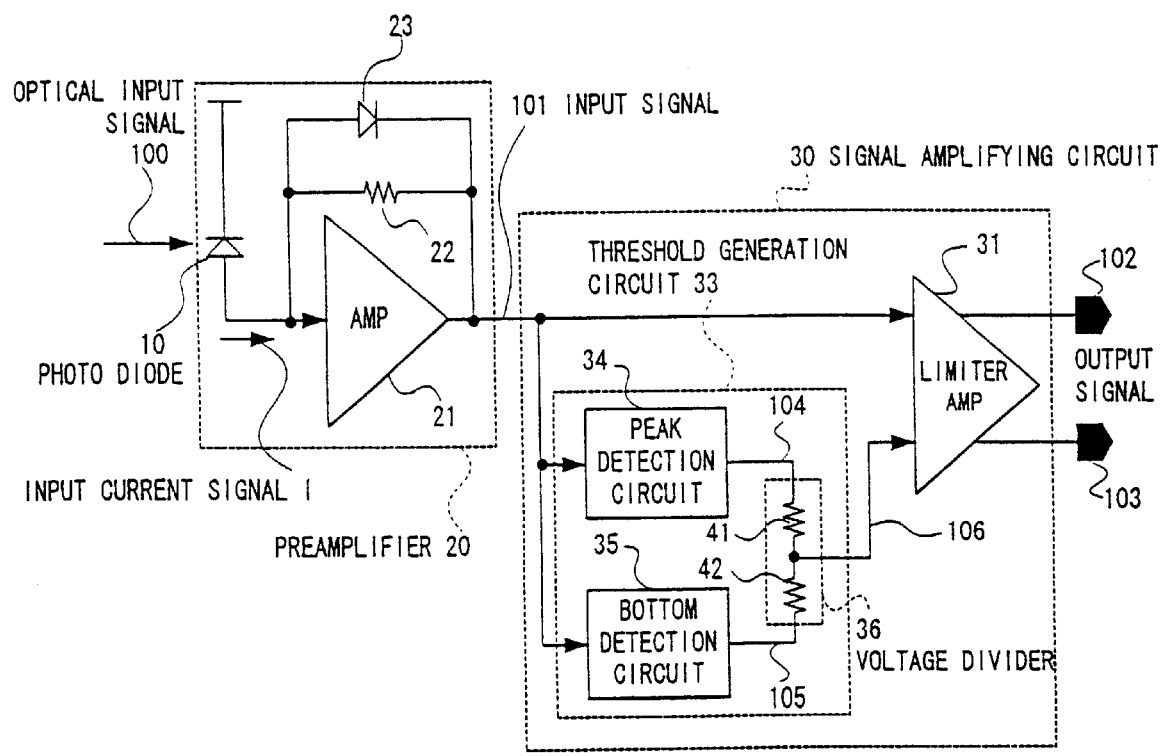
FIG. 42 is a block diagram showing an arrangement (1) of a prior art signal amplifying circuit.
Figure 43A:
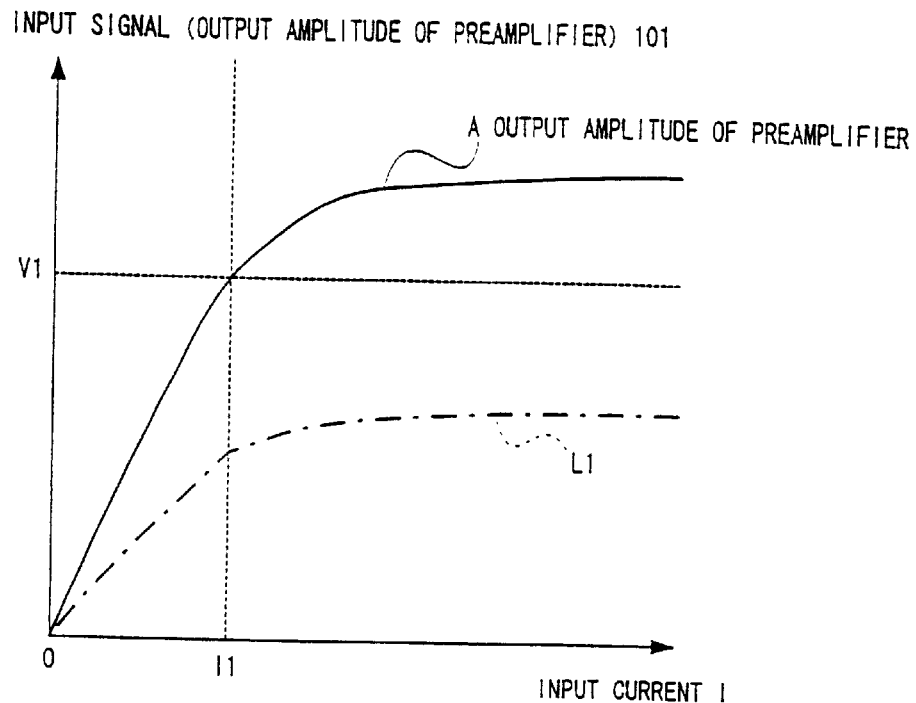
FIGS. 43A and 43B are graphs showing amplification characteristics of a prior art signal amplifying circuit.
Figure 43B:
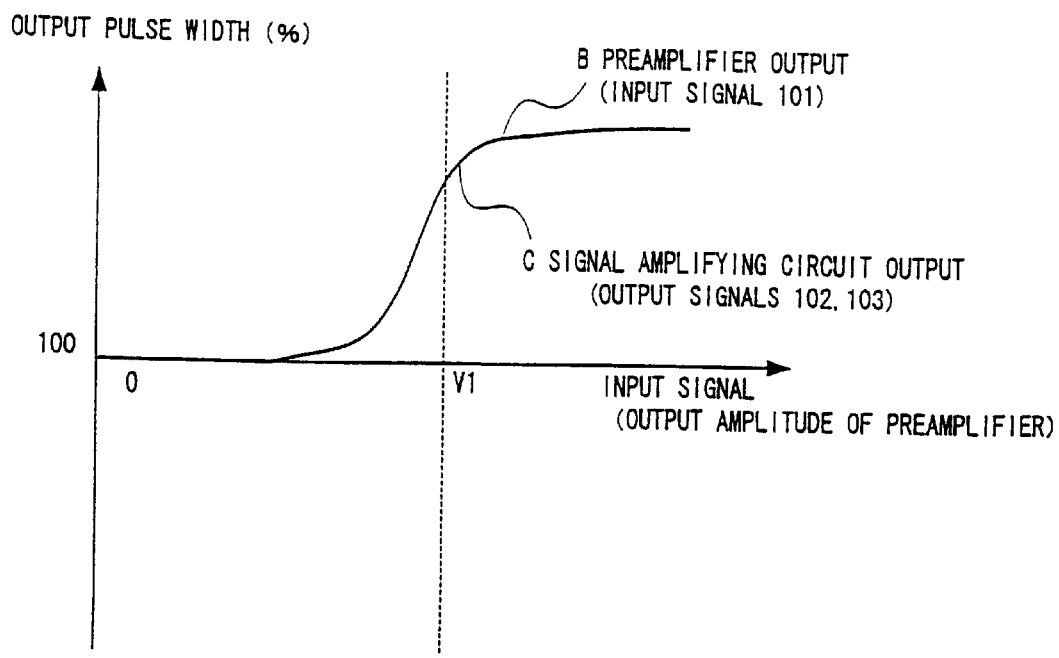

The signal amplifying circuit 30 is different from the prior art signal amplifying circuit 30 shown in FIG. 42 in that a threshold control circuit 50 is added. This threshold control circuit 50 inputs the peak detection signal 104 and the bottom detection signal 105, as an amplitude detection signal, respectively from the peak detection circuit 34 and the bottom detection circuit 35 to control the threshold signal 106 as will be described hereinbelow.

Figure 3A:
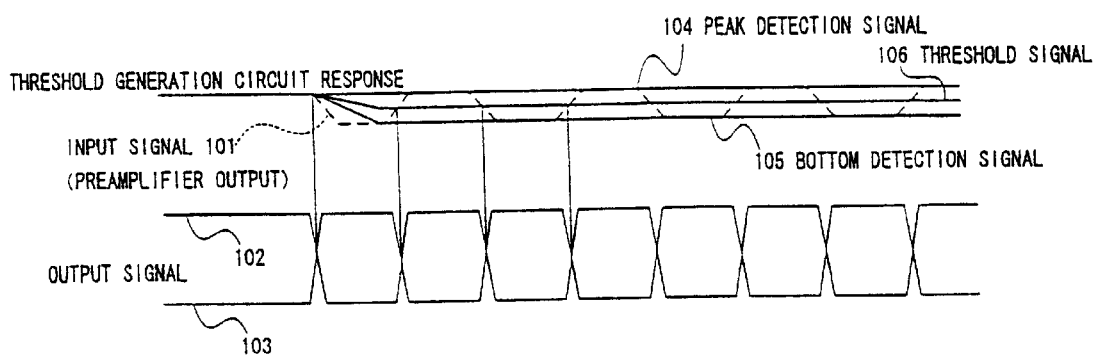
FIGS. 3A and 3B are graphs showing operation waveform examples of an embodiment (1) of a signal amplifying circuit according to the present invention.
Figure 3B:
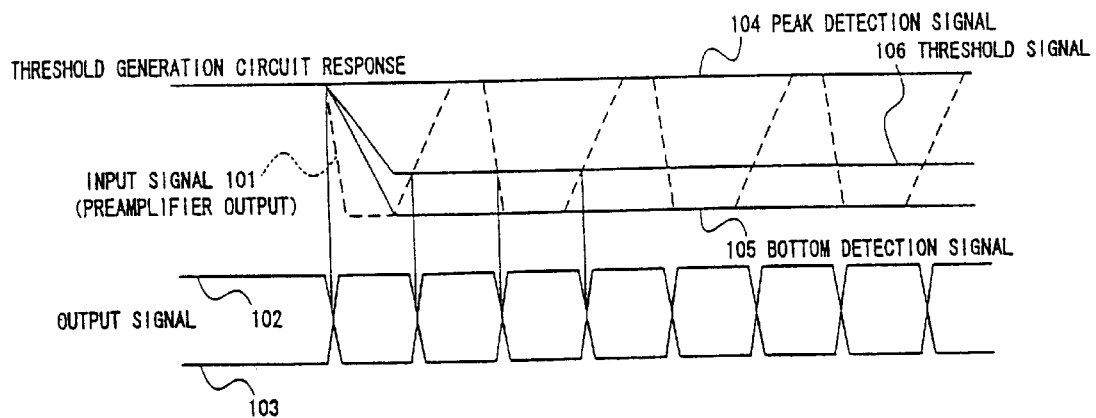
Figure 44A:
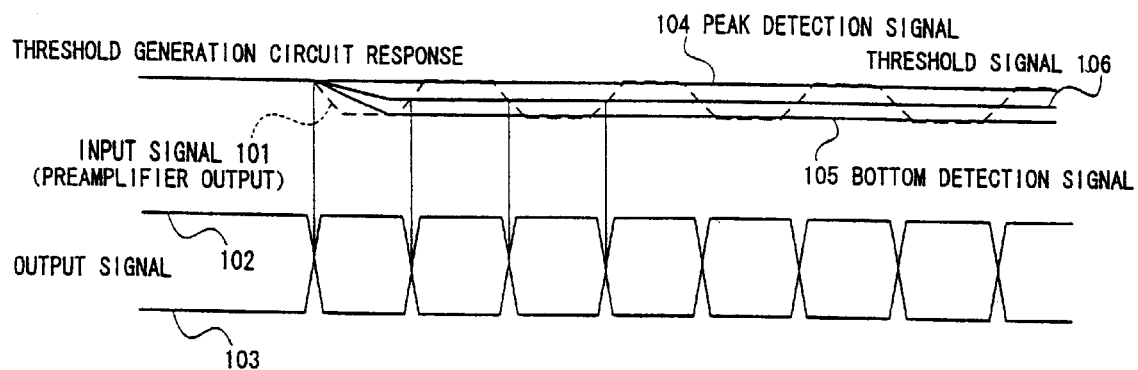
FIGS. 44A and 44B are graphs showing operation waveform examples in an arrangement (1) of a prior art signal amplifying circuit.

FIGS. 3A and 3B show operation wave form examples of the signal amplifying circuit 30 in which FIG. 3A shows an operation waveform example of the input signal 101 having a small amplitude whose pulse width is reproduced without any distortion in the same manner as the prior art shown in FIG. 44A.

Figure 44B:
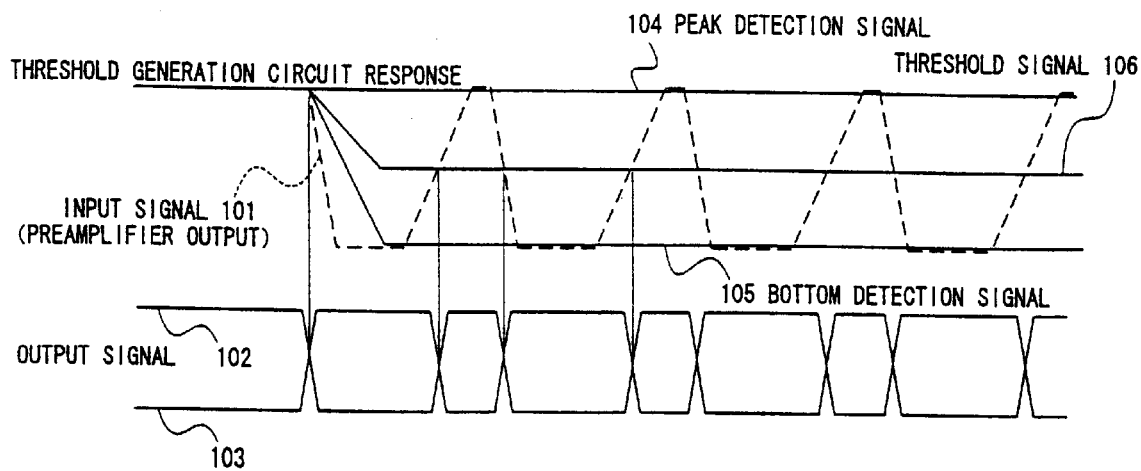
Figure 45:
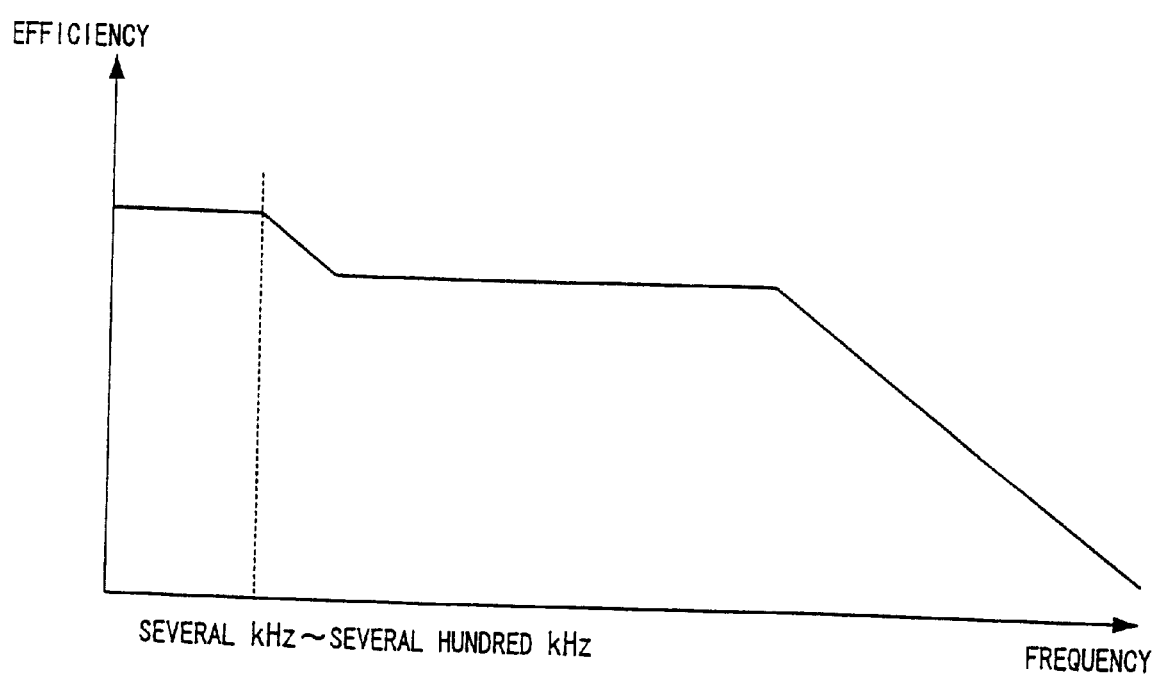
FIG. 45 is a graph showing a frequency characteristic of a general photo device.
Figure 46A:
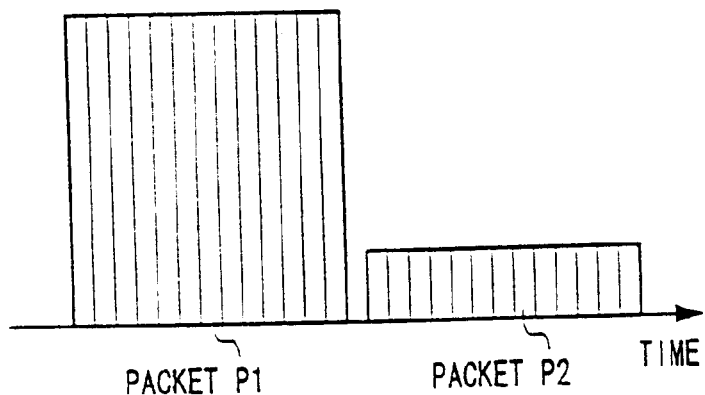
FIGS. 46A and 46B are waveform diagrams showing an input and output packet in a general photo device.
Figure 46B:
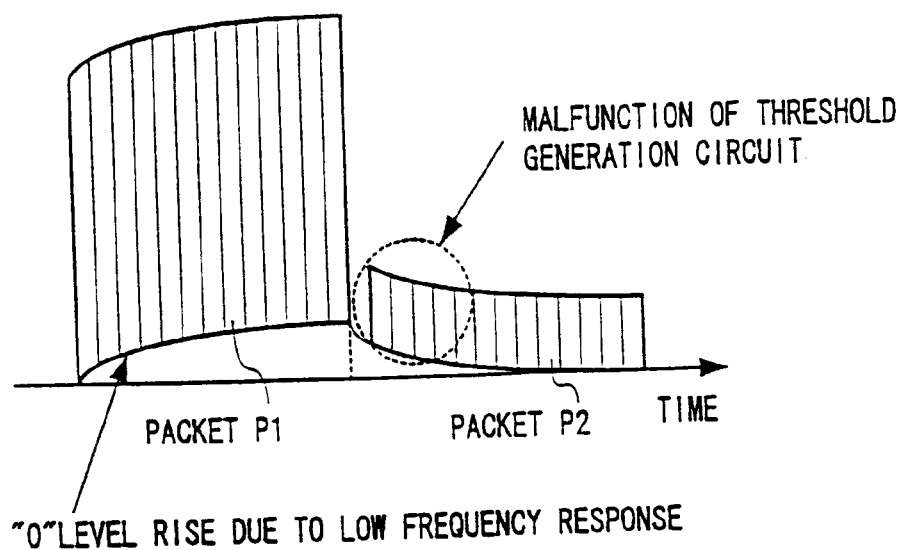
Figure 47:
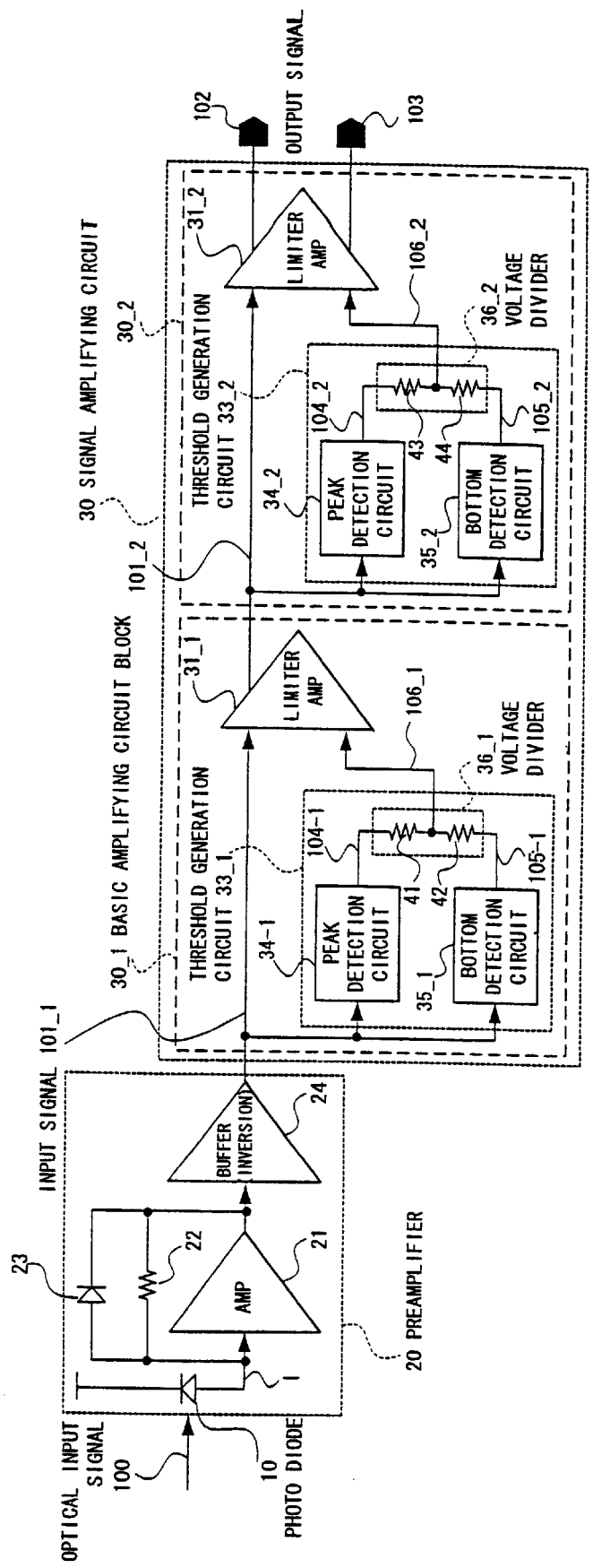
FIG. 47 is a block diagram showing an arrangement (2) of a prior art signal amplifying circuit.
Figure 48A:
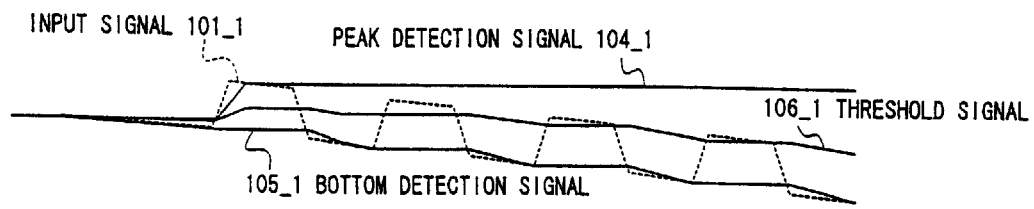
FIGS. 48A, 48B and 48C are graphs showing an operation waveform example (1) in the arrangement (2) of a prior art signal amplifying circuit.
Figure 48B:
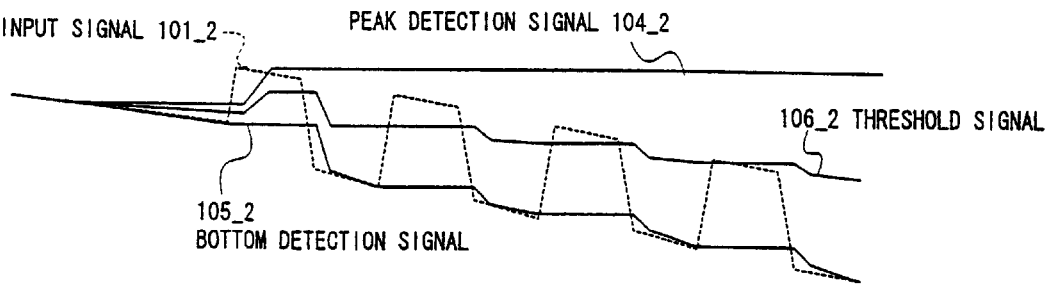
Figure 48C:
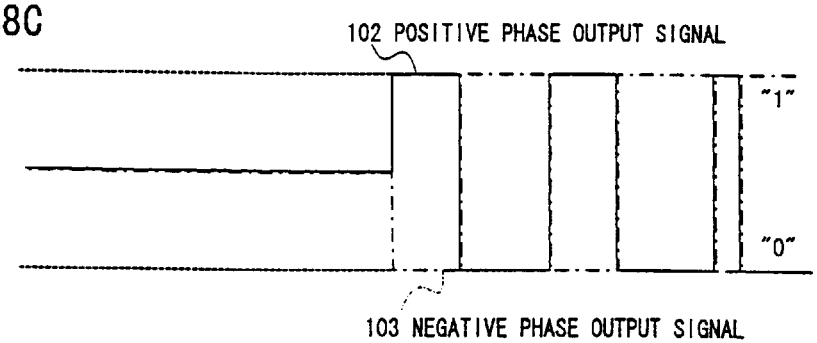
Figure 49:
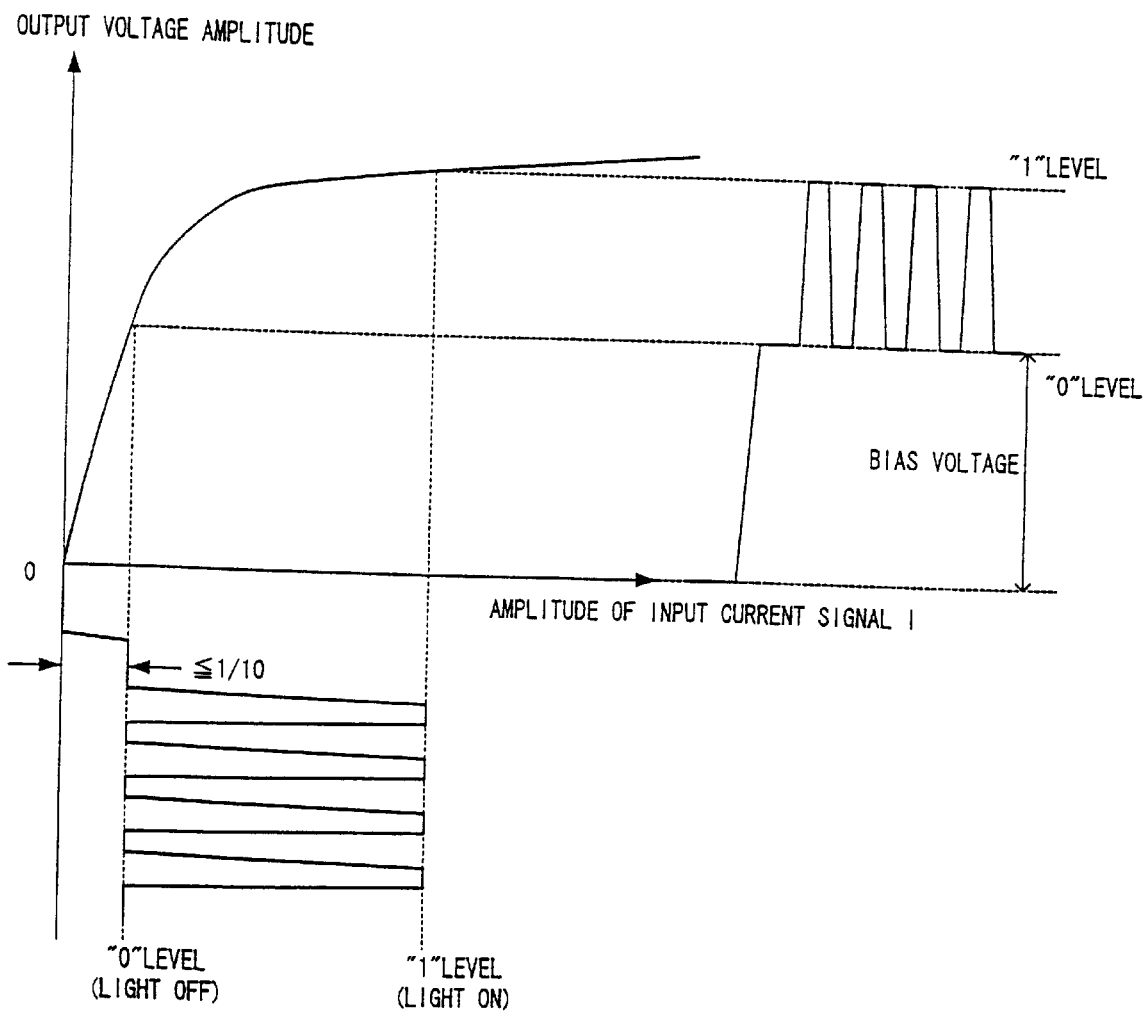
FIG. 49 is a waveform diagram in consideration of an optical extinction ratio in a prior art signal amplifying circuit.
Figure 50A:
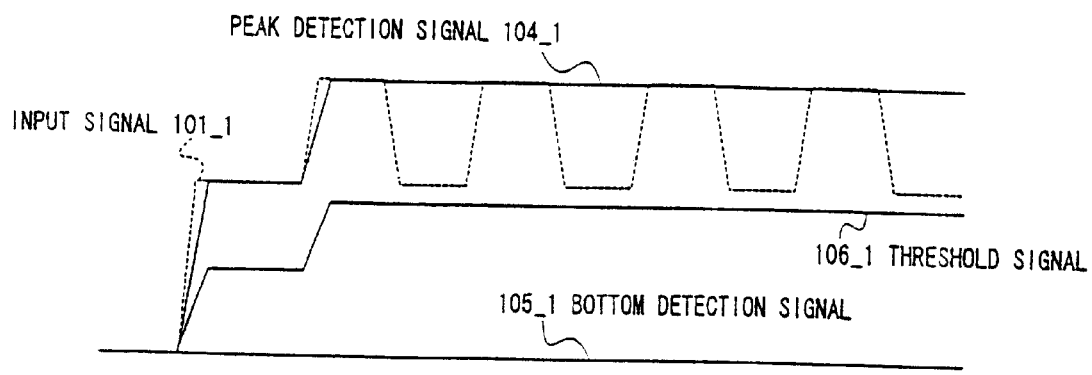
FIGS. 50A, 50B and 50C are block diagrams showing an operation waveform example (2) in an arrangement (2) of a prior art signal amplifying circuit.
Figure 50B:
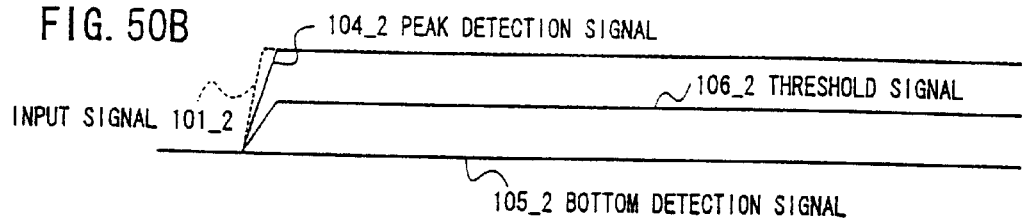
Figure 50C:
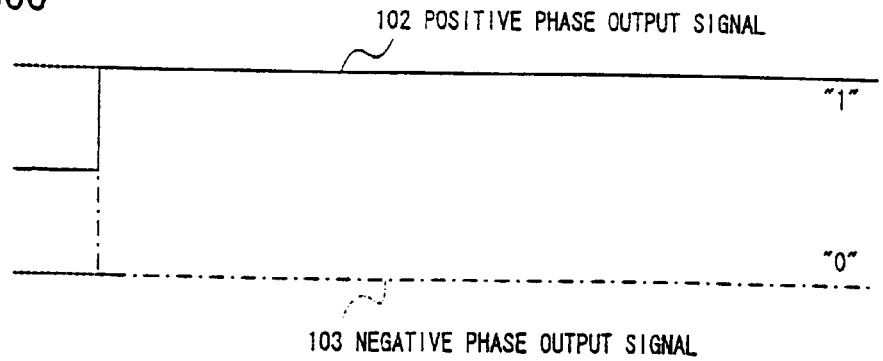

FIG. 3B shows an operation waveform example of the input signal 101 having a large amplitude. Different from FIG. 44B, the threshold signal 106 is shifted downward by the threshold control circuit 50 so as to correct distortions of the pulse width of the output signal due to the non-linear transfer characteristic of the preamplifier 20. As a result, the output signals 102 and 103 have pulse widths without distortions.

Figure 4:
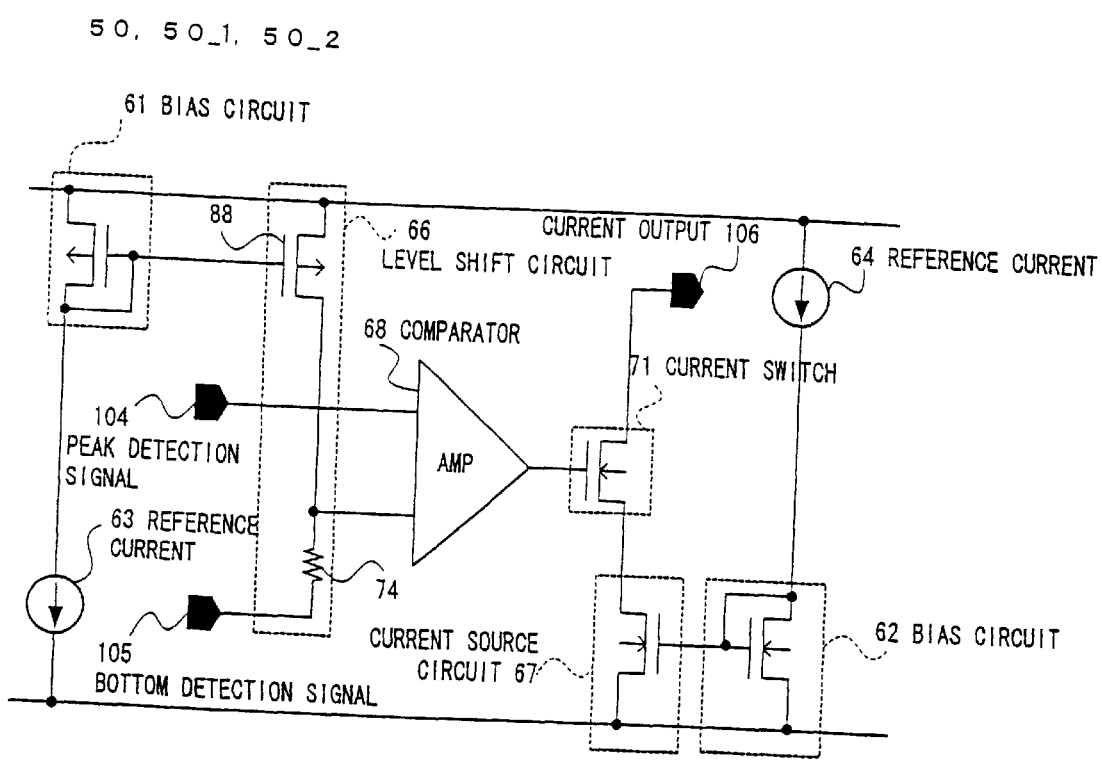
FIG. 4 is a block diagram showing an embodiment (1) of a threshold control circuit in a signal amplifying circuit according to the present invention.

FIG. 4 shows an embodiment (1) of the threshold control circuit 50 shown in FIG. 3. This threshold control circuit 50 includes a level shift circuit 66 for shifting the bottom detection signal 105, an amplifier (comparator) 68 for comparing a signal having shifted the bottom detection signal 105 with the peak detection signal 104, a sinking current source circuit 67, and a current switch 71 for switching on/off the current of the current source circuit 67 with the output signal of the comparator 68.

Furthermore, the threshold control circuit 50 includes a bias circuit 61 forming a current mirror circuit together with the level shift circuit 66 to flow a reference current 63, and a bias circuit 62 forming a current mirror circuit together with the current source circuit 67 to flow a reference current 64. It is to be noted that the level shift circuit 66 is composed of a series circuit of a transistor 88 and a resistor 74.

In operation, the resistor 74 of the level shift circuit 66 has a current of the same value as the reference current 63 flowing therethrough and has a voltage generated thereacross determined by the current value and the resistance of the resistor 74. Accordingly, the output signal of the level shift circuit 66 corresponds to the bottom detection signal 105 shifted upward by the voltage. The amplifier 68 compares the shifted voltage signal with the peak detection signal 104 to switch on/off the current switch 71 based on the compared result.

The current output 106 (hereinafter referred to as the same reference numeral as the threshold signal 106) that is a sink current of the current source circuit 67 is switched on/off by the current switch 71. Accordingly, the current output 106 is not flown when the level difference between the peak detection signal 104 and the bottom detection signal 105, that is the amplitude of the input signal 101 is equal to or less than a control initiation level V1 (see FIG. 1A) determined by the level shift circuit 66, and is flown otherwise.

The current output 106 is connected to the threshold signal 106 which is the output of the threshold generation circuit 33 shown in FIG. 2 to shift downward the level of the threshold signal 106.

As a result, as shown in FIG. 3B, the pulse width of the output signals 102 and 103 has been corrected to have undistorted waveforms. Since the threshold control circuit 50 detects the amplitude of the input signal 101 that is a burst signal to control the threshold signal 106 with the current output 106 in the form of feedforward, the signal amplifying circuit 30 instantaneously responds to the lead of the high speed burst input signal 101 for the correction of the pulse width.

Figure 5:
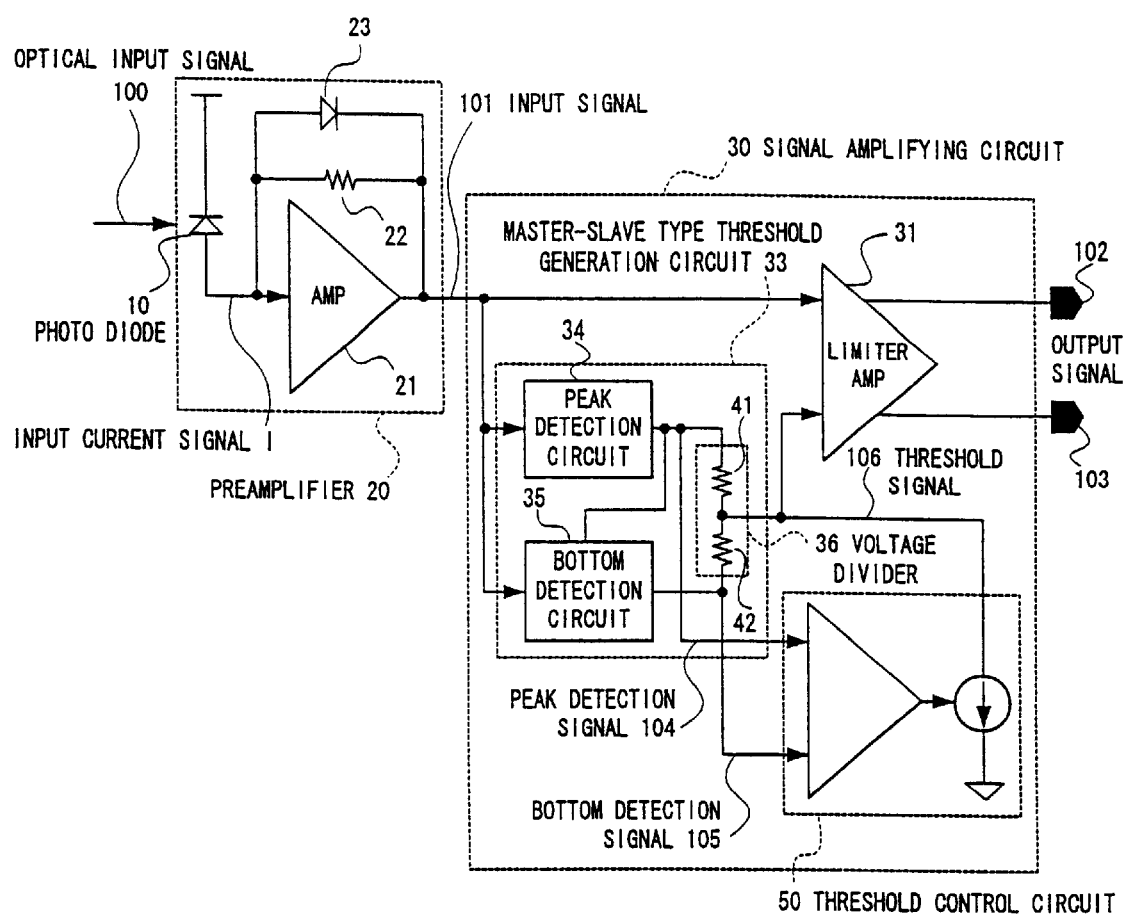
FIG. 5 is a block diagram showing an embodiment (2) of a signal amplifying circuit according to the present invention.

FIG. 5 shows an embodiment (2) of the signal amplifying circuit 30 according to the present invention. In the circuit arrangement of this embodiment, only the threshold generation circuit 33 has a different arrangement from that of embodiment (1) shown in FIG. 2. Namely, this threshold generation circuit 33 forms a peak master-slave type threshold generation circuit in which the output signal 104 of the peak detection circuit 34 is connected to the bottom detection circuit 35.

Figure 6:
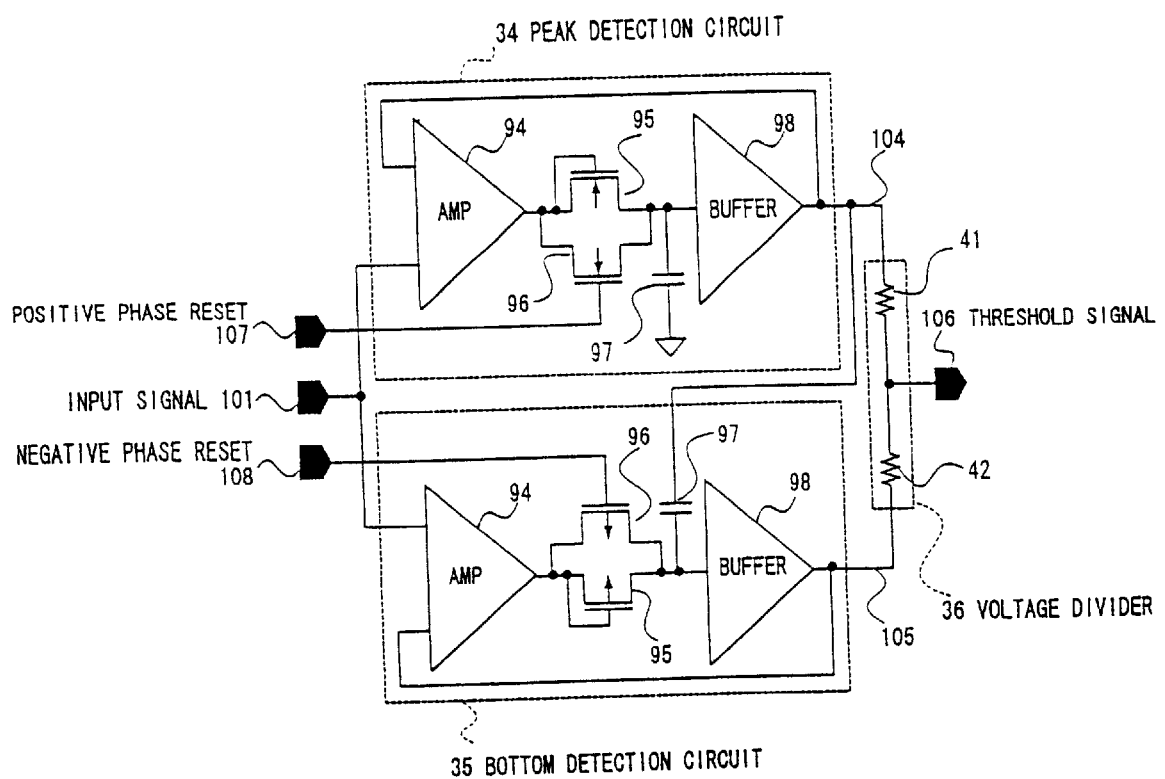
FIG. 6 is a block diagram showing an embodiment (1) of a master-slave type threshold generation circuit in a signal amplifying circuit according to the present invention.

FIG. 6 shows an embodiment of the peak master-slave type threshold generation circuit 33 shown in FIG. 5 in which the peak detection circuit 34 and the bottom detection circuit 35 have the same arrangement with each other. Namely, each of the detection circuits 34 and 35 is composed of an amplifier 94 inputting the input signal 101, a diode 95 and an MOS transistor 96 connected in common to the output terminal of the amplifier, and a capacitor 97 and a buffer 98 connected in common to the output terminals of the diode 95 and the transistor 96. The output signal of the buffer 98 which forms the output signals 104 and 105 of the detection circuits 34 and 35 respectively is provided to the amplifier 94 in the form of a negative-feedback.

Also, the gates of the MOS transistors 96 of the detection circuits 34 and 35 have a positive phase reset signal 107 and a negative phase reset signal 108 inputted thereto, the other terminal of the capacitor 97 of the detection circuit 34 is grounded, and the other terminal of the capacitor 97 of the detection circuit 35 is connected to the output signal 104.

Namely, the detection circuits 34 and 35 output the peak detection signal 104 and the bottom detection signal 105 with the peak level and the bottom level of the input signal 101 being detected and held by the diode 95 and the capacitor 97 respectively when the transistor 96 is made off, while outputting the detection signals 104 and 105 having traced the input signal 101 when the transistor 96 is made on.

In the former case, the peak detection signal 104 corresponds to the peak detection signal 104 shown in FIG. 2, while the bottom detection signal 105 is different from the bottom detection signal 104 shown in FIG. 2 and provided by detecting and holding the bottom level of the input signal 101 with the peak detection signal 104 being made a reference level.

Figure 7A:
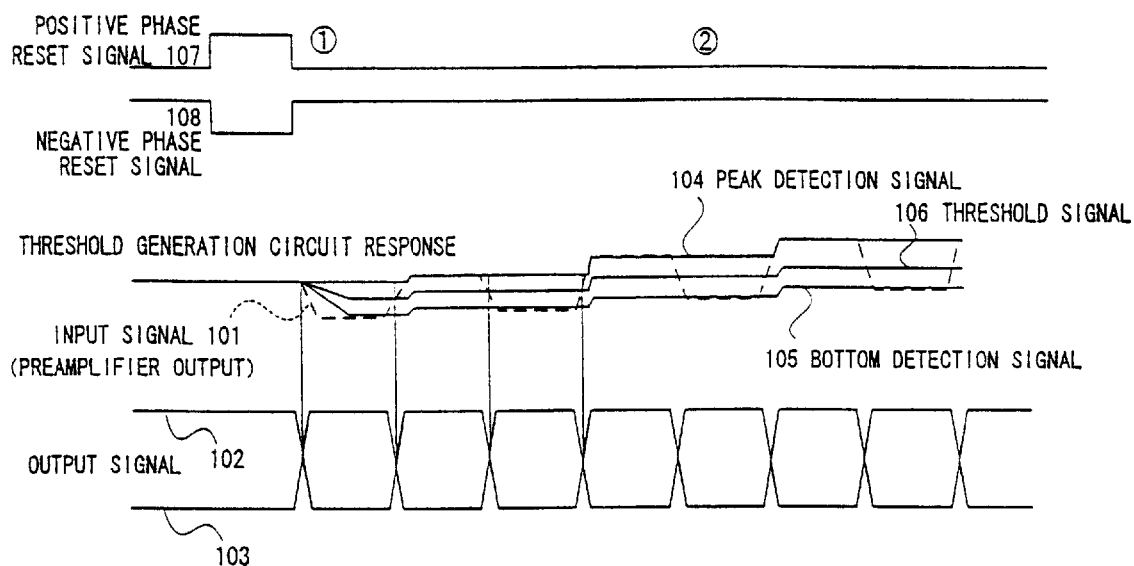
FIGS. 7A and 7B are graphs showing operation waveform examples of an embodiment (2) of a signal amplifying circuit according to the present invention.
Figure 7B:
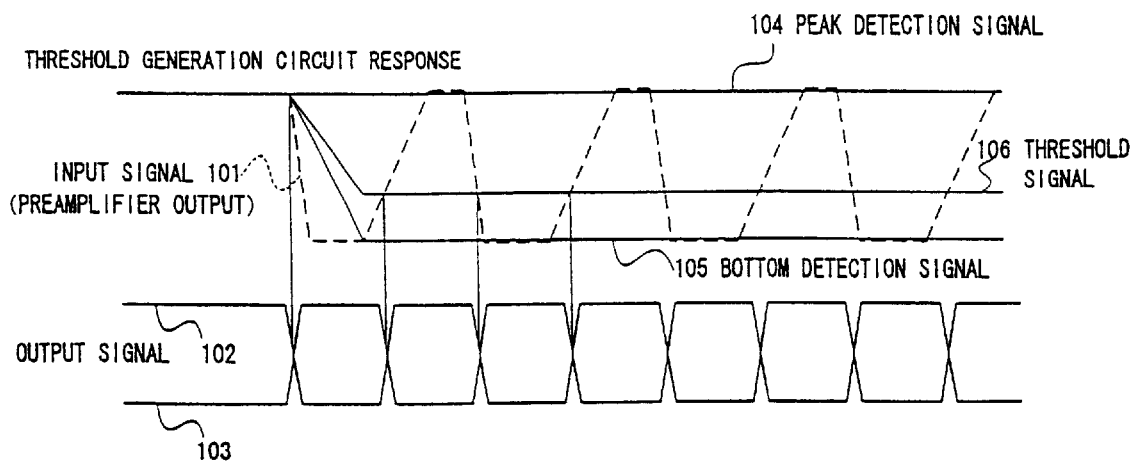

FIGS. 7A and 7B show operation waveform examples of the embodiment (2) shown in FIG. 5, which will be described referring to FIGS. 5 and 6. In FIG. 6, the positive phase reset signal 107 and the negative phase reset signal 108 are made active for a fixed time interval and the MOS transistors 96 are made on to make the peak detection signal 104 and the bottom detection signal 195 identical with the input signal 101 (FIG. 7A①).

When the MOS transistors 96 are in the off state, the detection circuits 34 and 35 detect the peak level of the input signal 101 which is a burst signal and the bottom level relative to the peak level as a reference to output the peak detection signal 104 and the bottom detection signal 105, respectively (FIG. 7A②). The voltage divider 36 generates a partial voltage between the peak detection signal 104 and the bottom detection signal 105 as the threshold signal 106 to be outputted.

In FIG. 5, the threshold control circuit 50 inputs the peak detection signal 104 and the bottom detection signal 105 each of which is an amplitude detection signal of the input signal 101, and does not sink the current output 106 when the input signal 101 has a small amplitude, whereby the pulse width of the output signals 102 and 103 are reproduced without distortions in the same manner as the waveform example shown in FIG. 3A (FIG. 7A).

When the input signal 101 has a large amplitude, the threshold signal 106 is shifted downward by the threshold control circuit 50 so as to correct distortions of the pulse width of the output signal due to the non-linear transfer characteristic of the preamplifier 20 in the same manner as FIG. 3B. As a result, the output signals 102 and 103 have undistorted pulse widths (FIG. 7B).

Figure 8:
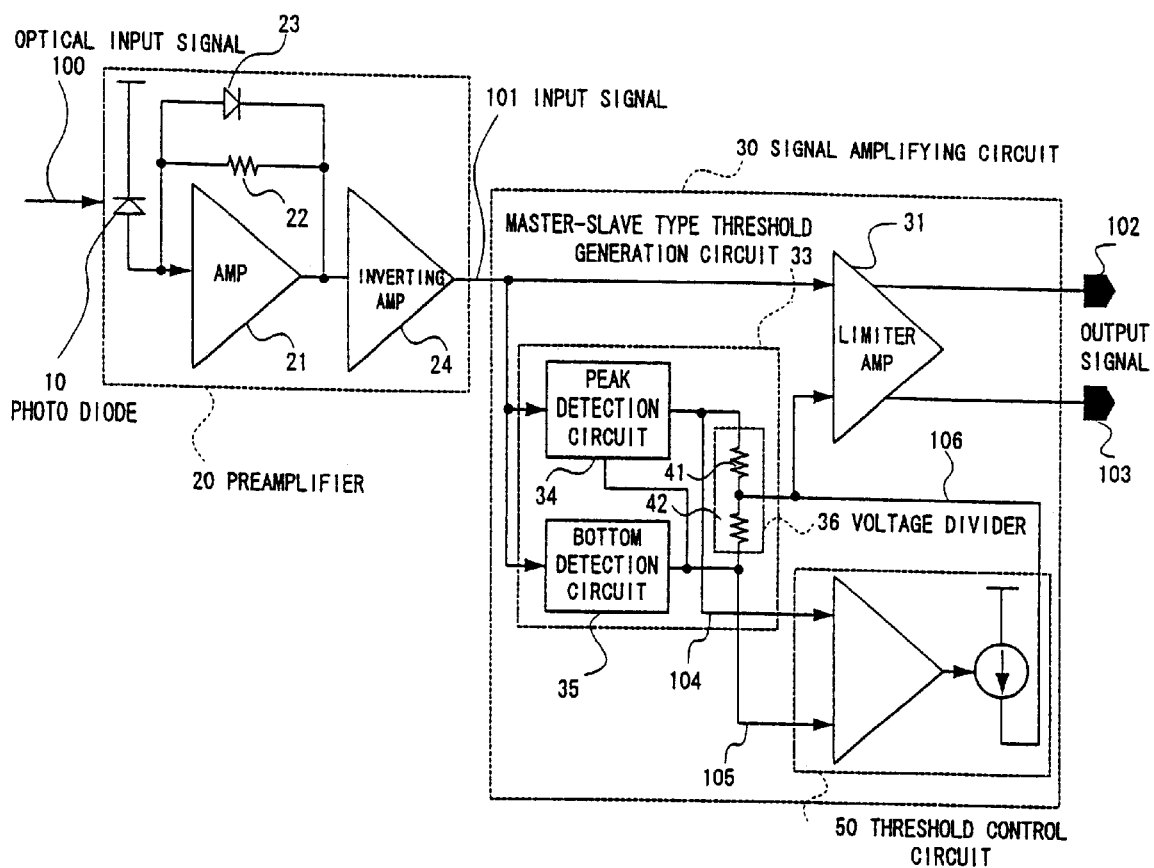
FIG. 8 is a block diagram showing an embodiment (3) of a signal amplifying circuit according to the present invention.

FIG. 8 shows an embodiment (3) of the signal amplifying circuit 30 according to the present invention which has a different arrangement of the preamplifier 20 from that in FIG. 2. Namely, the preamplifier 20 has an arrangement in which a linear inverting amplifier 24 is inserted between the preamplifier 20 and the signal amplifying circuit 30 in FIG. 21, and has the same non-linear transfer characteristic as the preamplifier 20 in FIG. 2 except the inversion of polarity. Also, the input signal 101 assumes a positive logic level in the presence of the inverting amplifier 24, different from the input signal 101 in FIG. 2.

The signal amplifying circuit 30 in this embodiment is composed of the limiter amplifier 31, the threshold generation circuit 33, and the threshold control circuit 50, which is the same arrangement as the signal amplifying circuit 30 in FIG. 5 except the arrangements of the threshold generation circuit 33 and the threshold control circuit 50.

The threshold generation circuit 33 is a bottom master-slave type threshold generation circuit composed of the bottom detection circuit 35 for detecting the bottom level of the input signal 101 to output the bottom detection signal 105, the peak detection circuit 34 for detecting the peak level of the input signal 101 with the bottom detection signal 105 being made a reference level to output the peak detection signal 104, and the voltage divider 36.

It is to be noted that the threshold generation circuit 33 is realized by using the (master) peak detection circuit 34 and the slave bottom detection circuit 35 of the threshold generation circuit 33 shown in FIG. 6 as the slave peak detection circuit 34 and the (master) bottom detection circuit 35 respectively, and by using reference levels for the capacitors 97 of the peak detection circuit 34 and the bottom detection circuit 35 as the bottom detection signal 105 and the ground, respectively.

The threshold control circuit 50 is connected so as to input the peak detection signal 104 and the bottom detection signal 105 as an amplitude detection signal to inject a source current that is the current output 106 into the junction of resistors 41 and 42. This is different from the threshold control circuit 50 in the embodiments (1) and (2) sinking the current output 106 from the output terminal for the threshold signal 106.

In operation, the threshold generation circuit 33 detects the bottom detection signal 105 of the input signal 101 and the peak detection signal 104 of the input signal 101 with the bottom detection signal 105 being made a reference level to output the threshold signal 106 having an intermediate level as an example between the detection signals 104 and 105.

Figure 1A:
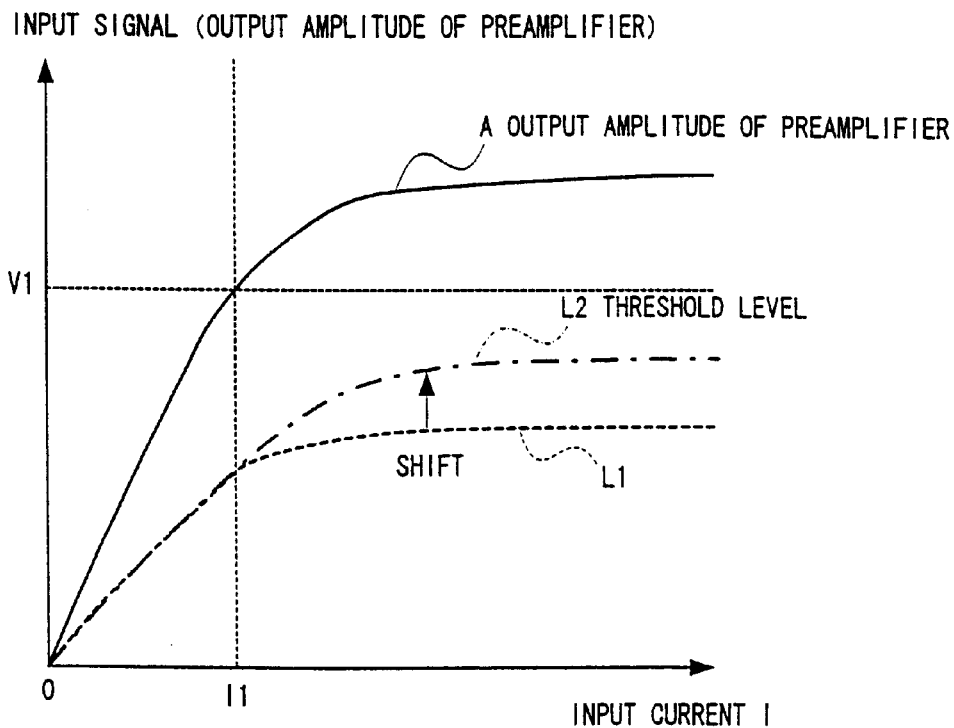
FIGS. 1A and 1B are graphs for illustrating a principle of a signal amplifying circuit according to the present invention.
Figure 1B:
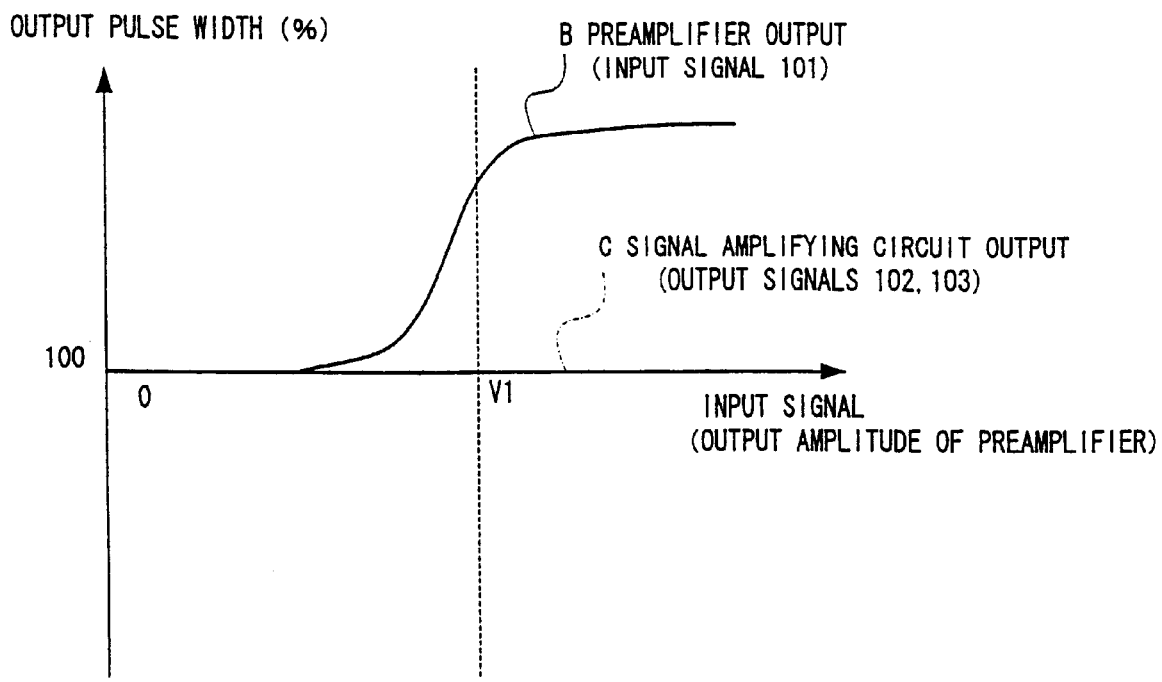

Schematically, the threshold control circuit 50 injects the current output 106 into the junction of the resistors 41 and 42 when the level difference between the peak detection signal 104 and the bottom detection signal 105, i.e. the amplitude of the input signal 101 is larger than the control initiation level V1 (see FIG. 1A) to shift the threshold signal 106 upward (see FIG. 1A). As a result, only distorted pulse widths of the output signals 102 and 103 due to the non-linear transfer characteristic of the preamplifier 20 are to be corrected.

Figure 9:
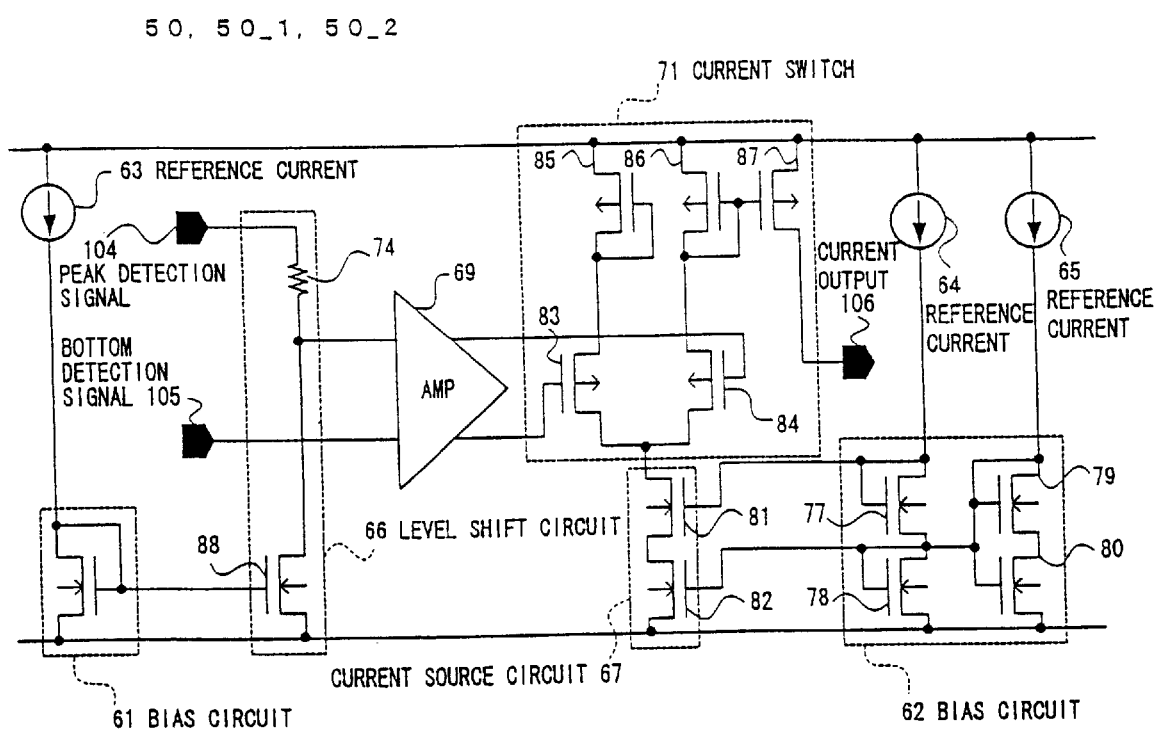
FIG. 9 is a block diagram showing an embodiment (2) of a threshold control circuit in a signal amplifying circuit according to the present invention.

FIG. 9 shows an embodiment (2) of the threshold control circuit 50 shown in FIG. 8. This threshold control circuit 50 is composed of a level shift circuit 66 for level-shifting the peak detection signal 104, a bias circuit 61 forming a current mirror circuit together with the level shift circuit 66 to flow a reference current 63, an amplifier 69 inputting the output signal of the level shift circuit 66 and the bottom detection signal 105 to output a differential output signal, a current source circuit 67, a bias circuit 62 forming a current mirror circuit together with the current source circuit 67 to flow difference currents 64 and 65, and a current switch 71 connected to the current source circuit 67 to input the differential output signal of the amplifier 69 and to provide a current output 106 that is a current source.

The level shift circuit 66 is composed of a transistor 88 and a resistor 74 mutually connected in series, and the current source circuit 67 is composed of transistors 81 and 82 mutually connected in cascade. The current source circuit 67 is a cascode current source circuit forming a current mirror circuit together with the bias circuit 62 including transistors 77 and 78 mutually connected in cascade to flow the reference current 64 and transistors 79 and 80 mutually connected in cascade to flow the reference current 65.

The current switch 71 is composed of a pair of differential transistors 83 and 84 which are respectively connected in cascade to transistors 85 and 86, have sources connected in common to the current source circuit 67, and input the differential output signal of the amplifier 69 into their gates, and a transistor 87 forming a current mirror circuit together with the transistor 86 to provide the current output 106.

In operation, the bottom detection signal 105 is directly applied to the amplifier 69, and the peak detection signal 104 is shifted for the amplifier 69 by a voltage generated by a current corresponding to the reference current 63 flowing through the resistor 74. These two signals 104 and 105 are differentially amplified (compared) by the amplifier 69 and outputted as a differential output signal. This differential output signal is inputted into the gates of the differential transistors 83 and 84 to control the currents flowing through the transistors 83 and 84.

Namely, when a level difference, that is the amplitude of the input signal 101 between the peak detection signal 104 and the bottom detection signal 105 is equal to or less than a level (control initiation level V1 in FIG. 1A) determined by the level shift circuit 36, the sinking current of the current source circuit 67 flows through the transistors 85 and 83.

Otherwise, the sinking current flows through the transistors 86 and 84 whereby a source current corresponding to the injecting current is supplied from the transistor 87 as the current output 106. This current output 106 shifts the level of threshold signal 106 upward (see FIG. 1A), thereby correcting the pulse width of the output signals 102 and 103.

This correction is carried out in the form of feedforward control like the threshold control circuit 50 shown in FIG. 4, resulting in a high speed operation. Also, the current source circuit 67 can carry out the current control with a high current even for a low operation voltage because of the above-noted cascode current source circuit.

It is to be noted that while the level shift circuit 66 of this embodiment shifts the peak detection signal 104 downward, the bottom detection signal 105 or both of the detection signals 104 and 105 may be shifted.

Figure 10:
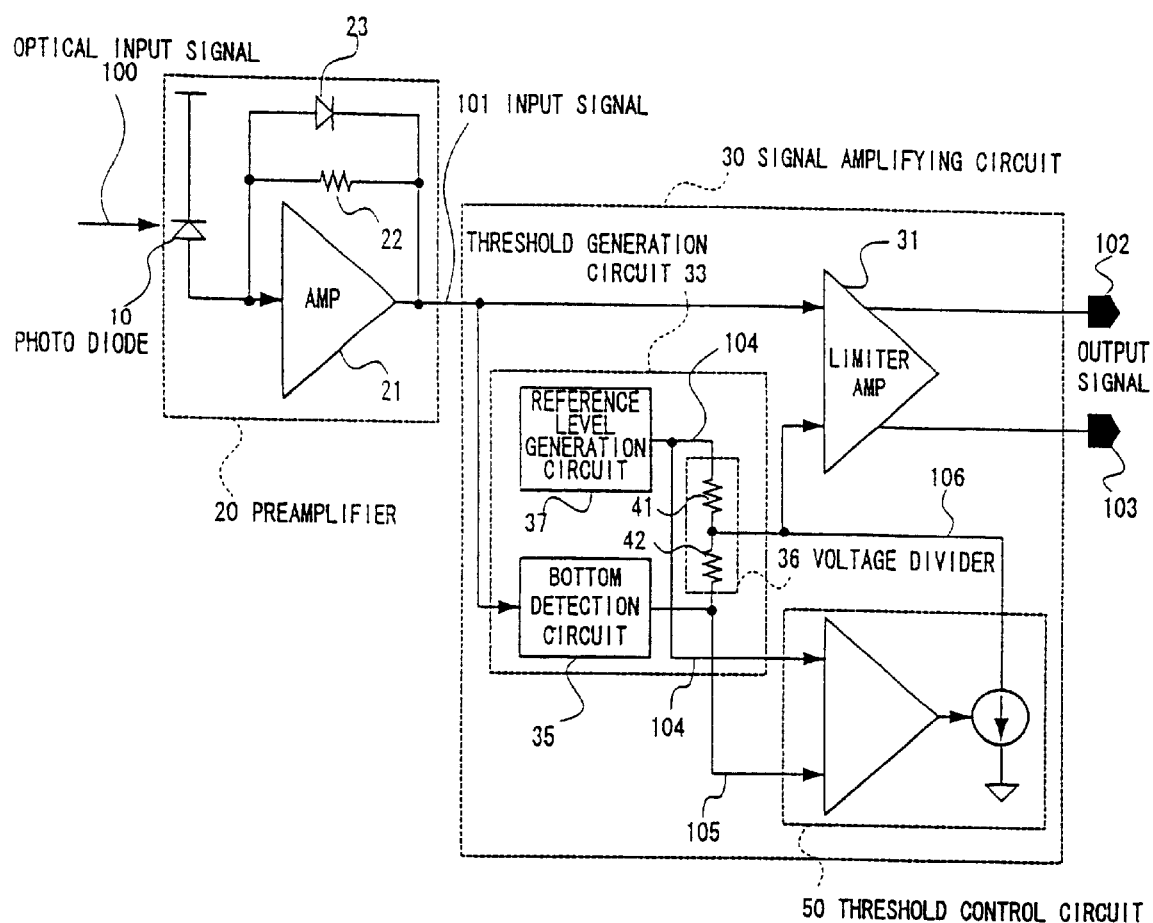
FIG. 10 is a block diagram showing an embodiment (4) of a signal amplifying circuit according to the present invention.

FIG. 10 shows an embodiment (4) of the signal amplifying circuit 30 according to the present invention. The basic arrangement of this embodiment is the same as the signal amplifying circuit 30 shown in FIG. 2 except the arrangement of the threshold generation circuit 33.

The threshold generation circuit 33 is composed of a reference level generation circuit 37 which outputs the peak detection signal 104 that is the peak level (reference level) of the input signal 101 as preliminarily known, the bottom detection circuit 35 which detects the bottom level of the input signal 101 to output the bottom detection signal 105, and the voltage divider 36 which generates a partial voltage between the peak detection signal 104 and the bottom detection signal 105 as the threshold signal 106.

In operation, the threshold generation circuit 33 outputs the threshold signal 106 having an intermediate level as an example between the peak detection signal (reference level) 104 and the bottom detection signal 105, and supplies the detection signals 104 and 105 to the threshold control circuit 50 as an amplitude detection signal.

The threshold control circuit 50 may employ the same shown in FIG. 4, and sinks the current output 106 based on the detection signals 104 and 105 in the same manner as the embodiment in FIG. 2 to control the threshold signal 106, and only corrects the distorted pulse width of the output signals 102 and 103.

Figure 11:
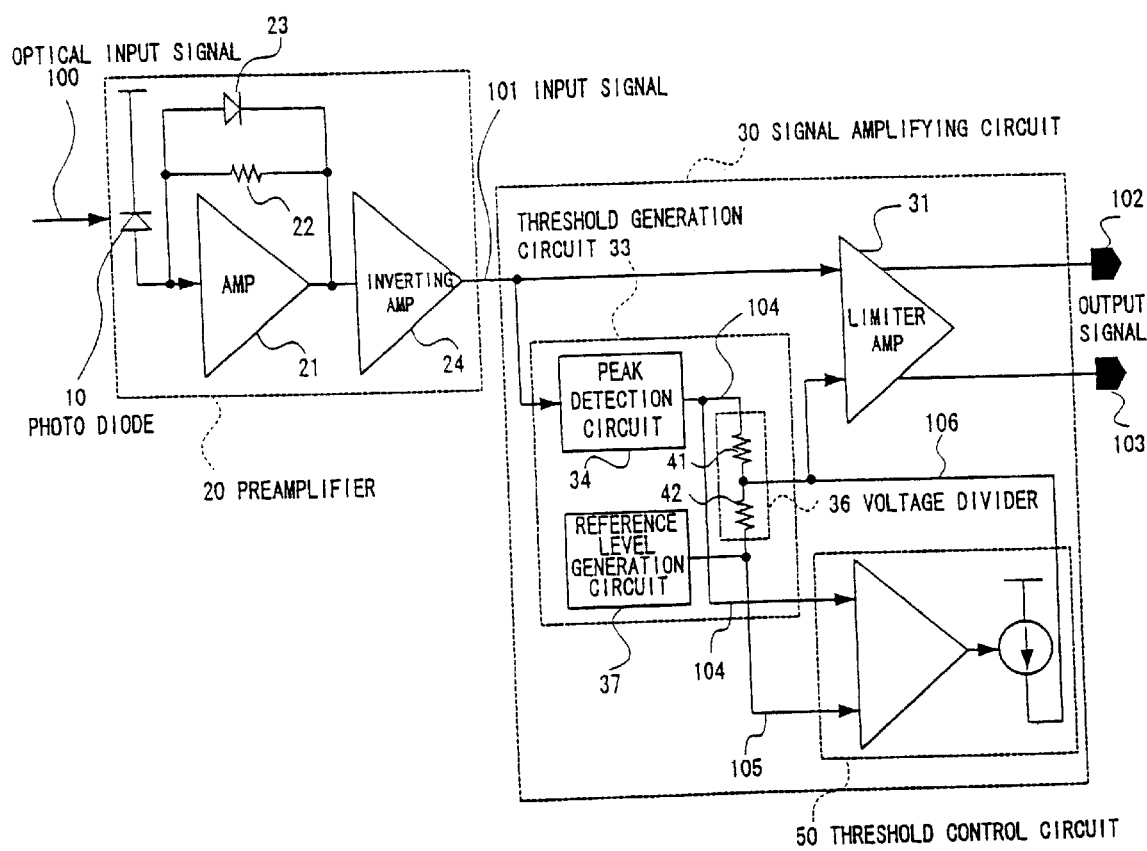
FIG. 11 is a block diagram showing an embodiment (5) of a signal amplifying circuit according to the present invention.

FIG. 11 shows an embodiment (5) of the signal amplifying circuit 30 according to the present invention. In this embodiment, the arrangements of the threshold generation circuit 33 and the threshold control circuit 50 are different from those of the threshold generation circuit 33 and the threshold control circuit 50 of the embodiment shown in FIG. 10.

The threshold generation circuit 33 substitutes a reference level generation circuit 37 which outputs the bottom detection signal 105 that is the bottom level (reference level) of the input signal 101 as preliminarily known, and a peak detection circuit 34 which detects the peak level of the input signal 101 to output the peak detection signal 104. The threshold control circuit 50 is the same as the threshold control circuit 50 shown in FIG. 8.

In operation, the threshold generation circuit 33 outputs the threshold signal 106 having an intermediate level as an example between the peak detection signal 104 and the bottom detection signal (reference level) 105, and supplies the detection signals 104 and 105 to the threshold control circuit 50 as an amplitude signal so that the threshold control circuit 50 like the embodiment in FIG. 8 controls the threshold signal 106 based on the detection signals 104 and 105 so as to correct distorted pulse widths of the output signals 102 and 103.

Figure 12:
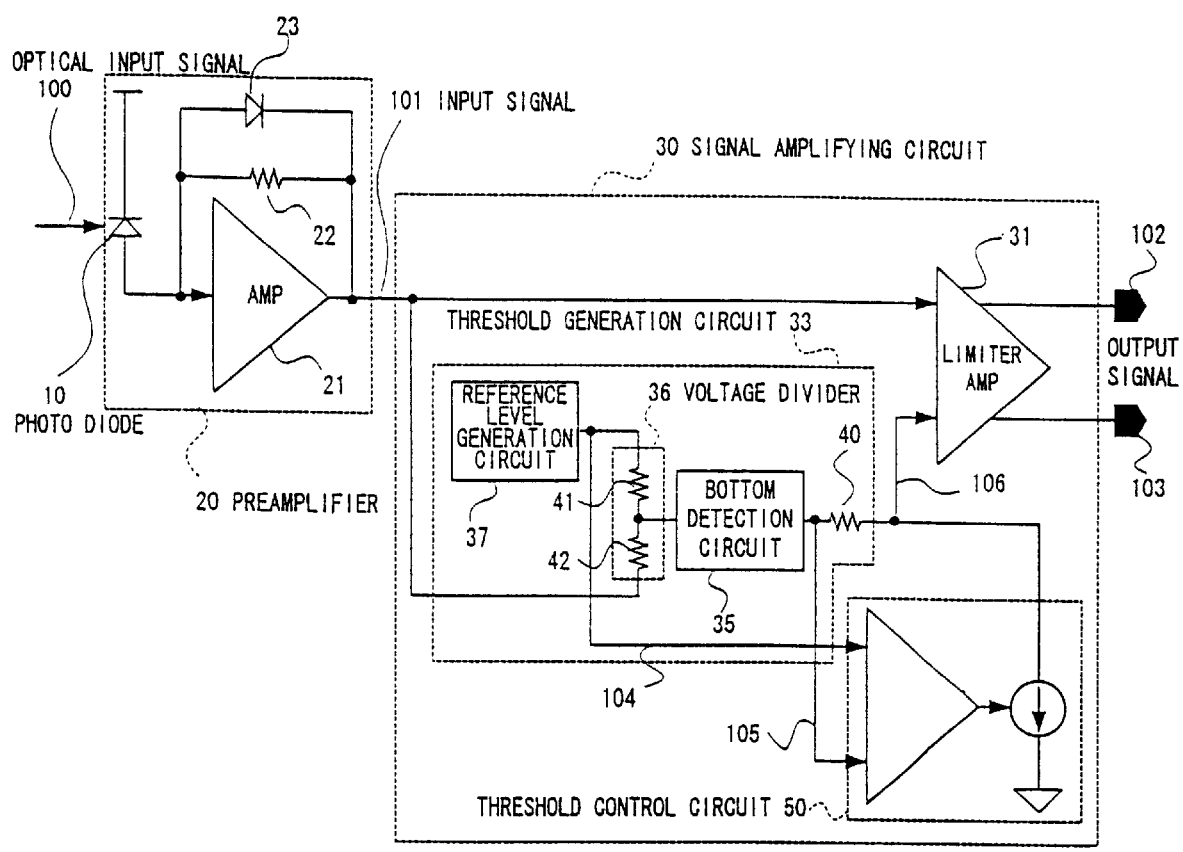
FIG. 12 is a block diagram showing an embodiment (6) of a signal amplifying circuit according to the present invention.

FIG. 12 shows an embodiment (6) of the signal amplifying circuit 30. This embodiment similarly includes a preamplifier having a non-linear transfer characteristic connected in the pre-stage of the signal amplifying circuit 30 like FIG. 2. This signal amplifying circuit 30 has only a different arrangement of the threshold generation circuit 33 from that shown in FIG. 2.

Namely, supposing that the reference level of the input signal 101 is preliminarily known, the threshold generation circuit 33 is composed of a reference level generation circuit 37 for generating the peak detection signal 104 that is the reference level, a voltage divider 36 for generating a partial voltage between the peak detection signal 104 (reference level) and the input signal 101 with the resistors 41 and 42 of the same resistance, a bottom detection circuit for detecting the bottom level of the partial voltage to output the bottom detection signal 105, and a resistor 40 for connecting the bottom detection signal 105 to the input terminal of the limiter amplifier 31 as the threshold signal 106.

Also, the threshold control circuit 50 is the same as that in the signal amplifying circuit 30 of FIG. 2 except that the former inputs the peak detection signal (reference level) 104 and the bottom detection signal 105 as an amplitude detection signal to detect the amplitude of the input signal.

This threshold control circuit 50 of this embodiment can also employ the threshold control circuit 50 shown in FIG. 4. Although the bottom detection signal 105 inputted into the threshold control circuit 50 has a half level of the bottom detection signal shown in FIG. 2, the control initiation level may be halved.

In operation, the threshold generation circuit 33 generates a partial voltage between the reference level (peak detection signal 104) and input signal 101 to detect the bottom level of the partial voltage signal, thereby outputting a signal having a half amplitude level of the input signal 101 as the threshold signal 106 through the resistor 40. This threshold signal 106 is level-shifted downward by the sinking current that is the current output 106 of the threshold control circuit 50 flowing through the resistor 40 in case where the input signal 101 has a large amplitude. As a result, only a distorted pulse width of the output signals 102 and 103 is corrected as an output.

In this embodiment, the threshold control circuit 50 does not use immediately a bottom detection signal of the input signal as the bottom detection signal 105, but instead performs a control taking advantage of the partial voltage (½). Also, in the threshold control circuit 50 which will be described later, it is possible to perform a control taking advantage of a partial voltage of a bottom detection signal or a peak detection signal of the input signal 101 as an amplitude detection signal so that repeated descriptions will be omitted hereinbelow.

Figure 13:
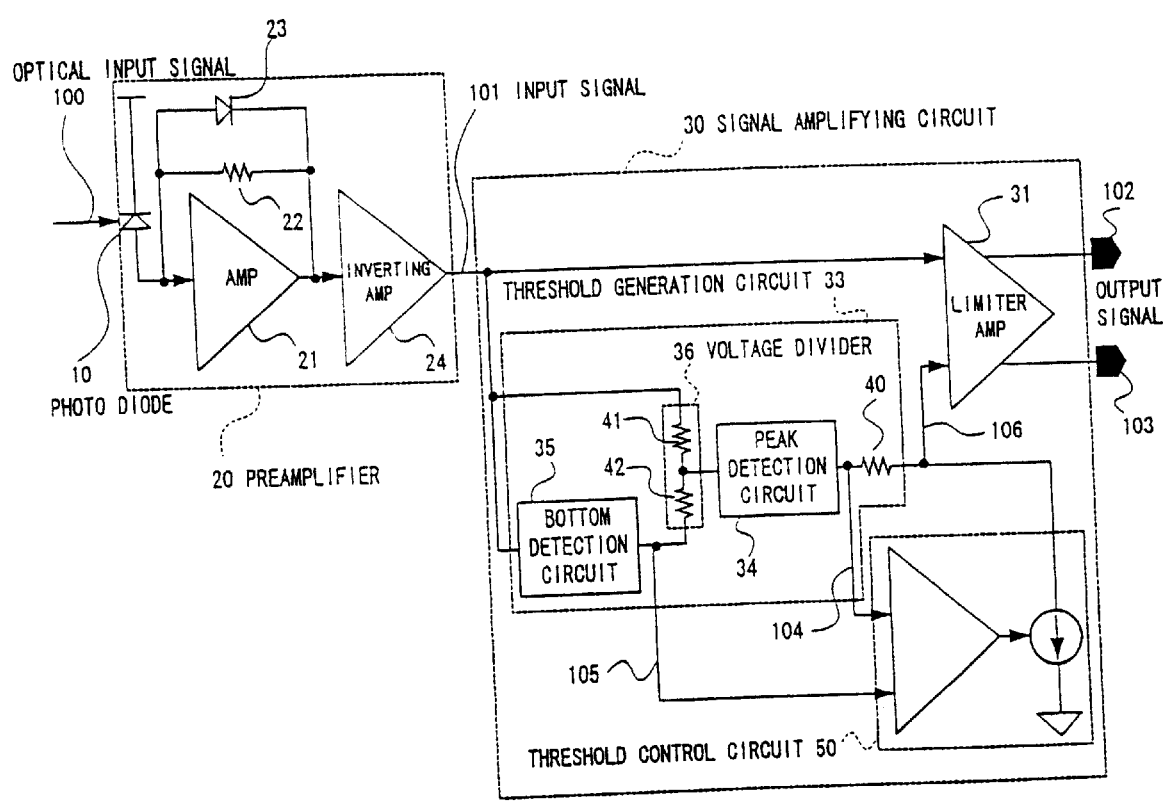
FIG. 13 is a block diagram showing an embodiment (7) of a signal amplifying circuit according to the present invention.

FIG. 13 shows an embodiment (7) of the signal amplifying circuit 30, in which the above-mentioned preamplifier 20 is connected in the pre-stage thereof. The arrangement of this signal amplifying circuit 30 is substantially the same as that of the signal amplifying circuit 30 shown in FIG. 12, however, has different arrangements in the threshold generation circuit 33 and different input terminals of the peak detection signal 104 and the bottom detection signal 105 for which the threshold control circuit 50 detects the amplitude of the input signal 101.

The threshold generation circuit 33 is composed of the bottom detection circuit 35 which detects the bottom level of the input signal 101 and outputs the bottom detection signal 105, the voltage divider 36 which outputs a partial voltage signal obtained from the bottom detection signal 105 and the input signal 101 divided by the resistors 41 and 42, a peak detection circuit 34 which detects the peak level of the partial voltage signal and outputs the peak detection signal 104, and the resistor 40 which transmits the peak detection signal 104 to the limiter amplifier 31 as the threshold signal 106.

The threshold control circuit 50 inputs the output signals of the peak detection circuit 34 and the bottom detection circuit 35 respectively as the peak detection signal 104 and the bottom detection signal 105 so that the arrangement may be the same as in FIG. 4.

In operation, the threshold generation circuit 33 detects the bottom level of the input signal 101 and generates a partial voltage between the bottom level and the input signal 101. The peak level of the partial voltage signal is detected and outputted through the resistor 40 as the threshold signal 106. When the amplitude of the input signal 101 is larger than the control initiation level V1 (see FIG. 1A), the threshold signal 106 is level-shifted downward by the current output 106 of the threshold control circuit 50 flowing through the resistor 40. As a result, distorted pulse widths of the output signals 102 and 103 are corrected and outputted.

Figure 14:
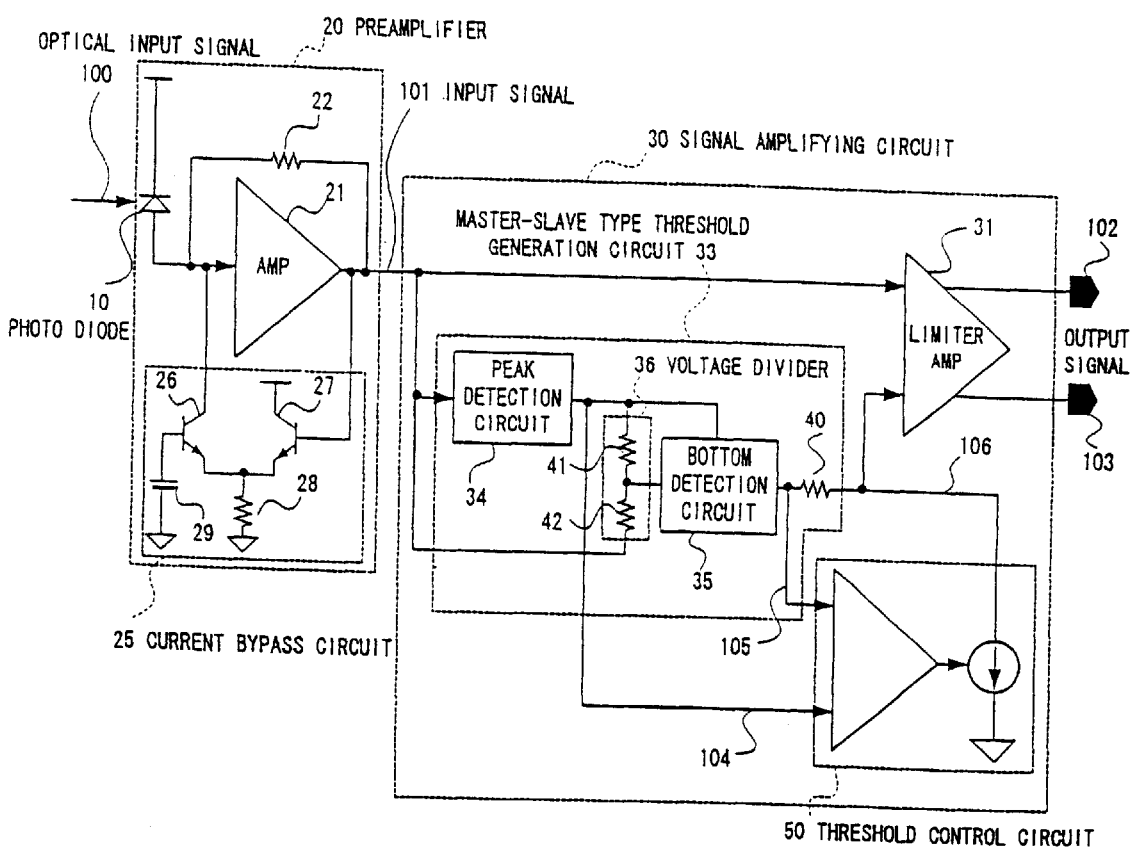
FIG. 14 is a block diagram showing an embodiment (8) of a signal amplifying circuit according to the present invention.

FIG. 14 shows an embodiment (8) of the signal amplifying circuit 30 according to the present invention. While the arrangement of this embodiment is substantially the same as the embodiment (2) shown in FIG. 5, it has different arrangements in the preamplifier 20 and the threshold generation circuit 33 of the signal amplifying circuit 30.

The preamplifier 20 includes, in addition to the same constitutional elements as the preamplifier 20 in FIG. 5, a transistor 26 with the collector connected to the output terminal of the photo diode 10, a power source 29 connected to the base of the transistor 26, a bias voltage resistor 28 with one end connected to the emitter of the transistor 26 and with the other end connected to the ground, and a transistor 27 with the emitter connected to the emitter of the transistor 26, with the collector connected to the power source, and with the base connected to the output terminal of the amplifier 21.

The threshold generation circuit 33 is a peak master-slave type threshold generation circuit which is composed of the peak detection circuit 34 for detecting the peak level of the input signal 101 to output the peak detection signal 104, the voltage divider 36 for generating a partial voltage between the input signal 101 and the peak detection signal 104, the bottom detection circuit 35 for detecting the bottom level of the partial voltage with the peak detection signal 104 being made a reference level to output the bottom detection signal 105, and the resistor 40 for supplying the bottom detection signal 105 to the limiter amplifier 31 as the threshold signal 106.

In operation, since the base of the transistor 26 in the preamplifier 20 is biased lower than the output signal level (inverted) at the time of null signal of the amplifier 21, the transistors 26 and 27 are respectively switched off and on in the absence of the optical signal 100. As the optical signal 100 becomes larger than a fixed value, the input signal 101 that is the output signal of the amplifier 21 decreases lower than the bias of the transistor 26, thereby switching the transistors 26 and 27 on and off, respectively.

As a result, the transistor 26 biases the current from the output terminal of the photo diode 10 to prevent the output of the amplifier 21 from being saturated or sink the same. The non-linear characteristic of the preamplifier 20 is also known to enable the signal amplifying circuit according to the present invention to be applied.

In the threshold generation circuit 33, the voltage divider 36 generates a partial voltage of an intermediate level as an example between the input signal 101 and the peak detection signal 104 detected by the peak detection circuit 34 and outputs the same as a partial voltage signal. With this partial voltage signal being made an input, the bottom detection circuit 35 detects a bottom level relative to the input signal 101 and outputs the same as the bottom detection signal 105, which is outputted as the threshold signal 106 through the resistor 40. The threshold control circuit 50 controls the threshold signal 106 as in FIG. 5 to correct distorted pulse widths of the output signals 102 and 103.

Figure 15:
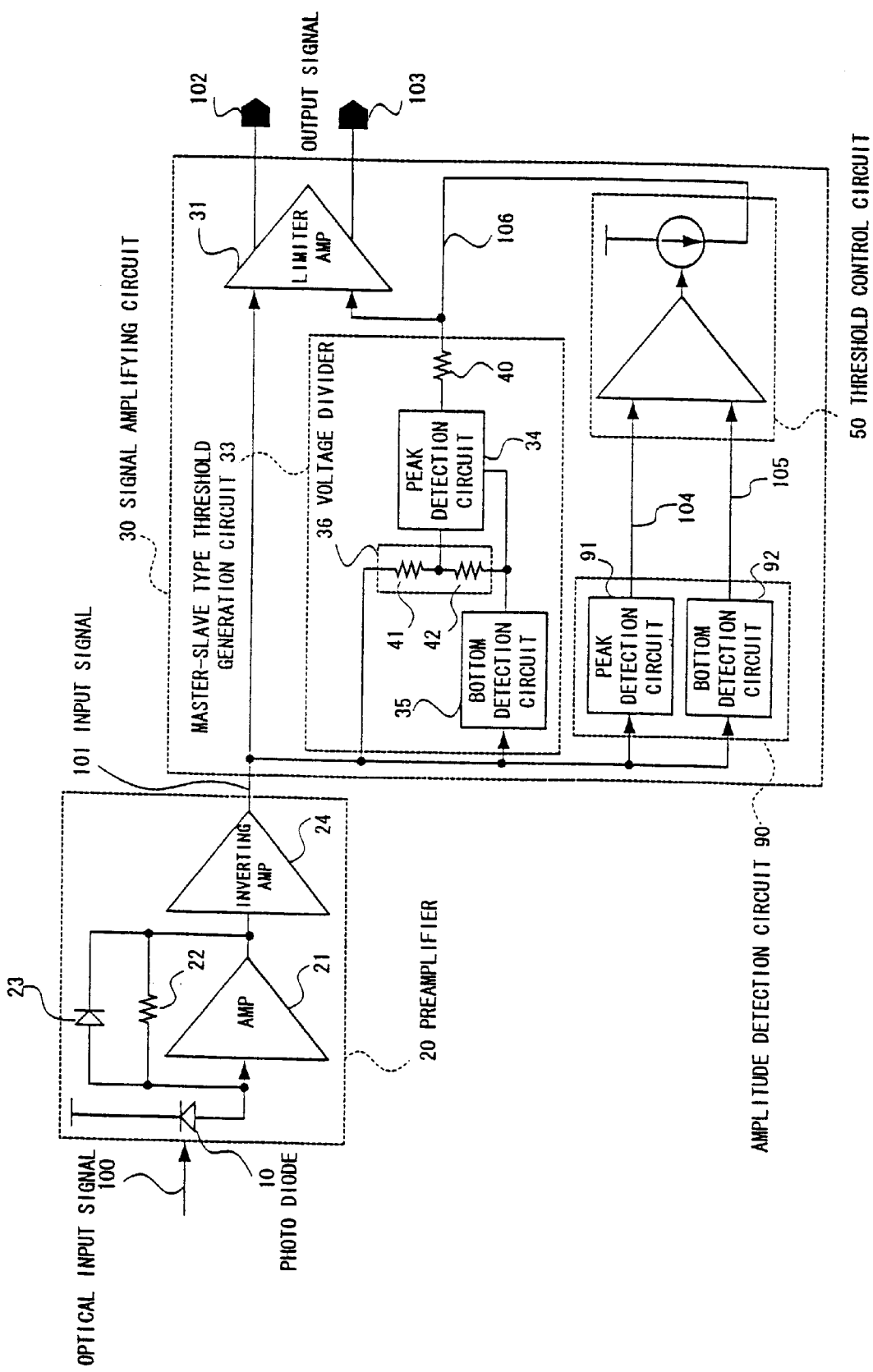
FIG. 15 is a block diagram showing an embodiment (9) of a signal amplifying circuit according to the present invention.

FIG. 15 shows an embodiment (9) of the signal amplifying circuit 30 according to the present invention. While the arrangement of the preamplifier 20 in this embodiment is the same as that shown in FIG. 8 and the arrangement of the signal amplifying circuit 30 is substantially the same as that shown in FIG. 11, the arrangements of the threshold generation circuit 33 and the threshold control circuit 50 are different, and further an amplitude detection circuit 90 is included.

The threshold generation circuit 33 is the bottom master-slave type threshold generation circuit composed of the bottom detection circuit 35 for detecting the bottom level of the input signal 101, the voltage divider 36 for generating a partial voltage between the bottom level and the input signal 101, the peak detection circuit 34 for detecting the peak level of the partial voltage signal based on the bottom level, and the resistor 40 for supplying the peak level to the limiter amplifier 31 as the threshold signal 106.

The amplitude detection circuit 90 is composed of a peak detection circuit 91 and a bottom detection circuit 92 which respectively detect the peak level and the bottom level of the input signal 101 and output the same as the peak detection signal 104 and the bottom detection signal 105. The threshold control circuit 50 inputs the peak detection signal 104 and the bottom detection signal 105 as the amplitude detection signal. The arrangement of the threshold control circuit 50 is the same as that shown in FIG. 8.

In operation, the threshold generation circuit 33 detects the bottom level of the input signal 101, and detects, for instance, an intermediate level between the bottom level and the input signal 101. Then, the threshold generation circuit 33 detects a relative peak level of the intermediate level based on the bottom level to output the same through the resistor 40 as the threshold signal 106.

The threshold control circuit 50, different from the threshold control circuit 50 in FIG. 11, inputs the peak detection signal 104 and the bottom detection signal 105 which are the amplitude detection signal of the input signal 101 not from the threshold generation circuit 33 but from the amplitude detection circuit 90, and performs the same control as FIG. 11 to correct the distorted pulse widths of the output signals 102 and 103. Thus, it is also possible to prepare the amplitude detection signal which is inputted to the threshold control circuit 50 in a different circuit from the threshold generation circuit 33.

Figure 16:
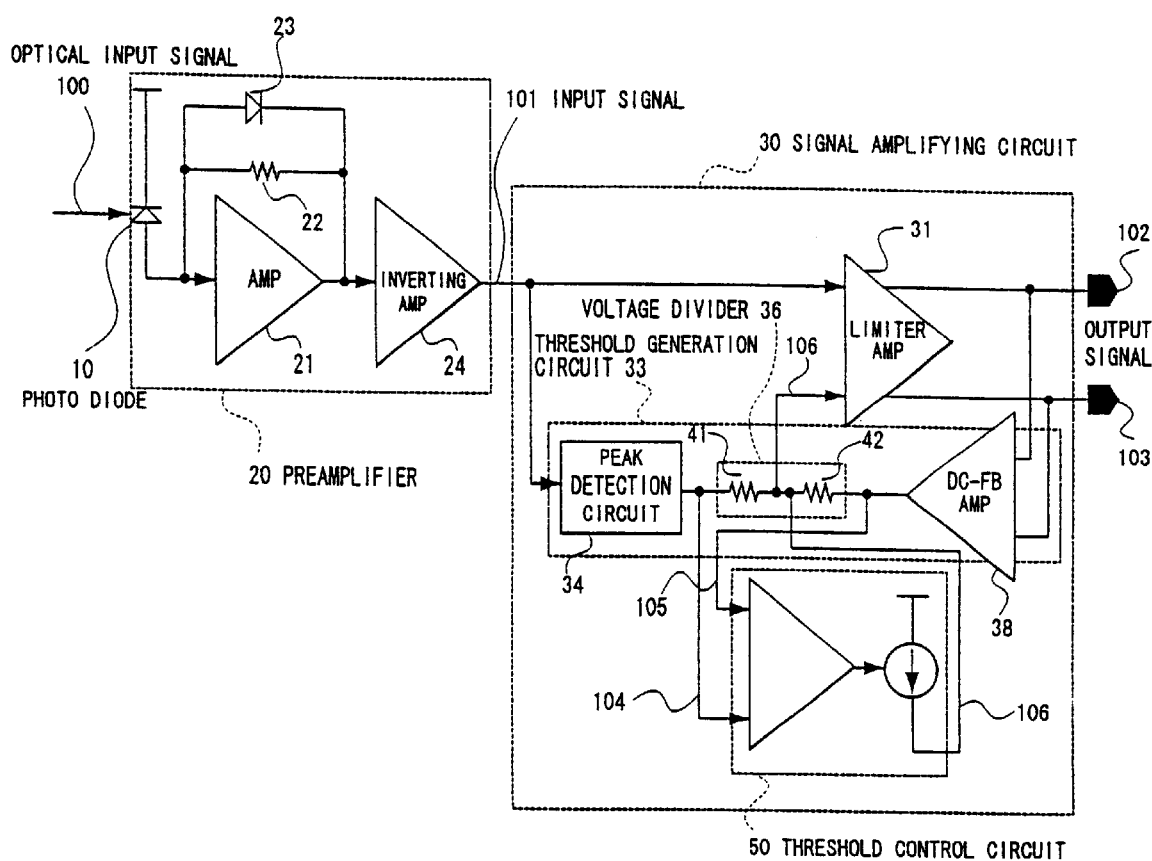
FIG. 16 is a block diagram showing an embodiment (10) of a signal amplifying circuit according to the present invention.

FIG. 16 shows an embodiment (10) of the signal amplifying circuit 30 according to the present invention, in which the arrangement of the preamplifier 20 is the same as that in FIG. 8.

The signal amplifying circuit 30 is composed of the limiter amplifier 31, the threshold generation circuit 33, and the threshold control circuit 50. The arrangement of the signal amplifying circuit 30 being the same as that shown in FIG. 8, the arrangement of the threshold generation circuit 33 is different.

The threshold generation circuit 33 is composed of the peak detection circuit 34 for detecting the peak level of the input signal 101 and outputting the peak detection signal 104, a DC feedback amplifier (DC-FB amplifier) 38 for inputting the differential output signals 102 and 103 of the limiter amplifier 31 and performing the negative-feedback operation to obtain a constant average value of both output signals, and supplying the bottom detection signal 105 which is a DC level of the input signal, and the voltage divider 36 for generating a partial voltage between the peak detection signal 104 and the bottom detection signal 105 by the resistors 41 and 42 having equal resistances and outputting the threshold signal 106.

The threshold control circuit 50 is connected so as to input the peak detection signal 104 and the bottom detection signal 105 as the amplitude detection signal, and to inject (flow) the source current which is the current output 106 into the junction of the resistors 41 and 42. This is the same as the threshold control circuit of the embodiments (3) and (9).

In operation, the threshold generation circuit 33 detects the peak detection signal 104 and the bottom detection signal 105 of the input signal 101 to output the threshold signal 106 which is the partial voltage signal between the both detection signals 104 and 105.

Schematically, when the level difference between the peak detection signal 104 and the bottom detection signal 105, i.e. the amplitude of the input signal 101 is larger than the control initiation level V1 (see FIG. 1A), the threshold control circuit 50 injects the current output 106 into the junction of the resistors 41 and 42 and shifts the threshold signal 106 upward (see FIG. 1A). As a result, distorted pulse widths of the output signals 102 and 103 due to the non-linear transfer characteristic of the preamplifier 20 are to be corrected.

Figure 17:
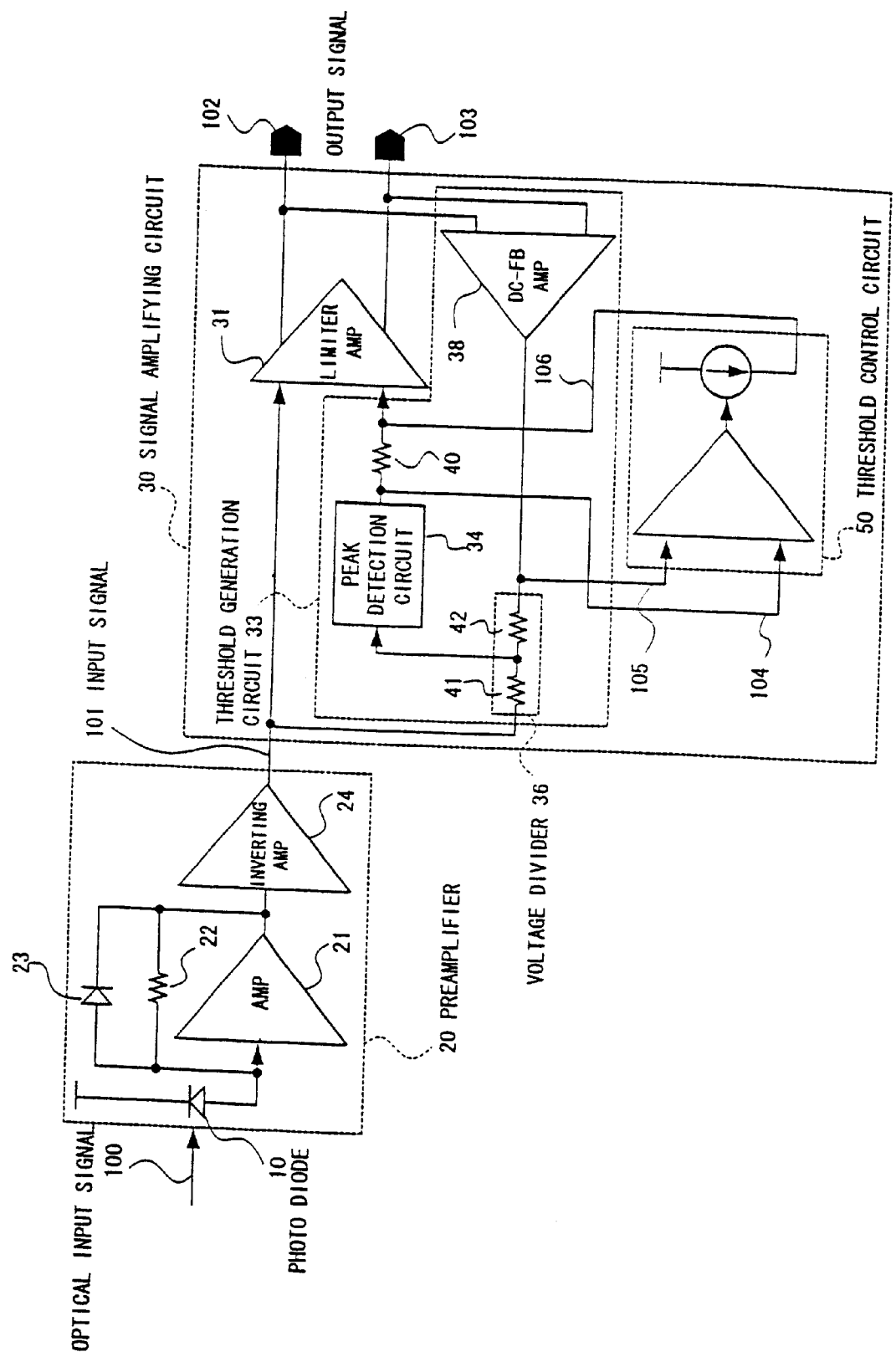
FIG. 17 is a block diagram showing an embodiment (11) of a signal amplifying circuit according to the present invention.

FIG. 17 shows an embodiment (11) of the signal amplifying circuit 30 according to the present invention. While the arrangement of this embodiment is schematically the same as that shown in FIG. 16, the arrangements of the threshold generation circuit 33, the peak detection signal 104, and the bottom detection signal 105 which the threshold control circuit inputs are different.

Namely, the threshold generation circuit 33 is composed of the DC-FB amplifier 38 which inputs the differential output signals 102 and 103 of the limiter amplifier 31 to output the bottom detection signal 105 which is the DC level of the input signal as the reference level, the voltage divider 36 for generating a partial voltage between the bottom detection signal 105 and the input signal 101, the peak detection circuit 34 for detecting the peak level of the partial voltage signal and outputting the peak detection signal 104, and the resistor 40 for transmitting the peak detection signal 104 to the amplifier 31 as the threshold signal 106.

The threshold control circuit 50 inputs the bottom detection signal 105 and the peak detection signal 104 which forms the reference level of the input signal.

In operation, the threshold generation circuit 33 detects the reference level of the input signal 101 at the DCFB amplifier 38 and detects the peak level of a partial voltage signal between the reference level and the input signal 101 to output the peak level as the peak detection signal 104. The peak detection signal 104 is inputted to the amplifier 31 through the resistor 40 as the threshold signal 106.

The threshold control circuit 50 inputs the peak detection signal 104 and the bottom detection signal 105 as the amplitude detection signal, and supplies the output current 106 corresponding to the amplitude of the input signal 101 to the resistor 40 to correct distorted pulse widths of the output signals 102 and 103.

Figure 18:
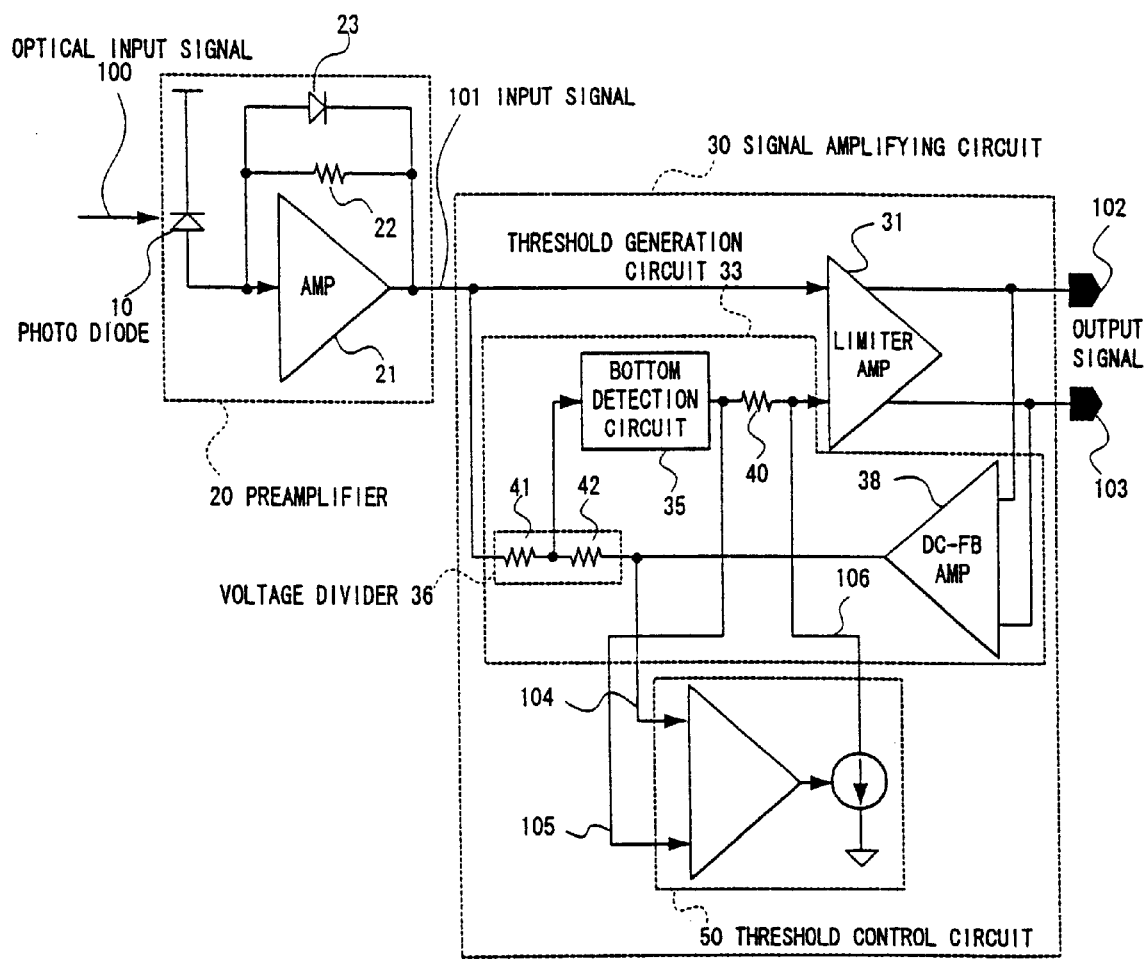
FIG. 18 is a block diagram showing an embodiment (12) of a signal amplifying circuit according to the present invention.

FIG. 18 shows an embodiment (12) of the signal amplifying circuit according to the present invention. This embodiment is the same as that in FIG. 17 except that the inverting amplifier 24 is excluded from the preamplifier 20 and that the threshold generation circuit 33 and the threshold generation circuit 50 have different arrangements.

The threshold generation circuit 33 is composed of the DC-FB amplifier 38 for inputting the differential output signals 102 and 103 of the limiter amplifier 31 and outputting the DC level of the input signal, the voltage divider 36 for outputting the partial voltage signal which generates a partial voltage between the DC level and the input signal 101, the bottom detection circuit 35 for detecting the bottom level of the partial voltage signal and outputting the bottom detection signal 105, and the resistor 40 for transmitting the bottom detection signal 105 to the amplifier 31 as the threshold signal 106. The threshold control circuit 50 is the same as that shown in FIG. 2.

In operation, the threshold generation circuit 33 detects the bottom level of the partial voltage signal between a DC level 104 which is the reference level of the input signal 101 detected at the DCFB amplifier 38 and the input signal 101 as the bottom detection signal 105, which is inputted to the amplifier 31 as the threshold signal 106 through the resistor 40.

The threshold control circuit 50 inputs the bottom detection signal 105 and the DC level signal 104 as the amplitude detection signal, and extracts the output current 106 from the resistor 40 corresponding to the amplitude of the input signal 101 to correct distorted pulse widths of the output signals 102 and 103.

Figure 19:
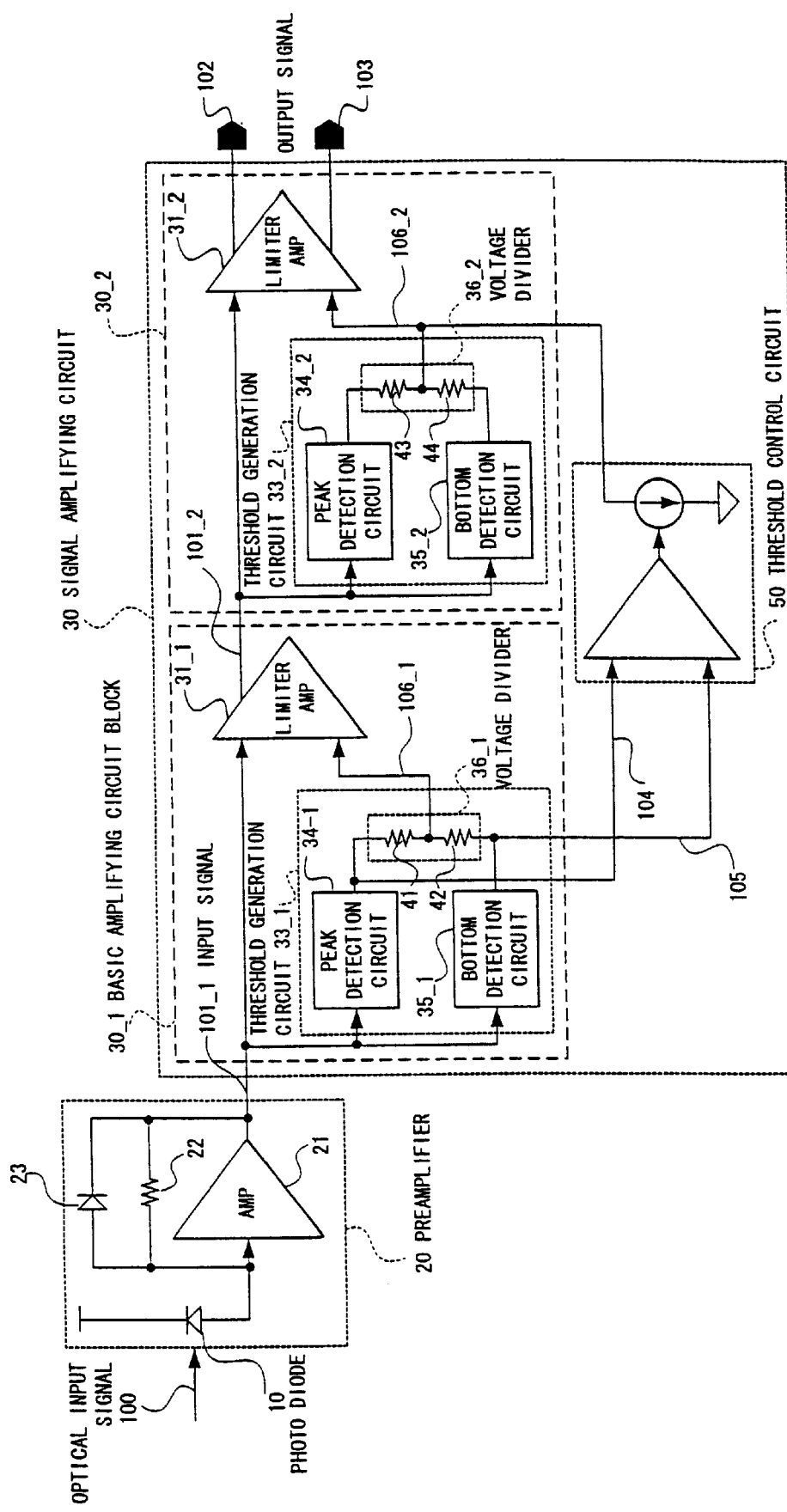
FIG. 19 is a block diagram showing an embodiment (13) of a signal amplifying circuit according to the present invention.

FIG. 19 shows an embodiment (13) of the signal amplifying circuit 30 according to the present invention, in which the arrangement of the preamplifier 20 is the same as that shown in FIG. 2.

The signal amplifying circuit 30 is composed of a basic amplifying circuit block 30_1 for inputting an input signal 101_1 and outputting a signal 101_2, a basic amplifying circuit block 30_2 for inputting the signal 101_2 and outputting the differential output signals 102 and 103, and the threshold control circuit 50 for inputting the peak detection signal 104 and the bottom detection signal 105 from the basic amplifying circuit block 30_1 and providing the basic amplifying circuit block 30_2 with a current output 106_2.

The basic amplifying circuit blocks 30_1 and 30_2 are composed of limiter amplifiers 31_1, 31_2 and the threshold generation circuits 33_1, 33_2 which respectively receive the input signals 101_1 and 101_2, the connection of which is the same as that of the signal amplifying circuit 30 except the threshold control circuit 50 shown in FIG. 2.

The operations of the limiter amplifiers 31_1, 31_2 and the threshold generation circuits 33_1, 33_2 are the same as those of the limiter amplifier 31 and the threshold generation circuit 33 in FIG. 2.

The threshold control circuit 50 receives the amplitude of the input signal 101_1 based on the difference between the peak detection signal 104 and the bottom detection signal 105 inputted from the threshold generation circuit 33_1 of the basic amplifying circuit block 30_1 at the first stage, and controls, based on the amplitude, the threshold signal 106_2 of the threshold generation circuit 33_2 of the basic amplifying circuit block 30_2 at the latter stage to correct distorted pulse widths of the output signals 102 and 103.

In such a signal amplifying circuit 30 in which the threshold generation circuits are connected in a multistage form, the threshold generation circuit 33_2 at the next stage absorbs the variation of the output signal 101_2 caused by an offset or the like of the basic amplifying circuit block 30_1 at the first stage, reduces the influences, and suppresses the deterioration of the pulse widths in the output signals 102 and 103 of the signal amplifying circuit 30 due to the offset.

As a result, it becomes possible for the threshold control circuit 50 to normally correct the distorted pulse width by the feedforward control at a high speed for the minute input signal 101_1 in which the influence of the offset can not be disregarded.

Figure 20:
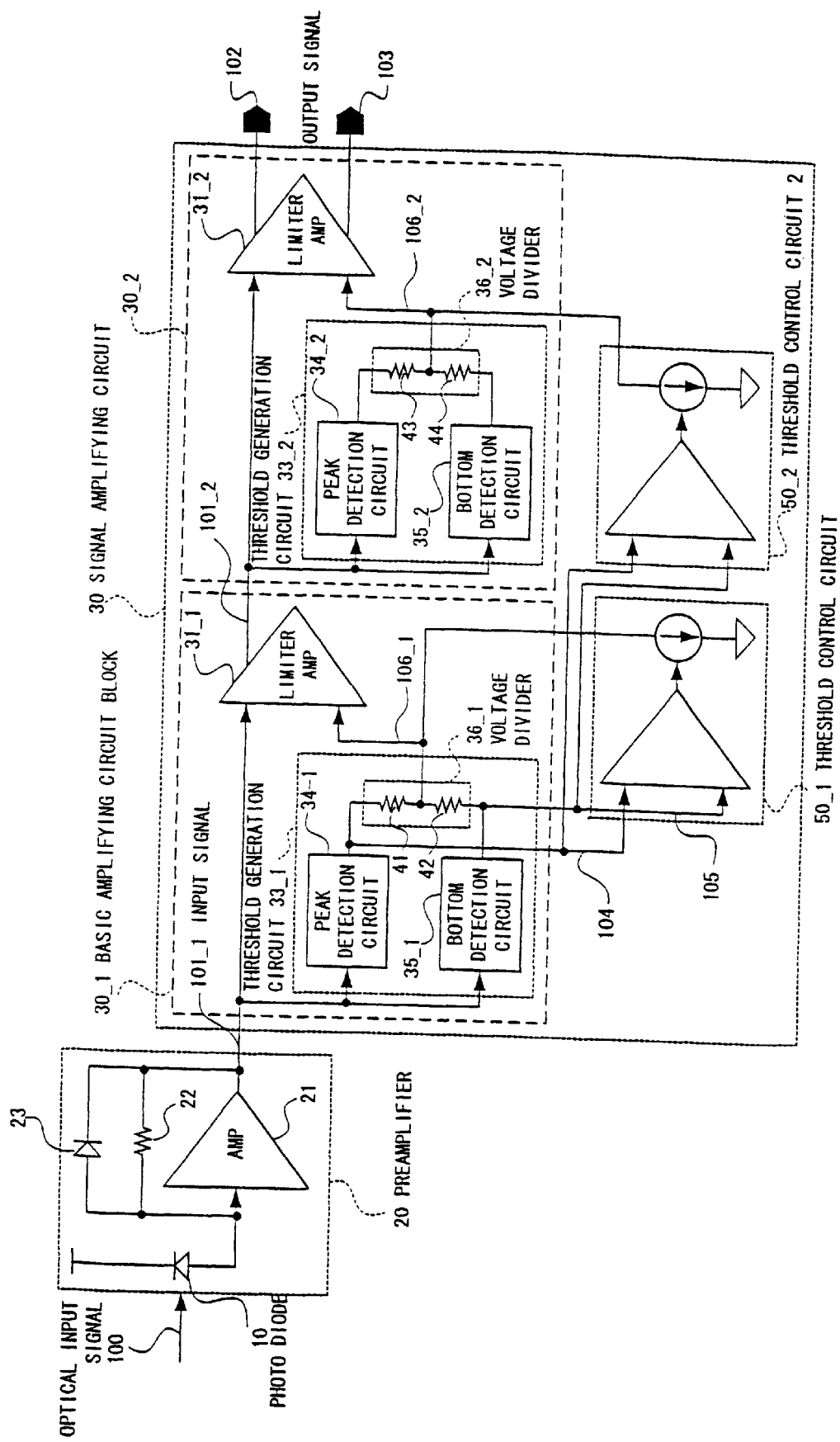
FIG. 20 is a block diagram showing an embodiment (14) of a signal amplifying circuit according to the present invention.

FIG. 20 shows an embodiment (14) of the signal amplifying circuit 30 according to the present invention in which the basic arrangement is the same as that of the embodiment (13) in FIG. 19.

However, the signal amplifying circuit 30, different from the embodiment (13), has two threshold control circuits 50_1 and 50_2 which input the peak detection signal 104 and the bottom detection signal 105 at the first stage. The threshold control circuit 50_1 controls a threshold signal 106_1 of the basic amplifying circuit block 30_1 at the first stage, while the threshold control circuit 50_2 controls the threshold signal 106_2 of the basic amplifying circuit block 30_2 at the latter stage.

In operation, the threshold control circuits 50_1 and 50_2 respectively control the threshold signals 106_1 and 106_2 of the limiter amplifiers 31_1 and 31_2. Namely, since two threshold control circuits 50_1 and 50_2 control the pulse widths of the output signals 102 and 103, distorted pulse widths of the input signal 101 can be corrected more precisely compared with the control using only a single threshold control circuit.

Figure 21:
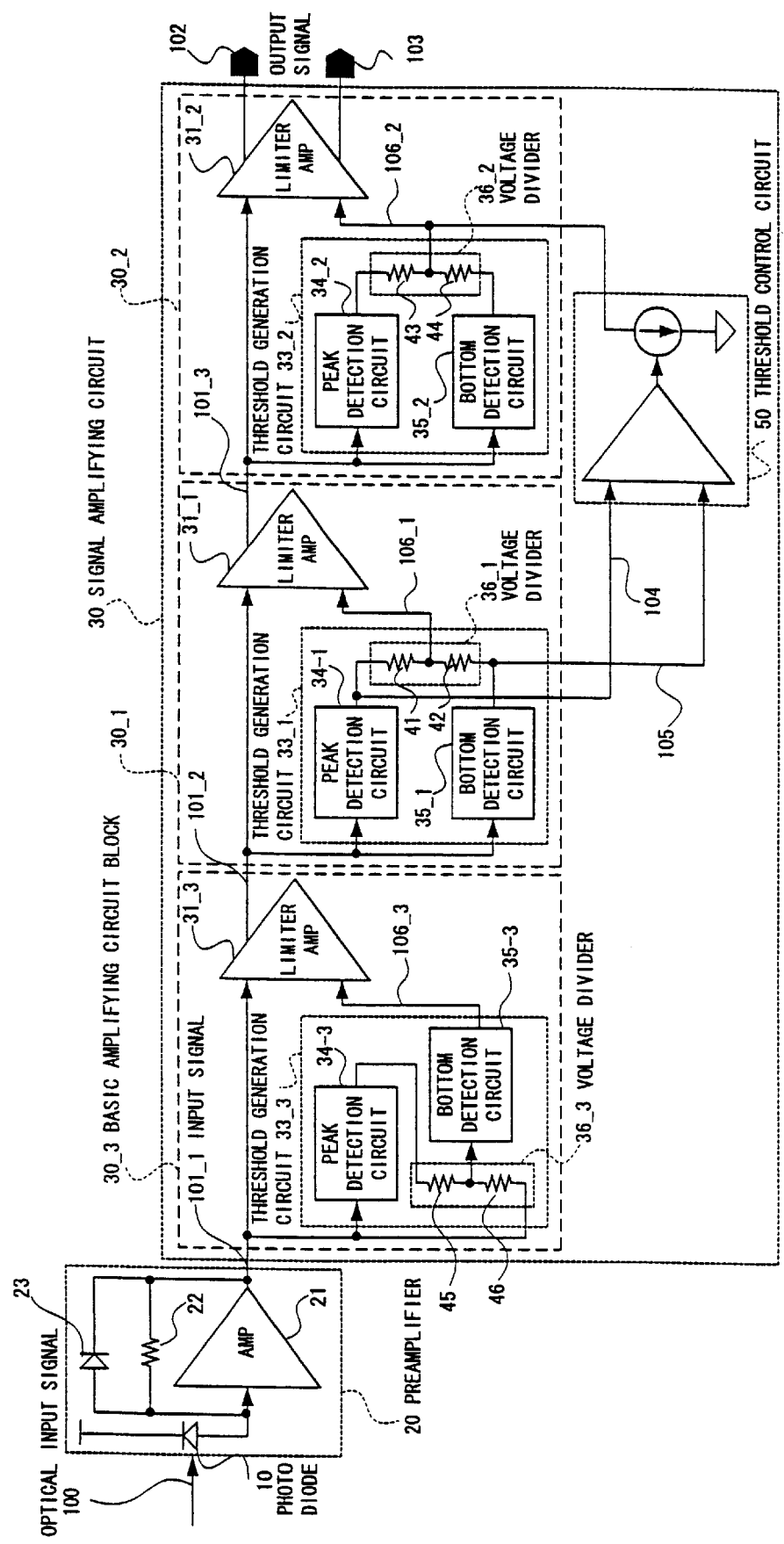
FIG. 21 is a block diagram showing an embodiment (15) of a signal amplifying circuit according to the present invention.

FIG. 21 shows an embodiment (15) of the signal amplifying circuit 30 according to the present invention, in which a basic amplifying circuit block 30_3 is inserted at the former stage of the basic amplifying circuit blocks 30_1 and 30_2 of the embodiment (13) in FIG. 19.

In the basic amplifying circuit block 30_3, only the arrangement of a threshold generation circuit 33_3 is different from that of the following basic amplifying circuit blocks 30_1 and 30_2. The threshold generation circuit 33_3 is composed of a peak detection circuit 34_4 for detecting the peak of the input signal 101_1 and outputting a peak detection signal, a voltage divider 36_3 for generating the partial voltage between the peak detection signal and the input signal 101_1 and outputting a partial voltage signal, and a bottom detection circuit 35_3 for detecting the bottom level of the partial voltage signal and outputting the same as a threshold signal 106_3.

The signal amplifying circuit 30 can be applied when the control initiation level V1 (see FIG. 1A) is so small that the influence of the offset or the like can not be disregarded. Namely, the basic amplifying circuit block 30_3 at the first stage amplifies the input signal 101_1 to relatively increase the control initiation level V1 and to operate so as to remove the offset from the threshold generation circuit 33_3.

In the basic amplifying circuit blocks 30_1 and 30_2 at the latter stage, the threshold control circuit 50 controls the current output 106_2 based on the amplitude of the input signal 101_2 which indicates a difference in level between the peak detection signal 104 and the bottom detection signal 105 and on the control initiation level V1 to correct the distorted pulse widths.

Namely, when the control initiation level V1 (see FIG. 1A) is so small that the influence of the offset or the like of a limiter amplifier 31_3 at the first stage can not be disregarded, the controllability for the pulse width correction is improved.

Figure 22:
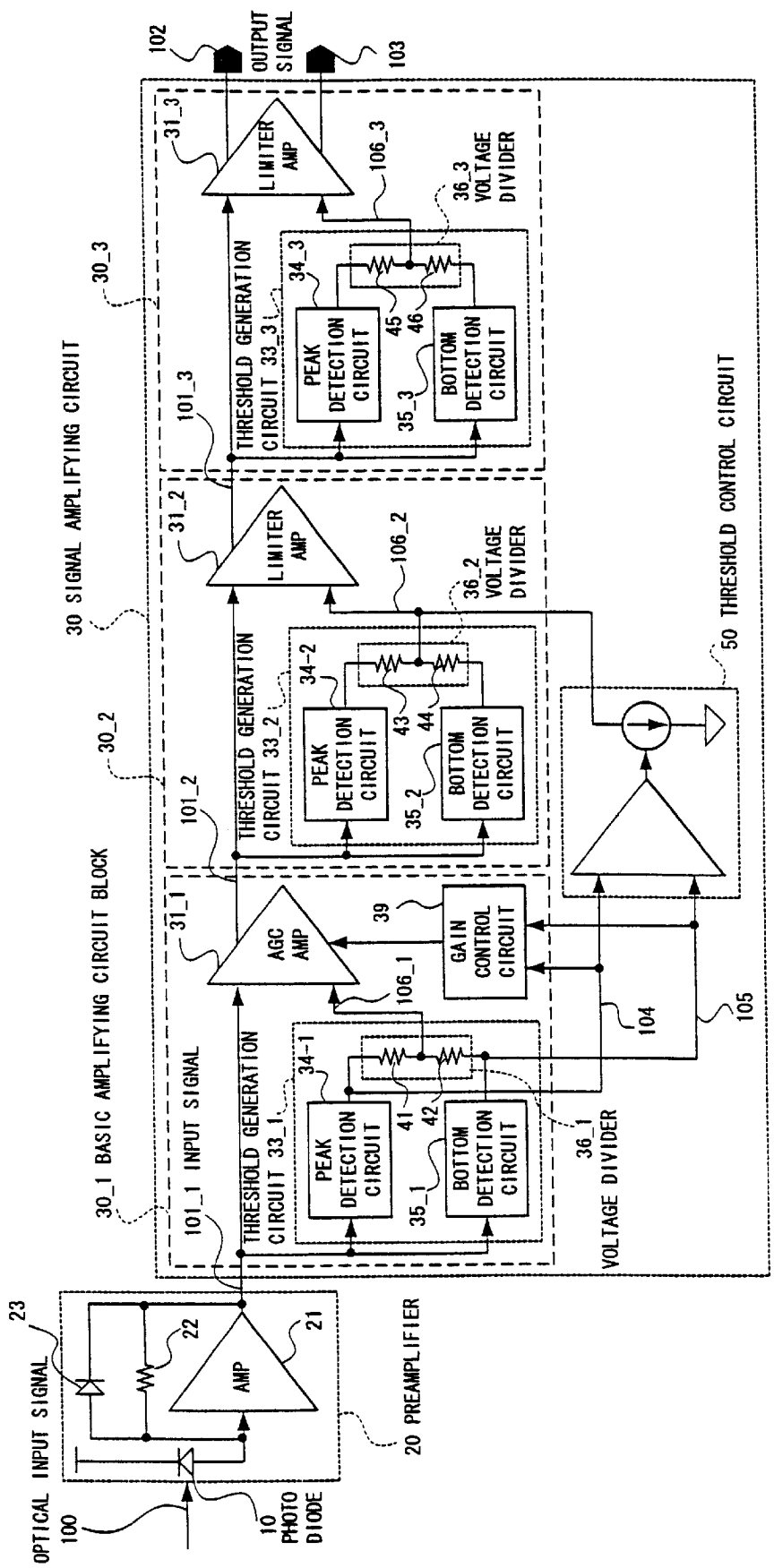
FIG. 22 is a block diagram showing an embodiment (16) of a signal amplifying circuit according to the present invention.

FIG. 22 shows an embodiment (16) of the signal amplifying circuit 30 according to the present invention in which the signal amplifying circuit 30 is composed of three basic amplifying circuit blocks 30_1, 30_2, and 30_3 connected in a multistage form, as well as the threshold control circuit 50. In the signal amplifying circuit 30, the basic amplifying circuit block 30_3 which is the same as the basic amplifying circuit block 30_2 is connected at the latter stage of the two basic amplifying circuit blocks 30_1 and 30_2 connected in a multistage form shown in FIG. 19.

Also, the signal amplifying circuit 30 in FIG. 22 is the same as that shown in FIG. 19 except that the amplifier 31_1 of the basic amplifying circuit block 30_1 at the first stage forms an AGC amplifier together with a gain control circuit 39 for inputting the peak detection signal 104 and the bottom detection signal 105 to control the gain of the AGC amplifier 31_1.

In operation, the gain control circuit 39 detects the amplitude of the input signal 101_1 based on the level difference between the peak detection signal 104 and the bottom detection signal 105 and controls the gain in the form of feedforward so that the AGC amplifier 31_1 performs a linear operation. The AGC amplifier 31_1, different from the limiter amplifier whose output signal is saturated, can suppress the distortion or deterioration of the pulse width by the linear operation even when the input signal 101_1 is large. Accordingly, an offset removal effect in the threshold generation circuits 33_1, 33_2, and 33_3 connected in the multistage form is improved.

As a result, it is possible for the signal amplifying circuit 30 to further reduce the deterioration of the pulse width even when the input signal 101_1 is large or is so small that the influence of the offset can not be disregarded.

Figure 23:
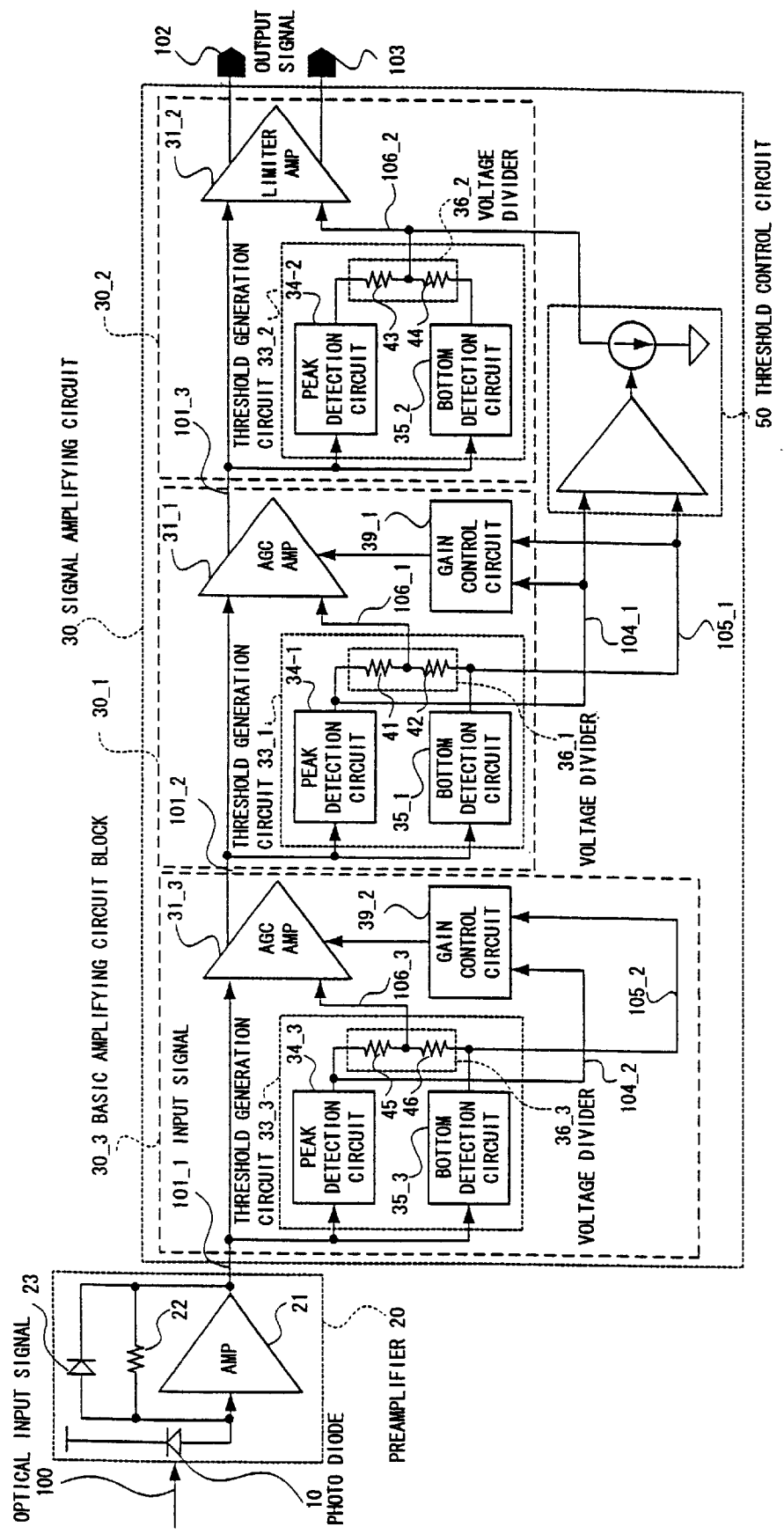
FIG. 23 is a block diagram showing an embodiment (17) of a signal amplifying circuit according to the present invention.

FIG. 23 shows an embodiment (17) of the signal amplifying circuit 30 according to the present invention, in which the basic amplifying circuit block 30_3 at the third stage of the embodiment (16) in FIG. 22 is inserted between the preamplifier 20 and the basic amplifying circuit block 30_1 at the first stage. Also, a gain control circuit 39_2 is added to the amplifier 31_3 of the basic amplifying circuit block 30_3 to form the AGC amplifier.

In operation, the AGC amplifier 31_3 at the first stage provides the basic amplifying circuit block 30_1 at the second stage with the signal 101_2 corresponding to the input signal 101_1 as linearly amplified. The basic amplifying circuit blocks 30_1 and 30_2 detect the amplitude of the signal 101_2 to perform the AGC amplification and the threshold control. In this way, the amplitude detection signal performing the threshold control and the AGC control can be generated not only at the circuit at the first stage but also at the basic amplifying circuit block at the second and the following stages.

It is to be noted that in the above-mentioned embodiments (1)–(17) of the signal amplifying circuit 30 the logic values of the input signal 101 to the signal amplifying circuit 30 are negative as for the embodiments (3), (5), (9), (10) and (11), and are positive as for the other embodiments. However, it is possible for each signal amplifying circuit 30 to deal with the input signal 101 of the opposite logic by inverting the polarity of the amplifier 31, the threshold generation circuit 33, and the threshold control circuit 50.

Also, in the above-mentioned embodiments, the preamplifier 20 having the non-linear transfer characteristic which inputs the high-speed burst optical signal 100 has been exemplified as the transfer circuit at the former stage of the signal amplifying circuit 30, while any transfer circuit can be applied as far as the non-linear transfer characteristic of the transfer circuit at the former stage is preliminarily known.

For instance, a preamplifier which makes a dynamic range large with means except the feedback resistor and the diode is similarly known to indicate the tendency of the pulse width deterioration, so that the signal amplifying circuit 30 of the present invention can be applied to such a preamplifier. Also, the signal amplifying circuit 30 of the present invention can be applied to a signal interface circuit except an optical receiving circuit where the relationship between the amplitude of the input signal and the variation of the pulse width is known. Furthermore, even when the input signal 101 is a continuous signal and the dynamic range is not large, it is a matter of course that the signal amplifying circuit 30 can be applied.

FIGS. 24–28 show embodiments of the threshold control circuits 50, 50_1, 50_2 (hereinafter generally referred to as "50") shown in FIGS. 2, 5, 10, 12, 13, 14, and 18–23. Being a current sink type, the current output 106 of the threshold control circuit 50 can be employed as a current source of the current output 106 shown in FIG. 16 by inverting the circuit polarity. This is also applied to the threshold control circuit 50 shown in FIG. 4.

Also, since the threshold control circuit 50 having such an arrangement, as described in FIG. 4, controls the threshold signal 106 in the form of feedforward with the current output 106 by using the amplitude detection signal of the input signal 101 that is the level difference between the peak detection signal and the bottom detection signal, the signal amplifying circuit 30 can perform the correction for the pulse width at a high speed.

Figure 24:
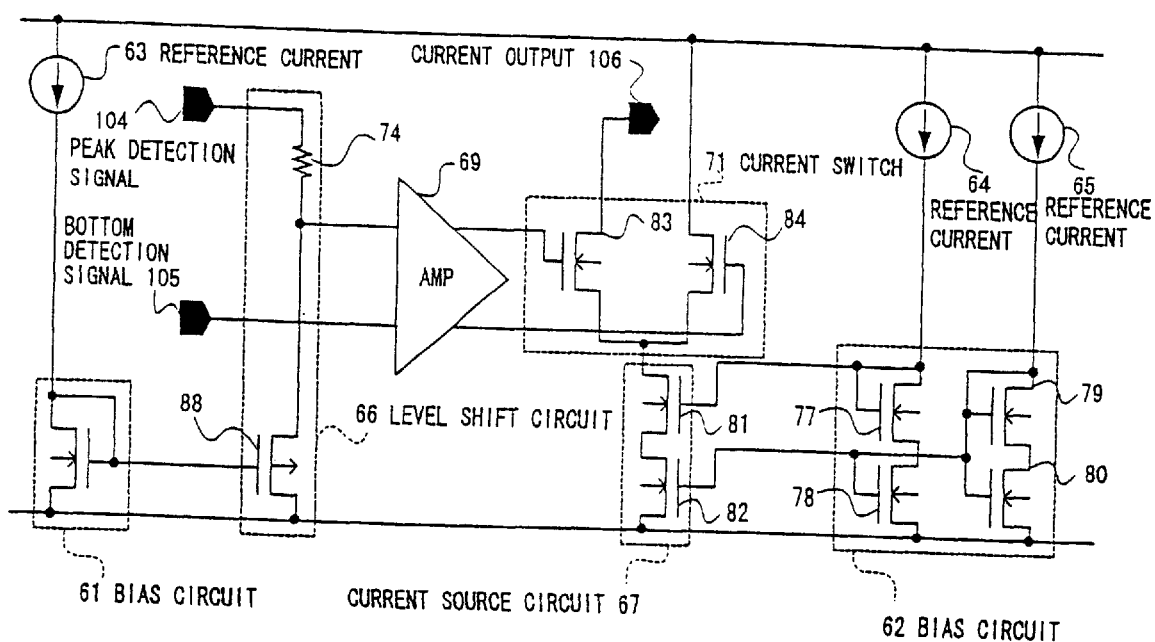
FIG. 24 is a block diagram showing an embodiment (3) of a threshold control circuit in a signal amplifying circuit according to the present invention.

FIG. 24 shows an embodiment (4) of the threshold control circuit 50. The basic arrangement of the threshold control circuit 50 is the same as that shown in FIG. 9 except that the current switch 71 is composed of only a pair of NMOS type differential transistors 83 and 84. The differential output signals of the amplifier 69 are respectively inputted to the gates of the transistors 83 and 84 to control the current flowing therethrough. The transistor 83 then provides the current output 106.

Delaying the switchover operation, a pair of differential transistors reduce noises due to a logical comparing operation in the amplifier 69 with an analog operation. Also, using the cascode current source circuit 67, a pair of differential transistors can control the current with a low operation voltage and a high precision. It is to be noted that the pre-stage amplifier 69 of the current switch 71 makes the DC level and the switchover gain of the transistors 83 and 84 coincide with each other, so that it is not always necessary.

Figure 25:
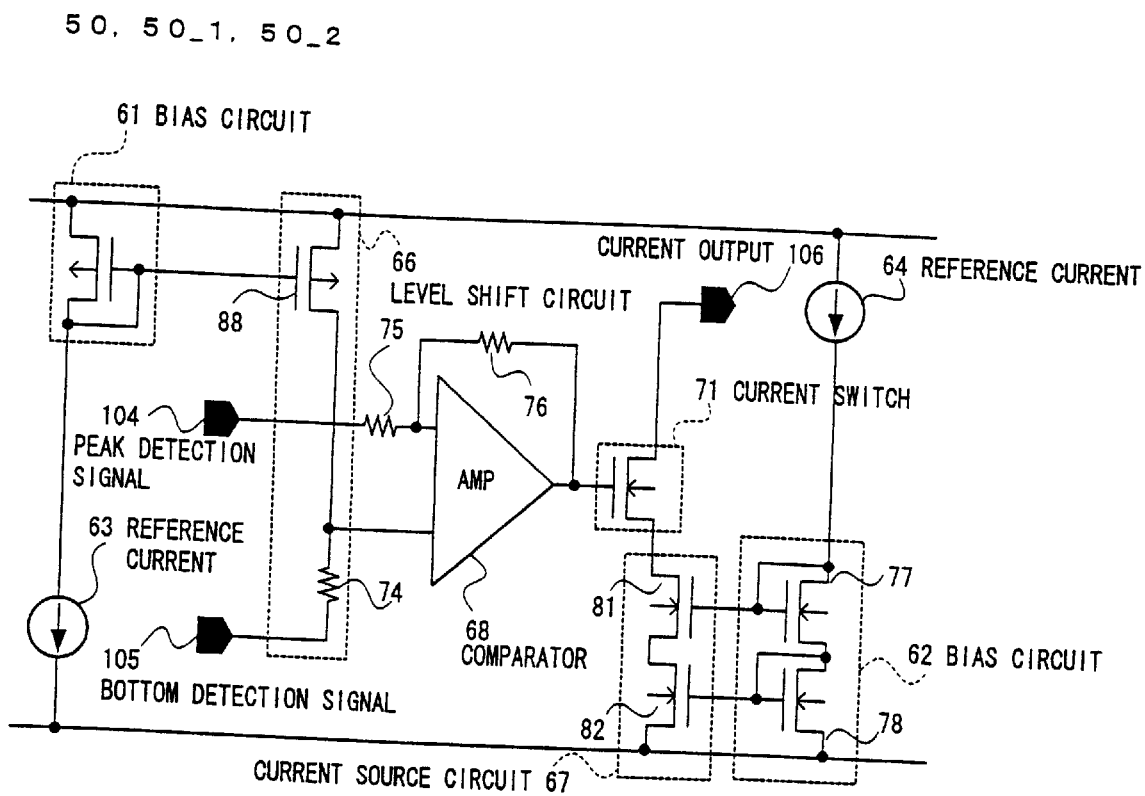
FIG. 25 is a block diagram showing an embodiment (4) of a threshold control circuit in a signal amplifying circuit according to the present invention.

FIG. 25 shows an embodiment (5) of the threshold control circuit 50. The basic arrangement of the threshold control circuit 50 is the same as that in FIG. 4, however, is different in that the peak detection signal 104 is inputted to the input terminal of the amplifier (comparator) 68 through an input resistor 75 so that the output signal of the amplifier 68 is supplied to the input terminal in the form of positive-feedback through a resistor 76 to provide the amplifier 68 with a hysteresis.

Additionally, it is different from the threshold control circuit 50 in FIG. 4 in that the current source circuit 67 and the bias circuit 62 are composed of the transistors 81, 82 and the transistors 77, 78 which are respectively connected in cascade, and form a cascode current source circuit that is a current mirror circuit arrangement together with the reference current 64.

In operation, when the amplitude of the input signal 101_1 is in the vicinity of the control initiation level V1 (see FIG. 1A) that is a switchover level, the comparator 68 does not output an unstable signal due to the noise. Also, being the cascode current source circuit, the current source circuit 67 can control the current with a high precision.

Figure 26:
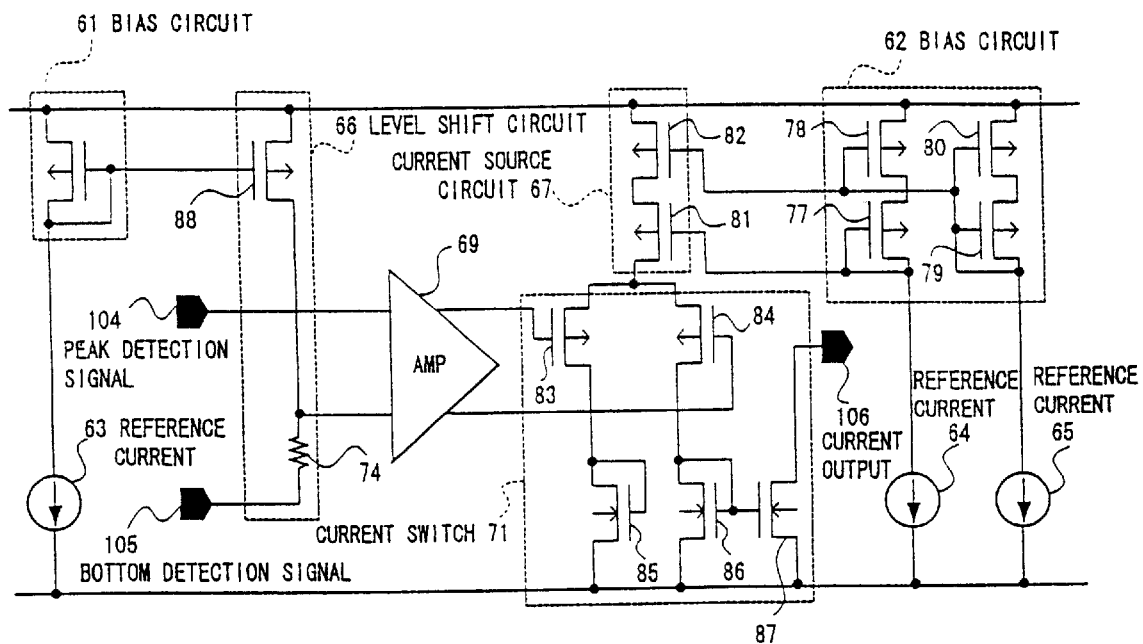
FIG. 26 is a block diagram showing an embodiment (5) of a threshold control circuit in a signal amplifying circuit according to the present invention.

FIG. 26 shows an embodiment (6) of the threshold control circuit 50. This embodiment is only different from that in FIG. 9 in that the polarity of the threshold control circuit 50 is inverted, so that the current output 106 forms a current sink.

Figure 27:
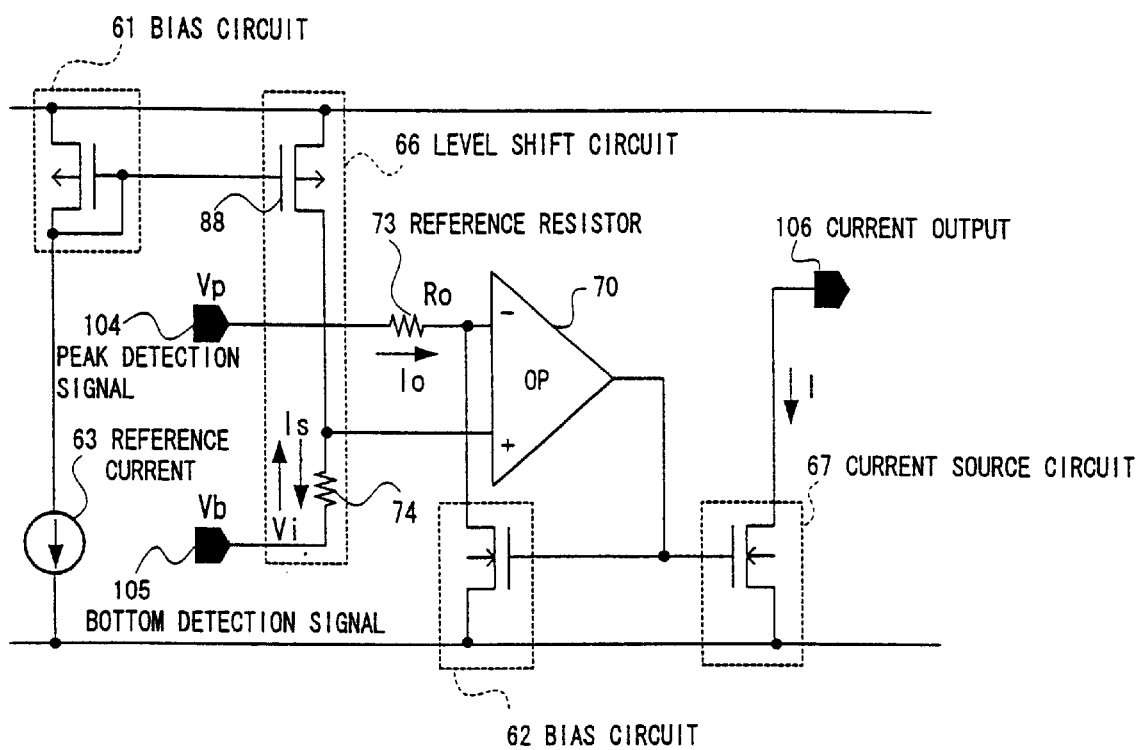
FIG. 27 is a block diagram showing an embodiment (6) of a threshold control circuit in a signal amplifying circuit according to the present invention.

FIG. 27 shows an embodiment (7) of the threshold control circuit 50 which is composed of the level shift circuit 66 for shifting the bottom detection signal 105, a reference resistor 73 whose one end is connected to the peak detection signal 104 and whose resistance is R0, an operational amplifier 70 connected to the other end of the reference resistor 73 and the output of the level shift circuit 66, the bias circuit 62 for providing the output signal of the operational amplifier 70 to one input terminal thereof in the form of negative-feedback, and the current source circuit 67 for forming a current mirror circuit together with the operational amplifier 70 and the bias circuit 62 and being driven by the output signal of the operational amplifier 70.

Furthermore, the threshold control circuit 50 includes the bias circuit 61 for forming a current mirror circuit together with the level shift circuit 66 to flow the reference current 63. In addition, the level shift circuit 66 is composed of the transistor 88 and the resistor 74 connected in series.

In operation, a current Is proportional to the reference current 63 flows through the resistor 74. The value of the resistor 74 is preset to generate the same voltage as the control initiation level V1 (see FIG. 1A) when the current Is flows. Accordingly, the level of the non-inversion input terminal in the operational amplifier 70 assumes a level (Vb+V1) which is a level Vb of the bottom detection signal 105 raised by the level V1. A level Vp of the peak detection signal 104 is given to the inversion input terminal of the operational amplifier 70 through the reference resistor 73.

The amplitude of the input signal 101, that is the level difference (Vp−Vb) between the level Vp of the peak detection signal 104 and the level Vp of the bottom detection signal 105 is represented by Vi. In case of the amplitude Vi≦V1, the current I0 which flows through the reference resistor 73 becomes 0, the sink current I of the current output 106 becomes 0, meaning that the current does not flow. In case of Vi>V1, the current I0 which flows through the reference resistor 73 becomes (Vi−V1)/R0, so that the sink current I of the current output 106 becomes the current proportional to (Vi−V1).

Namely, when the amplitude Vi of the input signal 101 is equal to or larger than the control initiation level V1, it becomes possible for the threshold control circuit 50 to change the current output 106 in accordance with the amplitude of the input signal 101, and to perform a minute current control in comparison with the other threshold control circuits 50.

Figure 28:
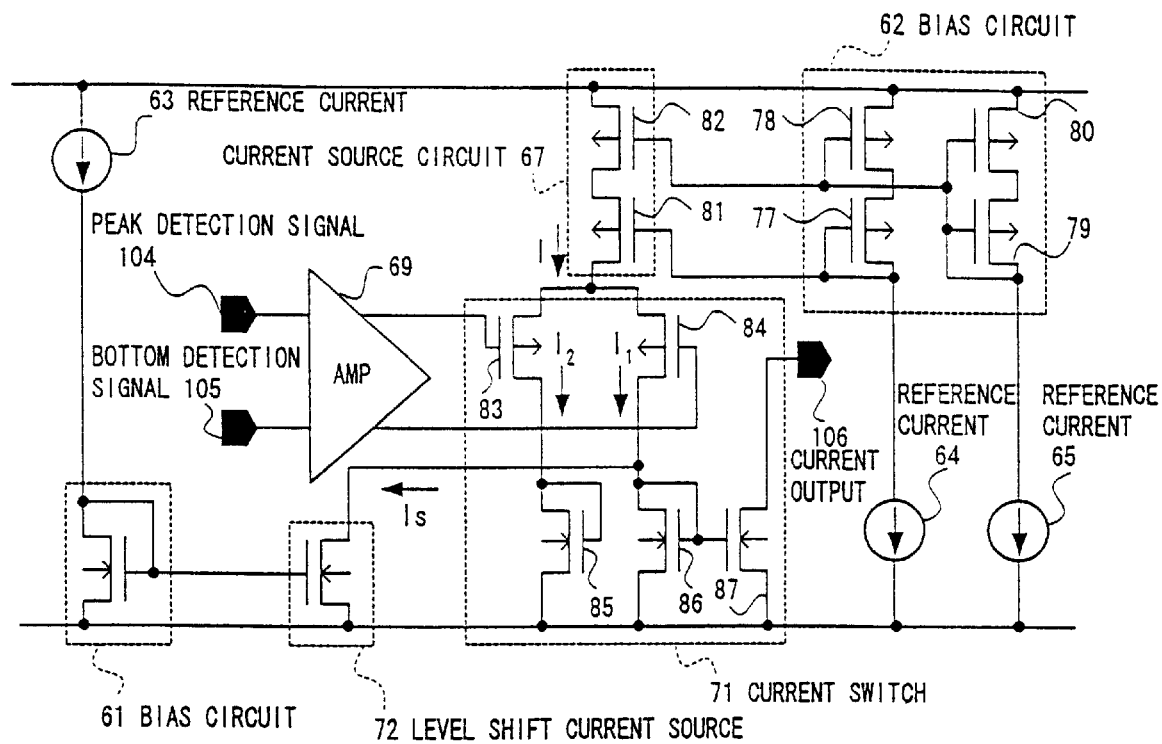
FIG. 28 is a block diagram showing an embodiment (7) of a threshold control circuit in a signal amplifying circuit according to the present invention.

FIG. 28 shows an embodiment (8) of the threshold control circuit 50. The basic arrangement of this threshold control circuit 50 is the same as that in FIG. 26. Different points are that the bottom detection signal 105 is directly connected to the input terminal of the amplifier 69, the level shift circuit 66 is excluded, and a current mirror circuit which provides the sink current proportional to the reference current 63 is composed of the level shift current source 72 and the bias circuit 61 whose polarity is inverted so that the output terminal of the current mirror circuit is connected to the source of the transistor 84.

In operation, the differential output signal of the amplifier 69 flows currents I1 and I2 respectively through the differential transistors 83 and 84 based on the level difference, that is the amplitude of the input signal 101, between the peak detection signal 104 and the bottom detection signal 105. The sum of the currents I1 and I2 corresponds to a source current I having a constant value from the current source circuit 67.

On the other hand, the level shift current source 72 sinks the current Is proportional to the reference current 63. Accordingly, in case of the current value I1>Is, the current of the transistor 86 becomes I1−Is, so that the current proportional to the current value flows through the current output 106. Accordingly, the control initiation level V1 (see FIG. 1A) can be determined by the current Is of the level shift current source 72.

It is to be noted that while in the above-mentioned embodiments (1)–(8) of the threshold control circuit 50, the threshold control circuit 50 is composed of an MOS transistor, the same arrangement can also be realized by using a bipolar transistor and the like.

Figure 29:
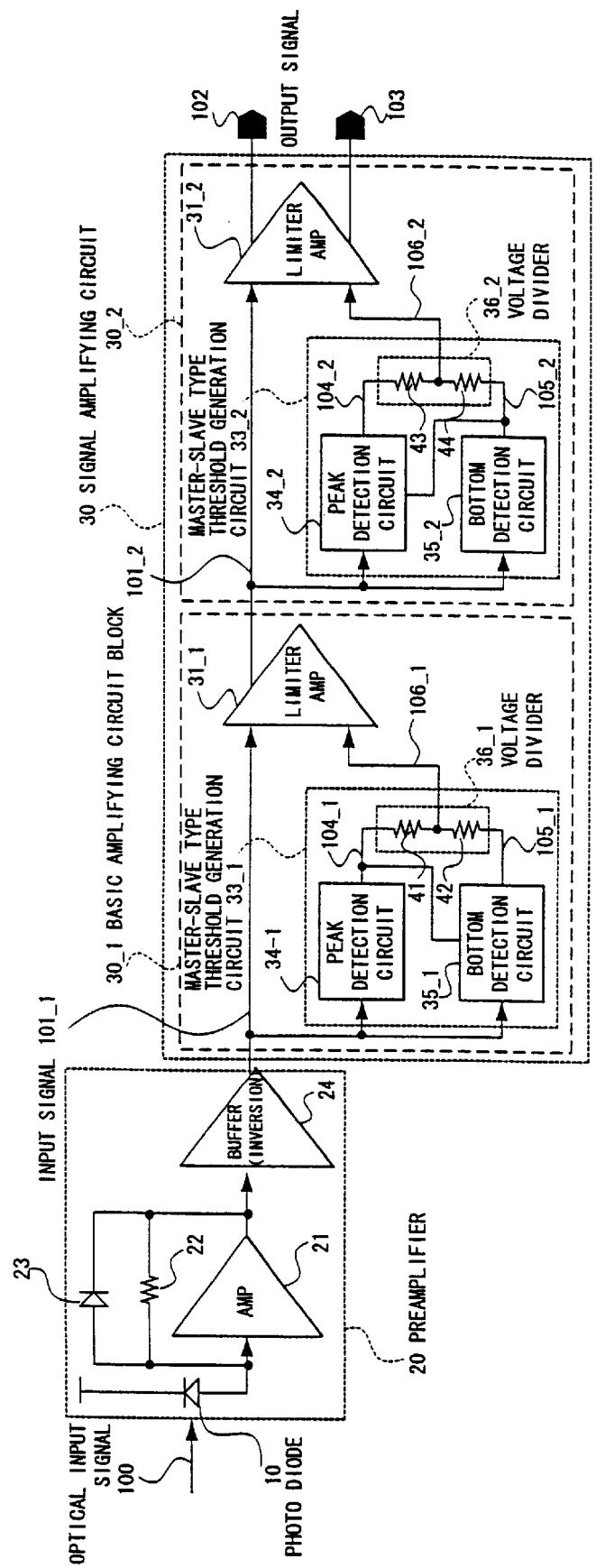
FIG. 29 is a block diagram showing an embodiment (18) of a signal amplifying circuit according to the present invention.

FIG. 29 shows an embodiment (18) of the signal amplifying circuit 30 according to the present invention. This embodiment simultaneously solves the problems due to a tailed waveform and a "0" level rise by such an optical extinction ratio deterioration. The basic arrangement of the signal amplifying circuit 30 is the same as that of the embodiment (13) shown in FIG. 19, however, is different in that the threshold generation circuits 33_1 and 33_2 are respectively the peak master-slave type threshold generation circuit and the bottom master-slave type threshold generation circuit and the threshold control circuit 50 is excluded.

Although an inversion buffer 24 is inserted into the output side of the preamplifier 20, different from the embodiment in FIG. 19, the waveform of the input signal 101_1 is essentially the same as that of the embodiment (13) except for the peak level and bottom level of the input signal 101_1 being inverted.

Figure 30A:
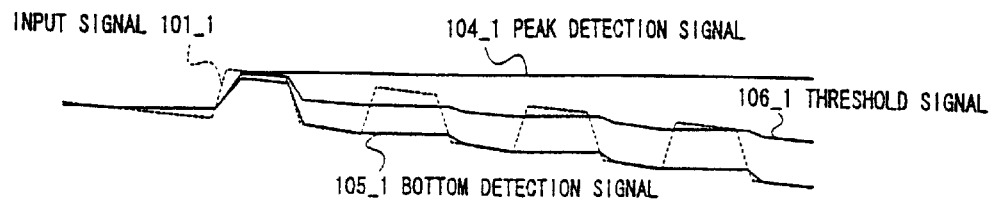
FIGS. 30A, 30B, 30C, 30D, 30E and 30F are graphs showing operation waveform examples of an embodiment (18) of a signal amplifying circuit according to the present invention.

FIGS. 30A–30F show operation waveform examples of the embodiment (18). FIG. 30A shows an operation waveform example of the master-slave type threshold generation circuit 33_1 in which the input signal 101_1 of a small signal having the tailed waveform, a peak detection signal 104_1 indicating the peak level of the input signal 101_1, a bottom detection signal 105_1 indicating the relative bottom level of the input signal 101_1 to the peak detection signal 104_1, and the threshold signal 106_1 indicating the intermediate level between the peak detection signal 104_1 and the bottom detection signal 105_1 are shown.

Figure 30B:
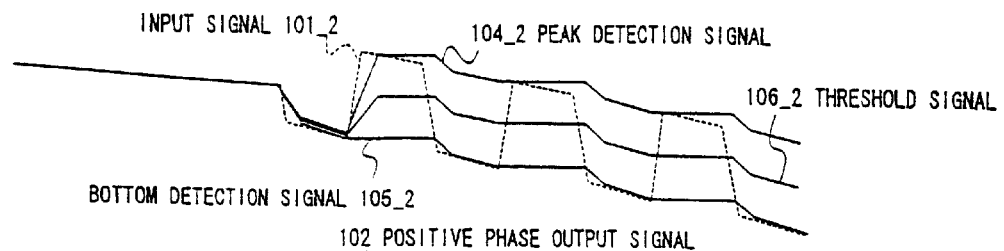

The limiter amplifier 31_1 is designed to differentially and linearly amplify the threshold signal 106_1 and the small input signal 101_1 to output the input signal 101_2 having the tailed waveform of FIG. 30B. FIG. 30B shows an operation waveform example of the threshold generation circuit 33_2, in which the bottom detection signal 105_2 indicates the bottom level of the input signal 101_2, the peak detection signal 104_2 indicates the relative peak level of the input signal 101_2 to the bottom detection signal 105_2, and the threshold signal 106_2 indicates the intermediate level between the bottom detection signal 105_2 and the peak detection signal 104_2.

Figure 30C:
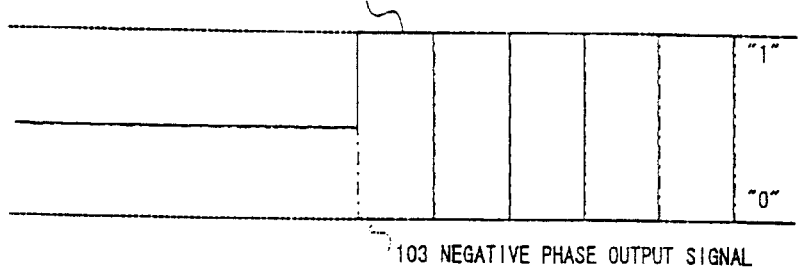

Since the peak detection signal 104_2 falls following the peak level of the input signal 101_2, the threshold signal 106_2 is set to the intermediate level of the input signal 101_2 in spite of the tailed waveform of the input signal 101_2. Accordingly, the output signals 102 and 103 of the limiter amplifier 31_2 assumes the waveform of the input signal 101_1 accurately reproduced as shown in FIG. 30C.

Figure 30D:
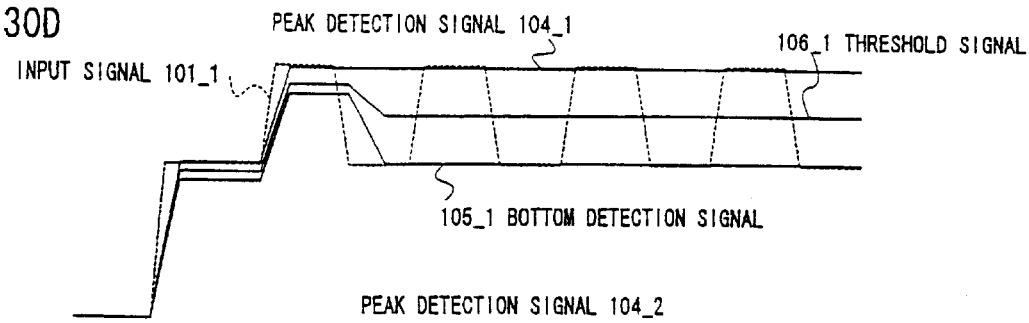

FIG. 30D shows an operation waveform example of the master-slave type threshold generation circuit 33_1 when inputting the input signal 101_1 of a large signal whose "0" level (bottom level) is raised. The peak detection signal 104_1 indicates the peak level of the input signal 101_1, the bottom detection signal 105_1 indicates the relative bottom level to the peak detection signal 104_1 of the input signal 101_1, and the threshold signal 106_1 indicates the intermediate level between the peak detection signal 104_1 and the bottom detection signal 105_1.

Figure 30E:
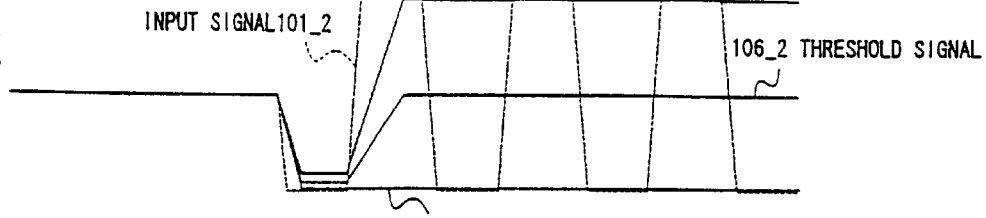
Figure 30F:
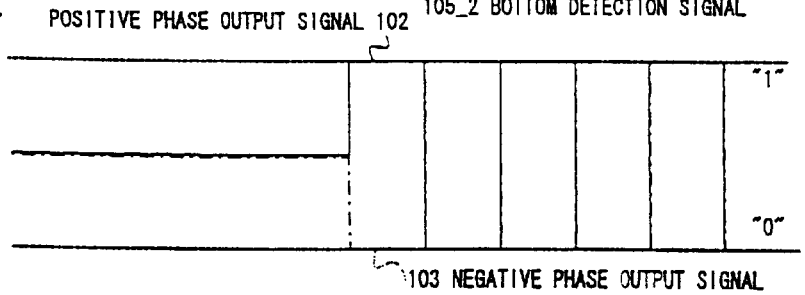

Since the threshold signal 106_1 is set to the intermediate level of the input signal 101_1 in spite of the "0" level rise of the input signal 101_1, the limiter amplifier 31_1 reproduces the input signal 101_1 as the appropriate input signal 101_2 shown in FIG. 30E. FIG. 30E shows an operation waveform example of the threshold generation circuit 33_2 in which the bottom detection signal 105_2 indicates the bottom level of the input signal 101_2, the peak detection signal 104_2 indicates the relative peak level to the bottom detection signal 105_2 of the input signal 101_2, so that the threshold signal 106_2 is set to the intermediate level between the detection signals 104_2 and 105_2. Accordingly, the limiter amplifier 31_2 accurately reproduces the input signal 101_1 as the output signals 102 and 103 as shown in FIG. 30F.

Figure 31:
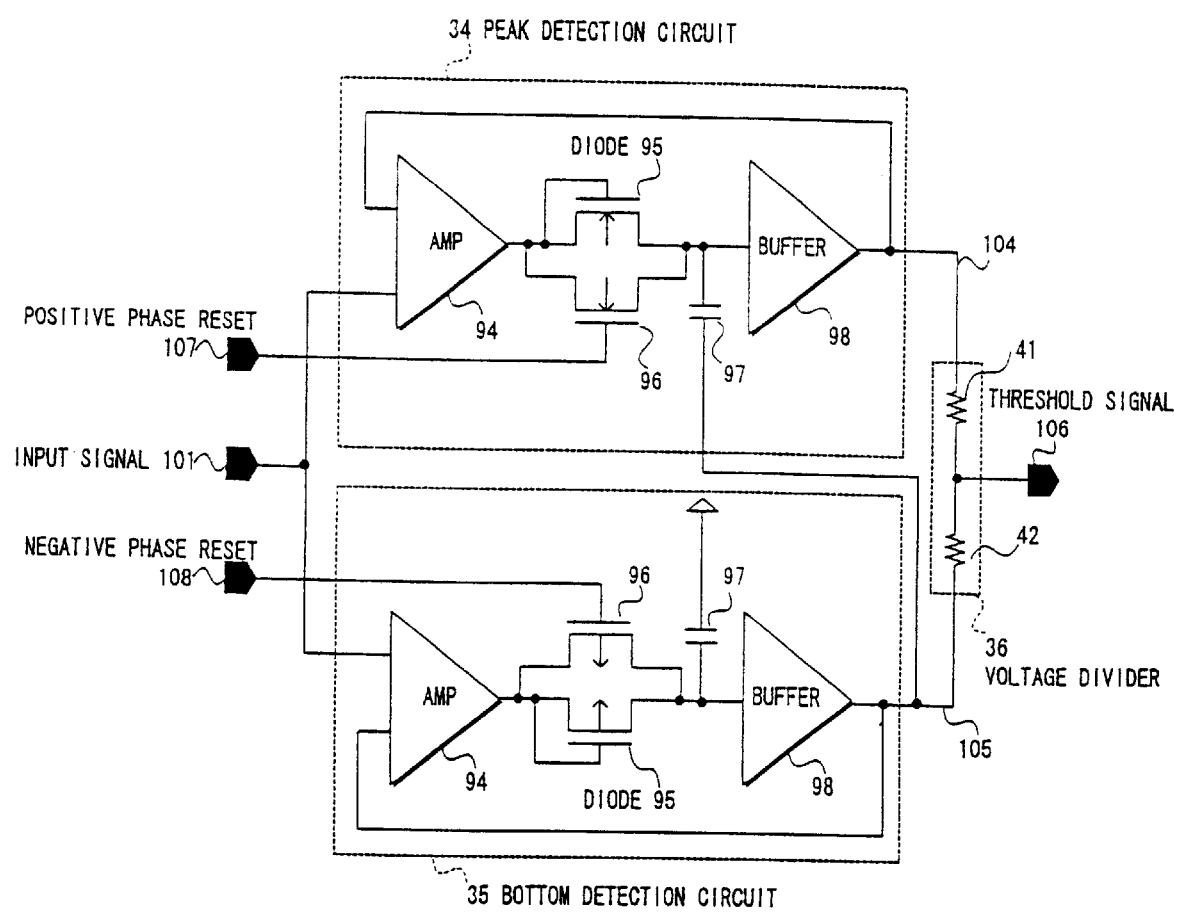
FIG. 31 is a block diagram showing an embodiment (2) of a master-slave type threshold generation circuit in a signal amplifying circuit according to the present invention.

FIG. 31 shows an embodiment (2) of the master-slave type threshold generation circuit, and especially of the bottom master-slave type threshold generation circuit. The basic arrangement of the threshold generation circuit is the same as that of the peak master-slave type threshold generation circuit shown in FIG. 6, however, is different in that the reference level terminal of the capacitor 97 of the peak detection circuit 34 is connected to the bottom detection signal 105 which is the output of the bottom detection circuit 35, and the capacitor 97 of the bottom detection circuit 35 is grounded.

In operation, the only difference from the threshold generation circuit in FIG. 6 is that the capacitor 97 of the bottom detection circuit 35 holds an absolute bottom level of the input signal 101 so that the capacitor 97 of the peak detection circuit 34 holds the relative peak level of the input signal 101 to the bottom level.

Figure 32:
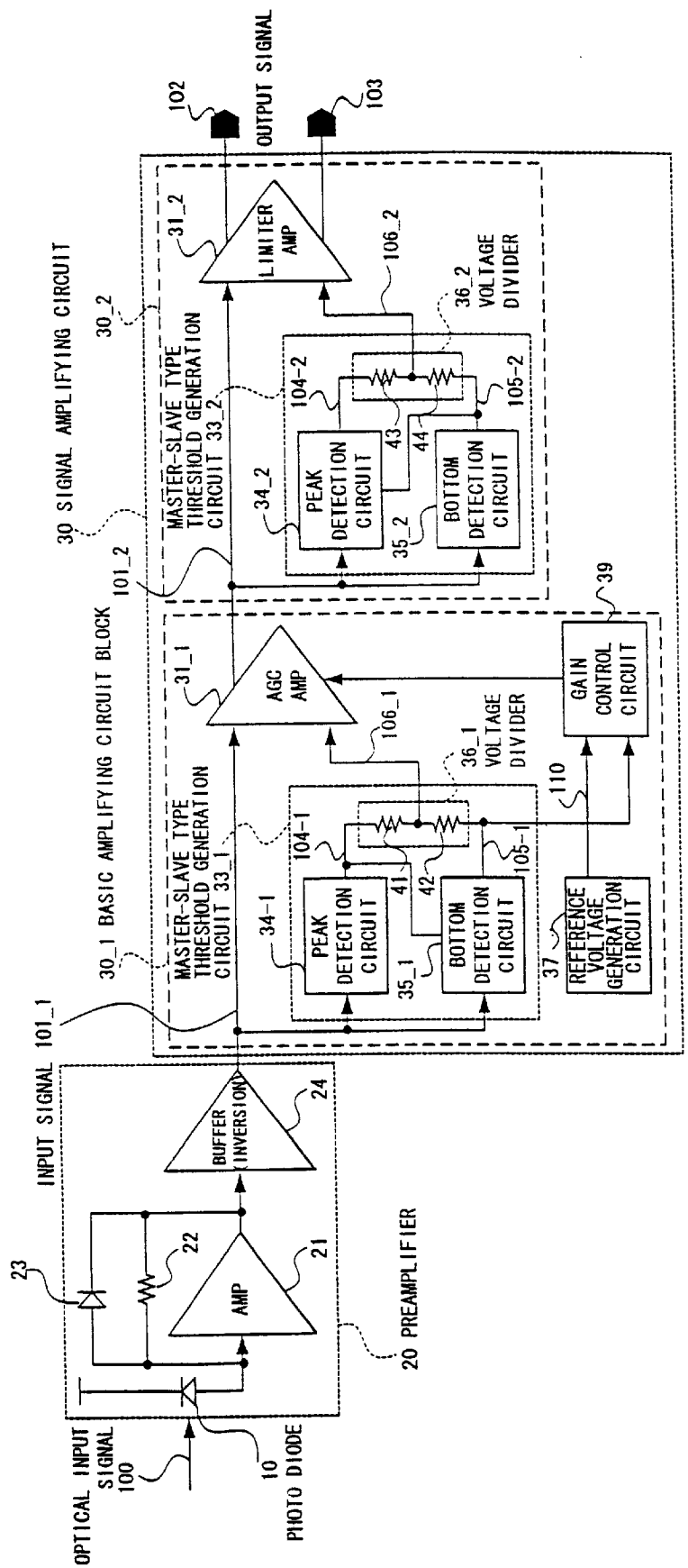
FIG. 32 is a block diagram showing an embodiment (19) of a signal amplifying circuit according to the present invention.

FIG. 32 shows an embodiment (19) of the signal amplifying circuit according to the present invention. The basic arrangement of the signal amplifying circuit is the same as that of the embodiment (18) shown in FIG. 29, however, is different in that the AGC amplifier 31_1 is employed as the limiter amplifier 31_1. Namely, the gain control circuit 39 detects the amplitude of the input signal 101_1 based on the bottom detection circuit 35_1 and the signal from the reference voltage generation circuit 37 so that the feedforward control is performed so as to lower the gain of the AGC amplifier 31_1 when the amplitude is large.

In the embodiment (18) in FIG. 29, the linear amplification can not be performed when the amplitude of the input signal 101_1 is large, so that a transient response by the master-slave type threshold generation circuit 33_2 at the second stage can not be detected. On the contrary, according to the embodiment (19), the linear amplification can be made without saturations over the wide input range by the AGC amplifier 31_1, and to further reduce the pulse width deterioration by the offset. Namely, it becomes possible to improve the effect of a transient response detection by the master-slave type threshold generation circuit 33_2 over the wide input range.

Also, since the gain control can be instantaneously performed, for instance, at the lead of a burst cell by controlling the gain in the form of feedforward, it becomes possible to deal with the high-speed burst transmission.

Figure 33A:
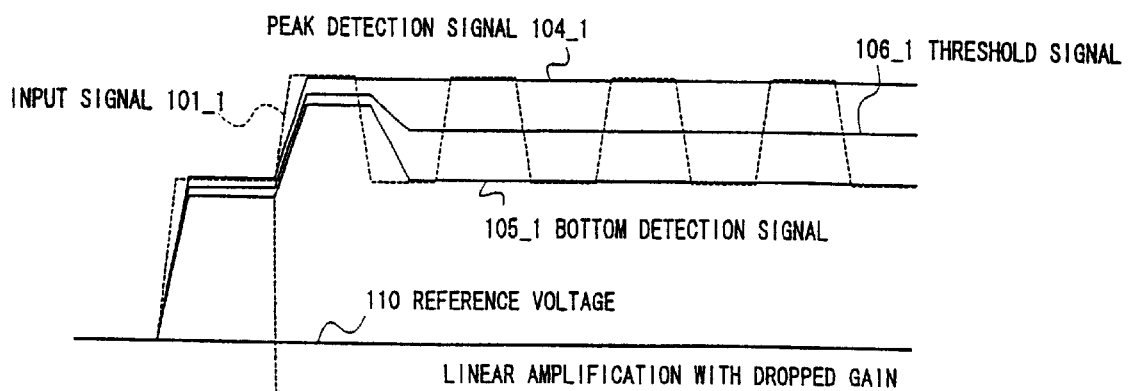
FIGS. 33A, 33B and 33C are graphs showing operation waveform examples of an embodiment (19) of a signal amplifying circuit according to the present invention.
Figure 33B:
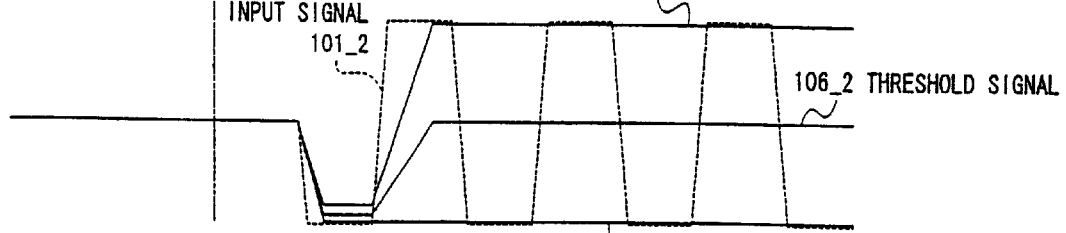
Figure 33C:
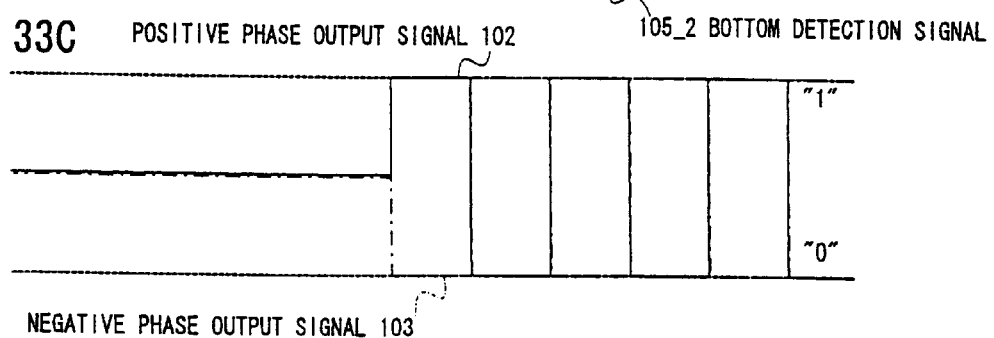

FIGS. 33A–33C show operation waveform examples of the embodiment (19). FIG. 33A shows an operation waveform example of the threshold generation circuit 33_1 and the AGC amplifier 31_1. The threshold generation circuit 33_1 detects the peak detection signal 104_1 which indicates the peak level of the input signal 101_1 and the bottom detection signal 105_1 which indicates the relative bottom level of the input signal 101_1 to the peak detection signal 104_1.

The AGC amplifier 31_1 decreases the gain of the AGC amplifier 31_1 corresponding to the level difference between the reference voltage 110 and the bottom detection signal 105_1. As a result, the AGC amplifier 31_1 linearly amplifies the input signal 101_1 to output the input signal 101_2 shown in FIG. 33B without saturations.

FIG. 33B shows an operation waveform of the threshold generation circuit 33_2, in which the bottom detection signal 105_2 indicates the bottom level of the input signal 101_2, the peak detection signal 104_2 indicates the relative peak level of the input signal 101_2 to the bottom detection signal 105_2, and the threshold signal 106_2 indicates the intermediate level between the detection signals 104_2 and 105_2. FIG. 33C shows the positive phase output signal 102 and the negative phase output signal 103 of the limiter amplifier 31_2.

It is to be noted that if a non-inverting buffer, for instance, is employed as the buffer 24 of the preamplifier 20, and the input signal 101__1 has the waveform of the opposite polarity to the input signal 101__1 of the embodiment (19), the bottom master-slave type and the peak master-slave type which respectively have the opposite arrangement to the arrangements of the embodiment (19) may be employed as the threshold generation circuits 33__1 and 33__2.

Figure 34:
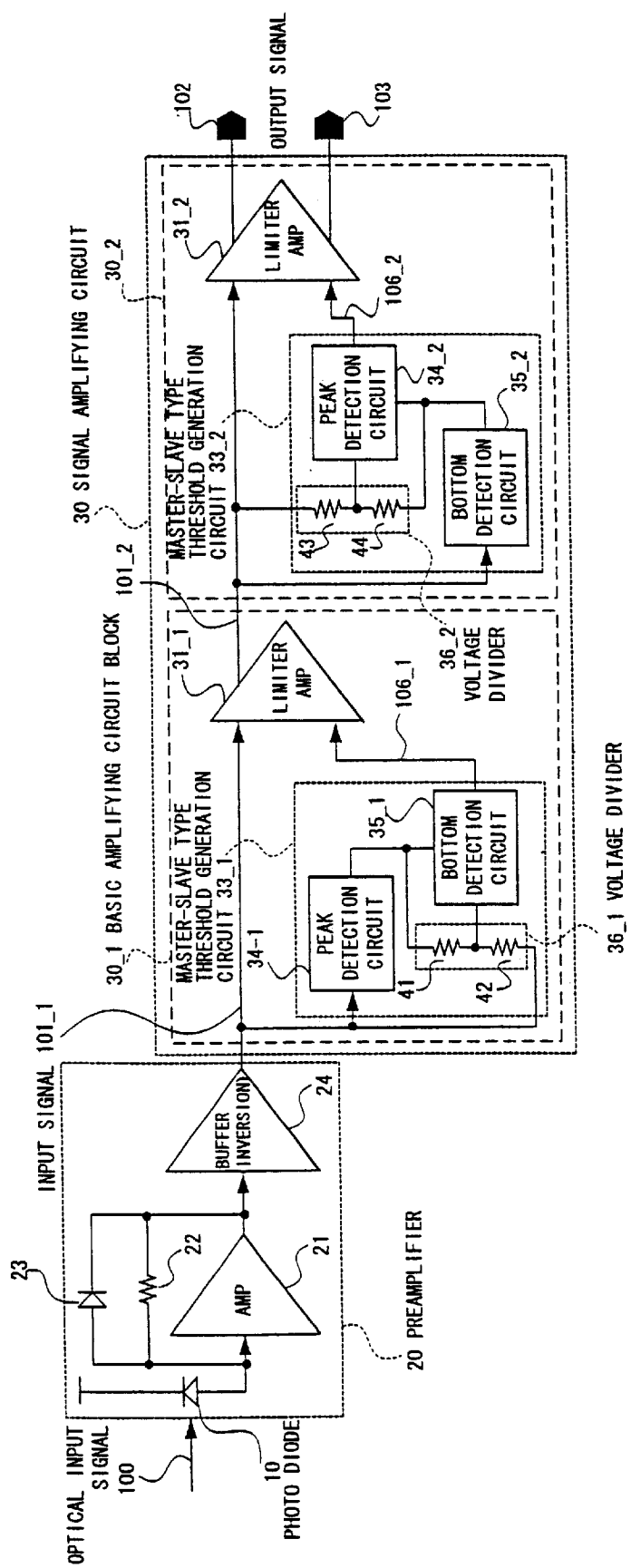
FIG. 34 is a block diagram showing an embodiment (20) of a signal amplifying circuit according to the present invention.

FIG. 34 shows an embodiment (20) of the signal amplifying circuit according to the present invention. The basic arrangement of the signal amplifying circuit 30 is the same as that of the embodiment (18) in FIG. 29 except the arrangements of the threshold generation circuits 33__1 and 33__2. Namely, the master-slave type threshold generation circuit 33 shown in FIGS. 14 and 15 is employed in the threshold generation circuits 33__1 and 33__2 respectively. Such a threshold generation circuit can be adopted as the peak master-slave type threshold generation circuit and the bottom master-slave type generation circuit.

It is to be noted that in the threshold generation circuits 31__1 and 31__2 of the embodiment (20) the resistor 40 shown in FIGS. 14 and 15 is omitted because the threshold control circuit 50 does not control the threshold signals 106__1 and 106__2.

Figure 35:
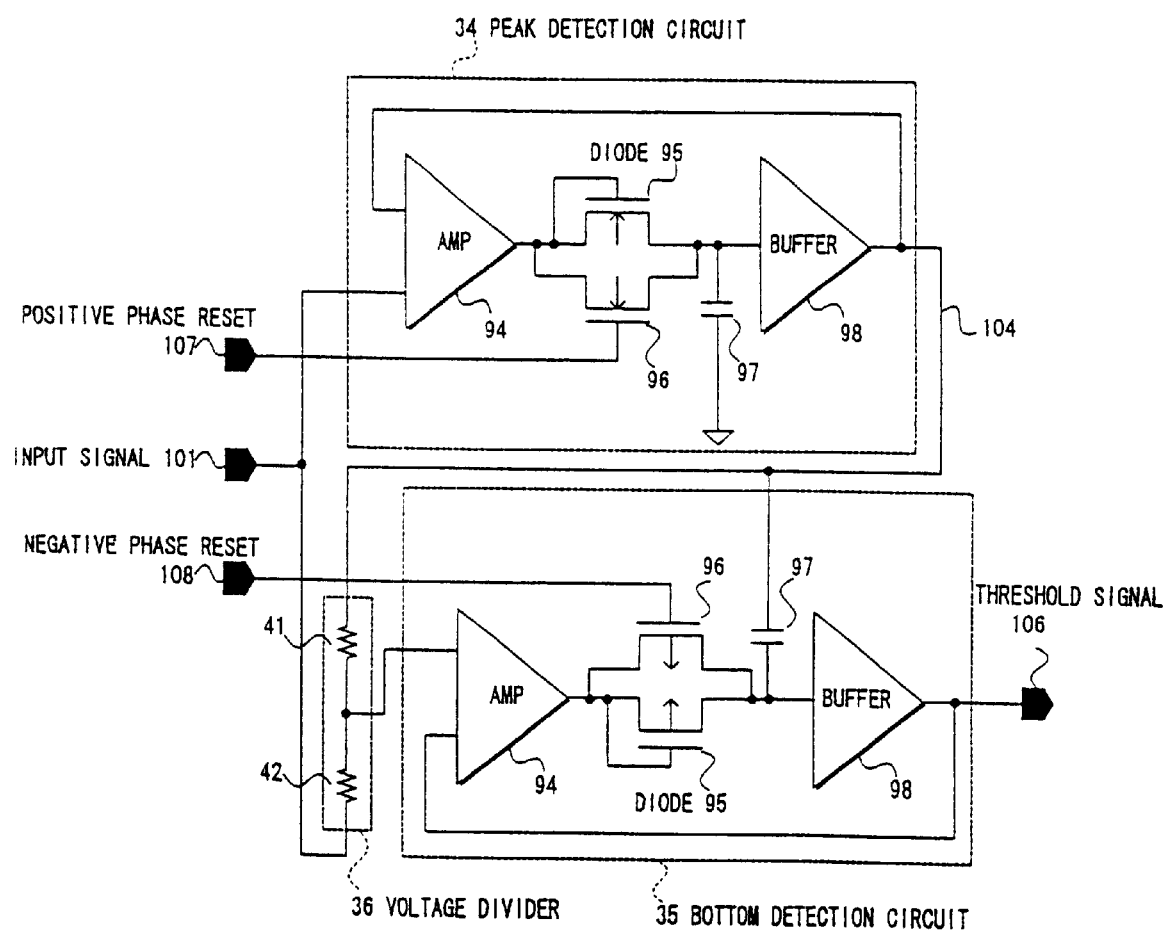
FIG. 35 is a block diagram showing an embodiment (3) of a master-slave type threshold generation circuit in a signal amplifying circuit according to the present invention.

FIG. 35 shows an embodiment (3) of the master-slave type threshold generation circuit shown in FIG. 34. This threshold generation circuit is composed of the peak detection circuit 34, the bottom detection circuit 35, and the voltage divider 36. The arrangement of the circuits 34, 35, and 36 is the same as that of the circuits 34, 35, and 36 of the threshold generation circuit in FIG. 6 except the mutual connection between the input signal 101 and the circuits 34, 35, and 36.

Namely, the input signal 101 is connected to the amplifier 94 of the peak detection circuit 34 and the resistor 42 of the voltage divider 3 6, the output signal 104 of the peak detection circuit 34 is connected to the resistor 41 of the voltage divider 36 and the reference level terminal of the capacitor 97 in the bottom detection circuit 35, and the partial voltage signal of the voltage divider 36 is connected to the amplifier 94 of the bottom detection circuit 35, so that the output signal of the bottom detection circuit 35 forms the threshold signal 106.

In operation, the peak detection circuit 34 detects the peak level of the input signal 101 to hold the same across the capacitor 97, and outputs the peak level as the peak detection signal 104. The voltage divider 36 provides the bottom detection circuit 35 with the partial voltage between the peak detection signal 104 and the input signal 101. The bottom detection circuit 35 detects the bottom level of the partial voltage to hold the same across the capacitor 97, and outputs the bottom level as the threshold signal 106. The operation of the reset signals 107 and 108 is the same as that of the threshold generation circuit shown in FIG. 6.

It is to be noted that the master-slave type threshold generation circuit 33__2 in FIG. 34 can be realized in the arrangement where the peak detection circuit 34 and the bottom detection circuit 35 are mutually exchanged in FIG. 35.

In the above-mentioned embodiments of the signal amplifying circuit according to the present invention, the operation delay of the threshold generation circuit 33 is not considered. In the presence of a delay in the threshold signal 106 with respect to the input signal 101, a problem arises that the output of the differential amplifying circuit (limiter amplifier) 31 overshoots, for instance, at the lead of the cell.

Figure 36:
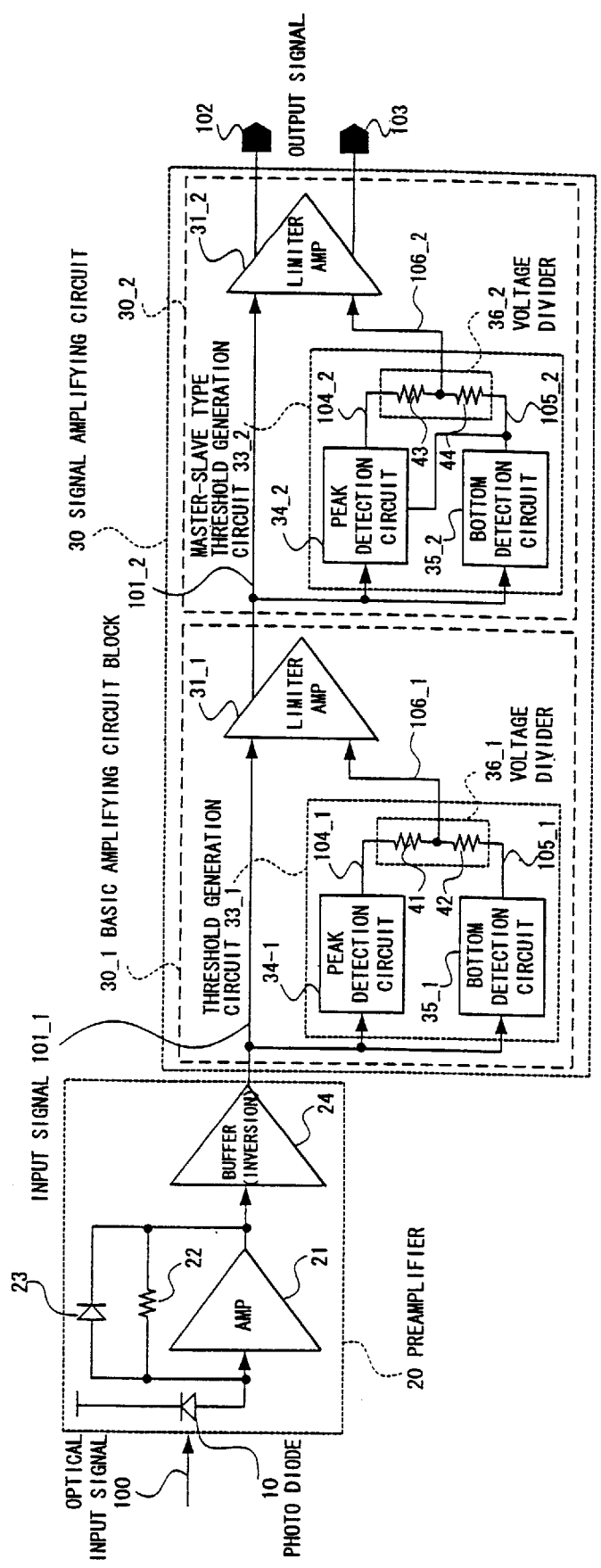
FIG. 36 is a block diagram showing an embodiment (21) of a signal amplifying circuit according to the present invention.

FIG. 36 shows an embodiment (21) of the signal amplifying circuit 30 according to the present invention considering the operation delay of the threshold generation circuit 33. The basic arrangement of this embodiment is the same as that of the embodiment (18) shown in FIG. 29, however, is different in that the threshold generation circuit 33__1 is not the master-slave type but a conventional threshold generation circuit.

Figure 37A:
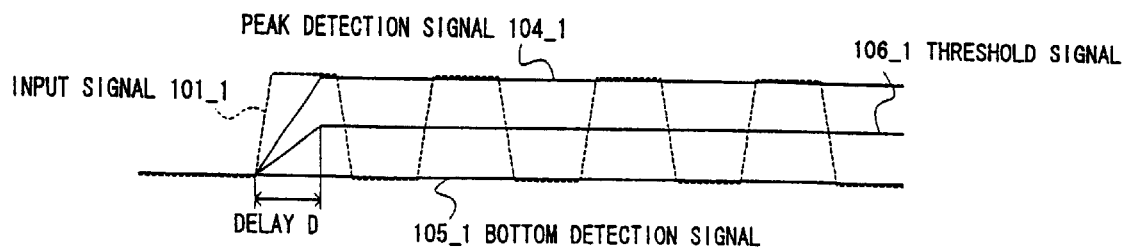
Figure 37B:
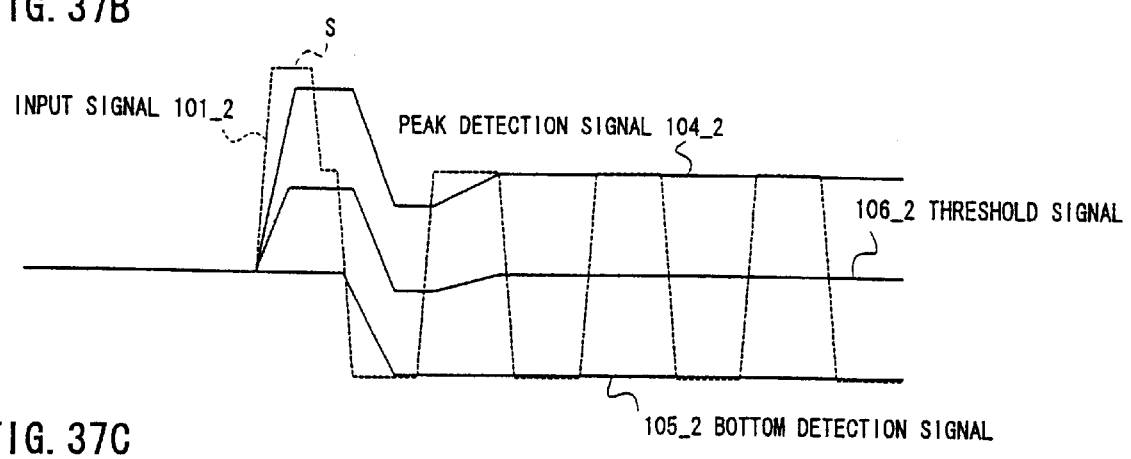
Figure 37C:
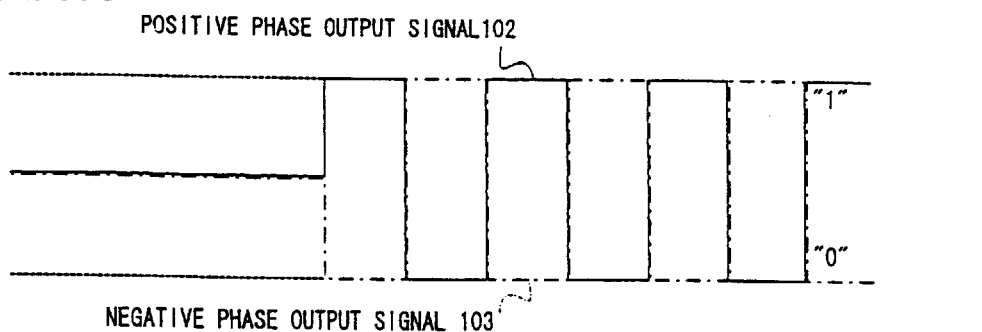

FIGS. 37A–37C show operation waveform examples of the embodiment (21). FIG. 37A shows an operation waveform example of the threshold generation circuit 33__1, in which the peak detection signal 104__1 and the bottom detection signal 105__1 are detected from the input signal 101__1, so that the threshold signal 106__1 is set based on the detection signals 104__1 and 105__1. The threshold signal 106__1 generates a delay D at the rise of the lead of the input signal 101__1.

FIG. 37B shows an operation waveform of the threshold generation circuit 33__2. The output signal (=input signal 101__2) of the limiter amplifier 31__1 has an overshoot form S generated due to the delay of the threshold signal 106__1 caused by the delay of the peak detection signal 104__1.

However, the peak detection signal 104__2 follows the overshoot S at the lead of the input signal 101__2 if the threshold generation circuit 33__2 is made the bottom master-slave type but holds the relative level to the bottom detection signal 105__2 when the input signal 101__2 assumes the bottom level. Therefore, the peak detection signal 104__2 again detects the peak level of the input signal 101__2 after the fall. As a result, the threshold signal 106__2 can be made an appropriate signal for reproducing the input signal 101__1. FIG. 37C shows the output signals 102 and 103 which are the reproduced signals of the input signal 101__1.

Figure 38:
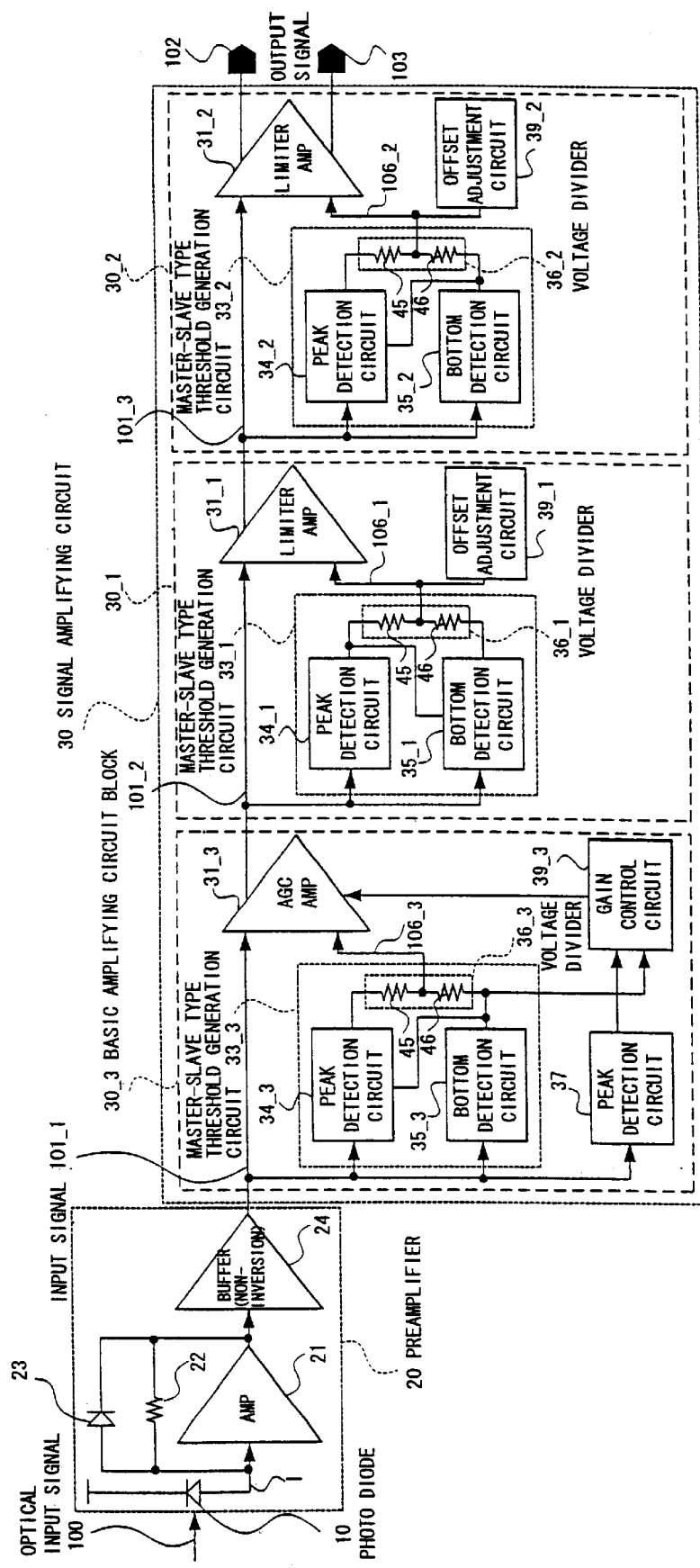
FIG. 38 is a block diagram showing an embodiment (22) of a signal amplifying circuit according to the present invention.

FIG. 38 shows an embodiment (22) of the signal amplifying circuit according to the present invention, in which the basic amplifying circuit block 30__3 is inserted between the preamplifier 20 and the basic amplifying circuit block 30__1 of the embodiment (18) shown in FIG. 29. The basic arrangement of the basic amplifying circuit block 30__3 is the same as that of the basic amplifying circuit block 30__1 of the embodiment (19) in FIG. 32, however, is different in that the threshold generation circuit 33__1 is the bottom master-slave type threshold generation circuit and the reference voltage generation circuit 37 is the peak detection circuit.

In addition, it is different in that the output signals of offset adjustment circuits 39__1 and 39__2 are respectively connected to the threshold signals 106__1 and 106__2 of the limiter amplifiers 31__1 and 31__2 in the basic amplifying circuit blocks 30__1 and 30__2. It is also different in that the buffer 24 of the preamplifier 20 is a non-inversion type.

In operation, a gain control circuit 39__3 recognizes the amplitude of the input signal 101__1 from the output signals of the bottom detection circuit 35__3 and the peak detection circuit 37 to control the gain of the AGC amplifier 31__3. By using the peak detection circuit 37 instead of the reference voltage generation circuit, it becomes possible to remove the difference of the amplitude detection caused by relative errors between the output signals of the reference voltage generation circuit and the preamplifier 20, and to perform the gain control more accurately.

It is to be noted that since the peak detection circuit 34__3 can not detect the amplitude until the bottom detection circuit 35__3 becomes stable for the following operation to the bottom detection circuit 35__3, another peak detection circuit 37 is employed for the amplitude detection. In the substitution of the peak detection circuit 34_3 for the peak detection circuit 37, the delay occurs before the amplitude detection. However, the same effect can be achieved with a simpler arrangement.

The threshold generation circuit 33_1 of the basic amplifying circuit block 30_1 responds to the tailed waveform due to the low frequency response of the photo diode 10, and the threshold generation circuit 33_3 of the basic amplifying circuit block 30_3 responds to the "0" level rise by the optical extinction ratio, so that the threshold generation circuit 33_2 of the basic amplifying circuit block 30_2 is employed as a measure to counter the overshoot. In this way, even if the master-slave type threshold generation circuit is at the former stage, the removal of the overshoot is efficiently performed.

It is to be noted that since the buffer 24 is the non-inversion type, the input signal 101_1 has the opposite polarity to the input signal 101_1 of the embodiment (18) in FIG. 29. Accordingly, the threshold generation circuits 33_3 and 33_1 of the basic amplifying blocks 30_3 and 30_1 respectively employ the bottom master-slave type and the peak master-slave type which are opposite to the embodiment (18) in FIG. 29. Accordingly, in case of the inversion type, the opposite arrangement can be applied.

Although the threshold generation circuit connected in a multistage form can inherently resist the offset, the offset adjustment circuits 39_1 and 39_2 are further connected to the threshold generation circuit in this embodiment. This is because the offset adjustment circuits 39_1 and 39_2 adjust to reduce the offset quantity, and further reduce the pulse width variation of the output signals 102 and 103.

It is needless to say that the offset adjustment circuit of the embodiment (22) can be applied to all of the threshold generation circuits to effect the offset reduction.

Figure 39:
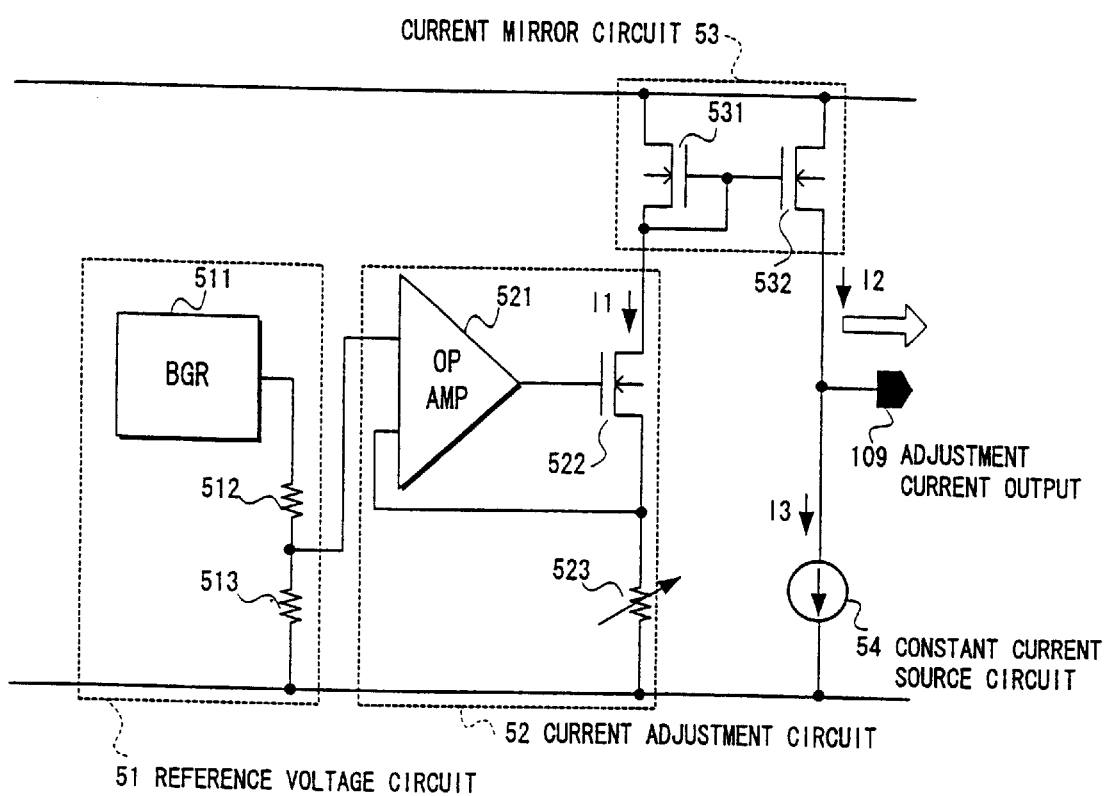
FIG. 39 is a block diagram showing an embodiment of an offset adjustment circuit used in a signal amplifying circuit according to the present invention.

FIG. 39 shows an embodiment of the offset adjustment circuits 39_1 and 39_2. The offset adjustment circuit is composed of a band gap reference circuit (BGR) 511, a reference voltage circuit 51 formed of the resistors 512 and 513 for outputting the partial voltage of the reference voltage, an OP amplifier 521 for inputting the partial voltage signal, a current operational adjustment circuit 52 formed of an MOS transistor 522 and a variable resistor 523 to sink a variable current I1, a current mirror circuit 53 formed of MOS transistors 531 and 532 to flow a current I2 whose value is the same as that of the variable current I1 through the side of the adjustment current output terminal, and a constant current source circuit 54 for sinking a constant current I3 from the adjustment current output terminal. Accordingly, an adjustment current output 109 assumes the value of the constant current I3 subtracted from the variable current I1, which can be adjusted by the variable resistor 523.

Figure 40:
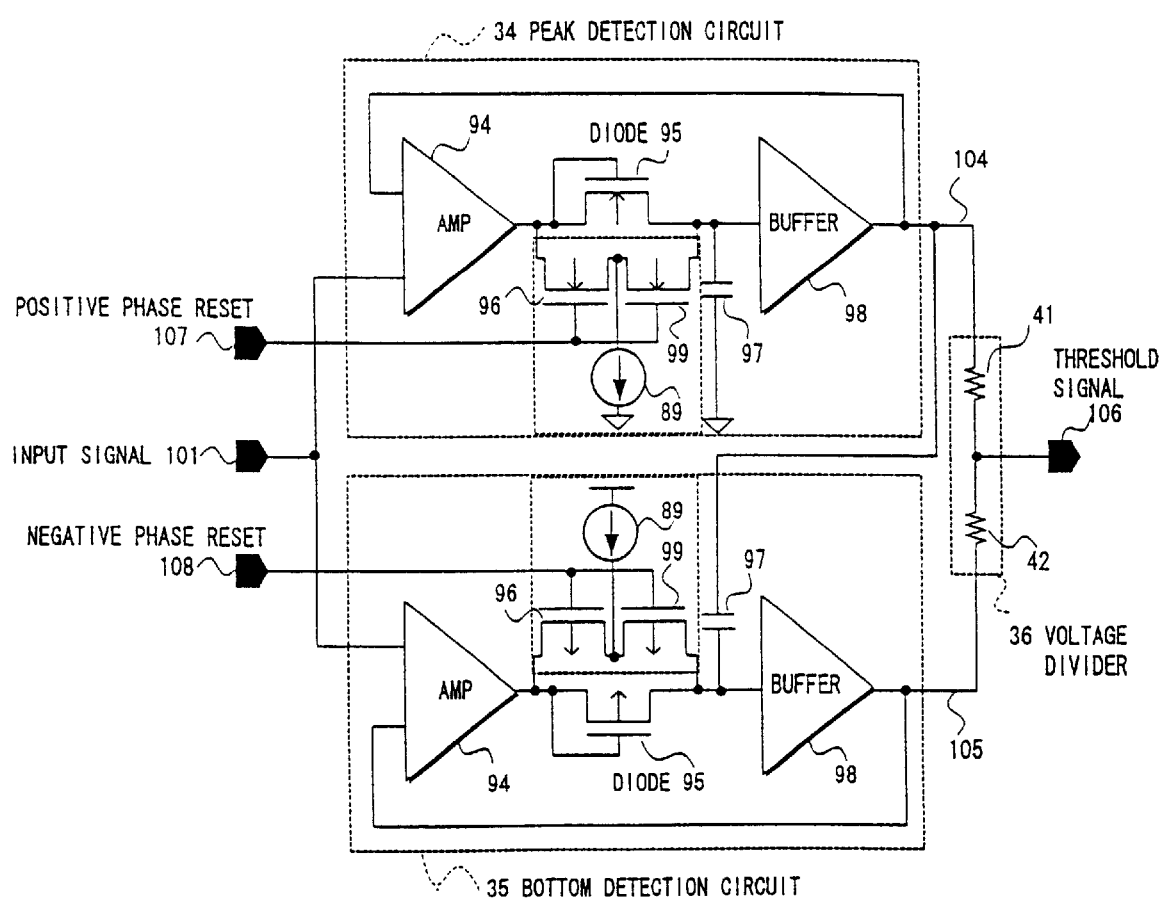
FIG. 40 is a block diagram showing an embodiment (4) of a master-slave type threshold generation circuit in a signal amplifying circuit according to the present invention.

FIG. 40 shows an embodiment (4) of the master-slave type threshold generation circuit. The basic arrangement of the peak detection circuit 34 and the bottom detection circuit 35 of this embodiment is the same as that of the embodiment (1) shown in FIG. 6. However, the MOS transistor 96 of the embodiment (1) is differently composed of the switch which is formed of the MOS transistors 96 and 99, and the current source circuit 89 in the embodiment (4).

The MOS transistors 96 and 99 of the peak detection circuit 34 are connected in series having the connection terminal connected to the current source circuit 89 so as to draw the current from the capacitor 97. The other connection terminals of both transistors are connected to the both terminals of the diode 95, so that the reset signal 107 is commonly given to the gates of the both transistors 96 and 99. The arrangement of the bottom detection circuit 35 is the same as that of the peak detection circuit 35, however, is different in that the reset signal 108 is provided and the current source circuit 89 is connected so as to inject the current into the junction of the transistors 96 and 99.

When the reset signals 107 and 108 are inputted to the detection circuits 34 and 35 of this arrangement, the transistors 96 and 99 short both ends of the diode 95 and the current source circuit 89 is connected to the capacitor 97. The current source circuit 89 reduces a reset time by drawing or injecting the current into the capacitor 97. It is to be noted that the peak detection circuit 40 in FIG. 40 can be employed as the peak detection circuit 37 in FIG. 38.

Figure 41:
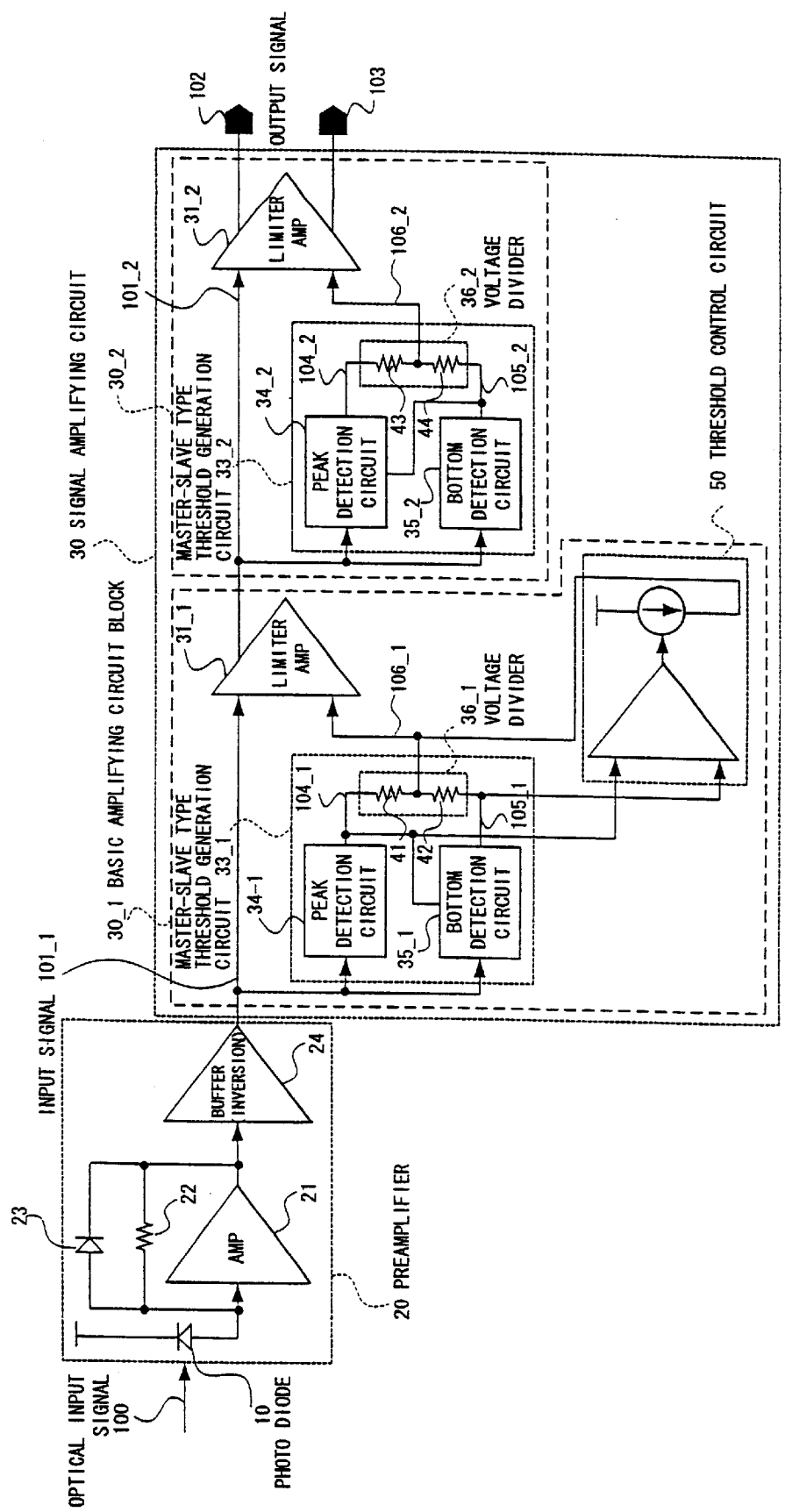
FIG. 41 is a block diagram showing an embodiment (23) of a signal amplifying circuit according to the present invention.

FIG. 41 shows an embodiment (23) of the signal amplifying circuit 30 according to the present invention, in which the threshold control circuit 50 is connected to the basic arrangement of the embodiment (18) shown in FIG. 29. The input signal of the threshold control circuit 50 corresponds to the peak detection signal 104_1 and the bottom detection signal 105_1, so that the output signal is connected to the threshold signal 106_1.

In this way, the signal amplifying circuit 30 according to the present invention can be arranged such that the threshold control circuit 50 responds to correct the non-linear characteristic of, for instance, the preamplifier 20 at the former stage, the threshold generation circuit 33_2 at the second stage responds to the tailed waveform due to the low frequency response of the photo diode 10, and the threshold generation circuit 33_1 at the first stage responds to the "0" level rise due to the optical extinction ratio.

It is to be noted that even if the master-slave type threshold generation circuit is adopted the threshold control circuit 50 can be connected across a plurality of basic amplifying blocks as shown by the embodiment in FIG. 19, or a plurality of threshold control circuits 50 can be employed as shown by the embodiment in FIG. 20.

As described above, a signal amplifying circuit according to the present invention is arranged such that a threshold generation circuit generates a partial voltage of the amplitude as a threshold signal, a threshold control circuit controls the threshold signal so as to correct the non-linear transfer characteristic based on the amplitude, and a differential amplifying circuit performs an differential amplification between the input signal and the threshold signal. Therefore, it becomes possible to reproduce the input signal without deteriorating the pulse width.

Also, a signal amplifying circuit according to the present invention can be arranged such that basic amplifying circuit blocks are connected in a multistage form, each of which is composed of a threshold generation circuit and a differential amplifying circuit, and control the threshold signal of a single or a plurality of basic amplifying circuit blocks so as to correct the non-linear transfer characteristic based on the amplitude of the input signal at the former stage or the latter stage. Therefore, it becomes possible to reproduce the input signal more precisely without deteriorating the pulse width.

Also, when the correction of the threshold signal is performed in the form of feedforward control based on the input signal and the input signal is a burst signal, it becomes possible to reproduce the input signal at a high speed and with a high precision without deteriorating the pulse width at the lead waveform.

Also, a signal amplifying circuit according to the present invention can be arranged such that basic amplifying circuit blocks are connected in a multistage form, and the threshold generation circuits of at least two basic amplifying circuit blocks are a peak master-slave type threshold generation circuit and/or a bottom master-slave type threshold generation circuit. Therefore, it becomes possible to reproduce the input signal without deteriorations.

Furthermore, a signal amplifying circuit according to the present invention can be arranged such that basic amplifying circuit blocks are connected in a multistage form, and a peak or bottom master-slave type threshold generation circuit of at least one basic amplifying circuit block provided at and after the second stage adopts, as a threshold level, an intermediate level between a peak level or a bottom level of the input signal and a bottom or peak level relative to the peak level or the bottom level, respectively. Therefore, it becomes possible to reproduce the input signal without being deteriorated when the threshold signal is delayed.

What we claim is:

1. A signal amplifying circuit connected to a transfer circuit having a known non-linear transfer characteristic comprising;
   a threshold generation circuit for detecting an amplitude of an input signal and generating a partial voltage of the amplitude as a threshold signal,
   a threshold control circuit for controlling the threshold signal so as to correct the non-linear transfer characteristic based on the amplitude, and
   a differential amplifying circuit for inputting the input signal and the threshold signal.

2. A signal amplifying circuit connected to a transfer circuit having a known non-linear transfer characteristic comprising;
   a threshold generation circuit for detecting an amplitude of an input signal and generating a partial voltage of the amplitude as a threshold signal,
   an amplitude detection circuit for detecting the amplitude and outputting an amplitude detection signal,
   a threshold control circuit for controlling the threshold signal so as to correct the non-linear transfer characteristic based on the amplitude detection signal, and
   a differential amplifying circuit for inputting the input signal and the threshold signal.

3. The signal amplifying circuit as claimed in claim 1 or 2 wherein the threshold generation circuit includes a peak detection circuit for detecting a peak level of the amplitude, a bottom detection circuit for detecting a bottom level of the amplitude, and a voltage divider for outputting the threshold signal having a partial voltage between the peak level and the bottom level.

4. The signal amplifying circuit as claimed in claim 1 or 2 wherein the threshold generation circuit includes a peak detection circuit for detecting a peak level of the amplitude, a bottom detection circuit for detecting a relative bottom level of the input signal to the peak level, and a voltage divider for outputting the threshold signal having a partial voltage between the peak level and the bottom level.

5. The signal amplifying circuit as claimed in claim 1 or 2 wherein the threshold generation circuit includes a bottom detection circuit for detecting a bottom level of the amplitude, a peak detection circuit for detecting a relative peak level of the input signal to the bottom level, and a voltage divider for outputting the threshold signal having a partial voltage between the bottom level and the peak level.

6. The signal amplifying circuit as claimed in claim 1 or 2 wherein the threshold generation circuit includes a reference level generation circuit for outputting a predetermined peak level of the amplitude as a reference level, a bottom detection circuit for detecting a bottom level of the amplitude, and a voltage divider for outputting the threshold signal having a partial voltage between the reference level and the bottom level.

7. The signal amplifying circuit as claimed in claim 1 or 2 wherein the threshold generation circuit includes a reference level generation circuit for outputting a predetermined bottom level of the amplitude as a reference level, a peak detection circuit for detecting a peak level of the amplitude, and a voltage divider for outputting the threshold signal having a partial voltage between the reference level and the peak level.

8. A signal amplifying circuit connected to a transfer circuit having a known non-linear transfer characteristic comprising;
   basic amplifying circuit blocks connected in a multistage form, each of which is composed of a threshold generation circuit for detecting an amplitude of an input signal and generating a partial voltage of the amplitude as a threshold signal and a differential amplifying circuit for inputting the input signal and the threshold signal, and
   a threshold control circuit, provided between two different basic amplifying circuit blocks, which controls the threshold signal of the basic amplifying circuit block at a latter stage so as to correct the non-linear transfer characteristic based on the amplitude of the input signal of a basic amplifying circuit block at a former stage.

9. A signal amplifying circuit connected to a transfer circuit having a known non-linear transfer characteristic comprising;
   basic amplifying circuit blocks connected in a multistage form, each of which is composed of a threshold generation circuit for detecting an amplitude of an input signal and generating a partial voltage of the amplitude as a threshold signal, and a differential amplifying circuit for inputting the input signal and the threshold signal, and
   an amplitude detection circuit for detecting an amplitude of the input signal of the basic amplifying circuit block at a former stage and a threshold control circuit which controls the threshold signal of the basic amplifying circuit block at a latter stage so as to correct the non-linear transfer characteristic based on the amplitude, provided between two different basic amplifying circuit blocks.

10. A signal amplifying circuit connected to a transfer circuit having a known non-linear transfer characteristic comprising;
    basic amplifying circuit blocks connected in a multistage form, each of which is composed of a threshold generation circuit for detecting an amplitude of an input signal and generating a partial voltage of the amplitude as a threshold signal and a differential amplifying circuit for inputting the input signal and the threshold signal, and
    a plurality of threshold control circuits, provided between at least two basic amplifying circuit blocks, which control the threshold signal of a basic amplifying circuit block at a latter stage so as to correct the non-linear transfer characteristic based on the amplitude of the input signal of a basic amplifying circuit block at a former stage.

11. A signal amplifying circuit connected to a transfer circuit having a known non-linear transfer characteristic comprising;

basic amplifying circuit blocks connected in a multistage form, each of which is composed of a threshold generation circuit for detecting an amplitude of an input signal and generating a partial voltage of the amplitude as a threshold signal, and a differential amplifying circuit for inputting the input signal and the threshold signal, and an amplitude detection circuit for detecting an amplitude of the input signal of the basic amplifying circuit block at a former stage and a plurality of threshold control circuits which control the threshold signal of the basic amplifying circuit block at a latter stage so as to correct the non-linear transfer characteristic based on the amplitude, provided between at least two basic amplifying circuit blocks.

12. The signal amplifying circuit as claimed in claim 1, 2, 8, 9, 10, or 11 wherein the threshold generation circuit includes a level shift circuit for shifting at least one of the peak level and the bottom level of the amplitude, an amplifier for comparing the peak level and the bottom level at least one of which is shifted, a current switch driven by the output signal of the amplifier, and a current source circuit driven by the current switch.

13. The signal amplifying circuit as claimed in claim 12 wherein the current switch is composed of differential transistors connected to a differential output of the amplifier.

14. A signal amplifying circuit in which basic amplifying circuit blocks are connected in a multistage form, each of which is composed of a threshold generation circuit for generating a threshold signal based on an input signal and a differential amplifying circuit for inputting the input signal and the threshold signal, comprising;

the threshold generation circuit of at least one basic amplifying circuit block being a peak master-slave type threshold generation circuit with an intermediate level for the threshold signal between a peak level of the input signal and a relative bottom level of the input signal to the peak level, and the threshold generation circuit of at least one different basic amplifying circuit block being a bottom master-slave type threshold generation circuit with an intermediate level for the threshold signal between the bottom level of the input signal and a relative peak level of the input signal to the bottom level.

15. A signal amplifying circuit in which basic amplifying circuit blocks are connected in a multistage form, each of which is composed of a threshold generation circuit for generating a threshold signal based on an input signal and a differential amplifying circuit for inputting the input signal and the threshold signal, comprising;

the threshold generation circuits of at least two basic amplifying circuit blocks being peak master-slave type threshold generation circuits with an intermediate level for the threshold signal between a peak level of the input signal and a relative bottom level of the input signal to the peak level.

16. A signal amplifying circuit in which basic amplifying circuit blocks are connected in a multistage form, each of which is composed of a threshold generation circuit for generating a threshold signal based on an input signal and a differential amplifying circuit for inputting the input signal and the threshold signal, comprising;

the threshold generation circuits of at least two basic amplifying circuit blocks being bottom master-slave type threshold generation circuits with an intermediate level for the threshold signal between a bottom level of the input signal and a relative peak level of the input signal to the bottom level.

17. A signal amplifying circuit in which basic amplifying circuit blocks are connected in a multistage form, each of which is composed of a threshold generation circuit for generating a threshold signal based on an input signal and a differential amplifying circuit for inputting the input signal and the threshold signal, comprising;

the threshold generation circuit of at least one basic amplifying circuit block provided at and after a second stage being a peak master-slave type threshold generation circuit with an intermediate level for the threshold signal between a peak level of the input signal and a relative bottom level of the input signal to the peak level.

18. A signal amplifying circuit in which basic amplifying circuit blocks are connected in a multistage form, each of which is composed of a threshold generation circuit for generating a threshold signal based on an input signal and a differential amplifying circuit for inputting the input signal and the threshold signal, comprising;

the threshold generation circuit of at least one basic amplifying circuit block provided at and after a second stage being a bottom master-slave type threshold generation circuit with an intermediate level for the threshold signal between a bottom level of the input signal and a relative peak level of the input signal to the bottom level.

19. The signal amplifying circuit as claimed in any one of claims 8 to 11 and 14 to 18 wherein the differential amplifying circuit comprises an AGC amplifier for controlling a gain corresponding to the amplitude of the input signal of the basic amplifying circuit block to which a former stage or itself belongs.

20. The signal amplifying circuit as claimed in any one of claims 14 to 18 wherein a threshold control circuit for controlling the threshold signal at a latter stage based on the amplitude of the input signal at a former stage is provided between two different basic amplifying circuit blocks.

* * * * *